(12) United States Patent
Park et al.

(10) Patent No.: US 12,512,315 B2
(45) Date of Patent: Dec. 30, 2025

(54) METHOD OF MANUFACTURING SEMICONDUCTOR DEVICE

(71) Applicant: SAMSUNG ELECTRONICS CO., LTD., Suwon-si (KR)

(72) Inventors: Jun Mo Park, Seoul (KR); Kyu Bong Choi, Seoul (KR); Yeon Ho Park, Seoul (KR); Eun Sil Park, Hwaseong-si (KR); Jin Seok Lee, Busan (KR); Wang Seop Lim, Cheonan-si (KR); Kyung In Choi, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 682 days.

(21) Appl. No.: 17/741,711

(22) Filed: May 11, 2022

(65) Prior Publication Data

US 2023/0040132 A1 Feb. 9, 2023

(30) Foreign Application Priority Data

Aug. 9, 2021 (KR) .................. 10-2021-0104583

(51) Int. Cl.
*H01L 21/02* (2006.01)
*H01L 21/768* (2006.01)
*H10D 84/01* (2025.01)
*H10D 84/03* (2025.01)

(52) U.S. Cl.
CPC .. *H01L 21/02491* (2013.01); *H01L 21/76886* (2013.01); *H10D 84/0151* (2025.01); *H10D 84/038* (2025.01)

(58) Field of Classification Search
CPC ........ H01L 21/02491; H01L 21/76886; H10D 84/038; H10D 84/0151
See application file for complete search history.

(56) References Cited

U.S. PATENT DOCUMENTS

| | | |
|---|---|---|
| 9,984,933 B1 | 5/2018 | Xu et al. |
| 10,026,737 B1 | 7/2018 | Ching et al. |
| 10,177,037 B2 | 1/2019 | Zang et al. |
| 10,950,606 B2 | 3/2021 | Hafez et al. |
| 10,950,610 B2 | 3/2021 | Paul et al. |
| 2019/0139830 A1 | 5/2019 | Xie et al. |

(Continued)

FOREIGN PATENT DOCUMENTS

| | | |
|---|---|---|
| KR | 10-2017-0012640 A | 2/2017 |
| KR | 10-2019-0023759 A | 3/2019 |

(Continued)

OTHER PUBLICATIONS

Communication dated Aug. 13, 2025, issued by the Korean Patent Office in Korean Application No. 10-2021-0104583.

*Primary Examiner* — Joshua Benitez Rosario
*Assistant Examiner* — Christopher A Culbert
(74) *Attorney, Agent, or Firm* — Sughrue Mion, PLLC

(57) ABSTRACT

A method of manufacturing a semiconductor device includes: forming first to third preliminary active patterns on a substrate to have different intervals therebetween, forming first and second field insulating layers between the first and second preliminary active patterns and between the second and third preliminary active patterns, respectively, and forming first to third gate electrodes respectively on first to third active patterns formed based on the first to third preliminary active patterns, separated by first and second gate isolation structures.

20 Claims, 38 Drawing Sheets

(56) References Cited

U.S. PATENT DOCUMENTS

| | | |
|---|---|---|
| 2019/0305112 A1 | 10/2019 | Subramanian et al. |
| 2020/0098888 A1 | 3/2020 | Lin et al. |
| 2020/0219990 A1 | 7/2020 | Guha et al. |
| 2020/0219997 A1 | 7/2020 | Mehandru et al. |
| 2020/0312843 A1 | 10/2020 | Xie et al. |
| 2020/0357805 A1 | 11/2020 | Reznicek et al. |
| 2021/0126113 A1 | 4/2021 | Lin et al. |

FOREIGN PATENT DOCUMENTS

| | | |
|---|---|---|
| KR | 10-2020-0029743 A | 3/2020 |
| KR | 10-2020-0094679 A | 8/2020 |
| KR | 10-2021-0024405 A | 3/2021 |

METHOD OF MANUFACTURING SEMICONDUCTOR DEVICE

CROSS-REFERENCE TO RELATED APPLICATION

This application claims priority from Korean Patent Application No. 10-2021-0104583 filed on Aug. 9, 2021, in the Korean Intellectual Property Office, the disclosure of which is incorporated herein in its entirety.

BACKGROUND

1. Field

The present disclosure relates to a method of manufacturing a semiconductor device.

2. Description of the Related Art

With high integration of a semiconductor device, it becomes increasingly difficult to implement transistor performance required by a user. To overcome this technical difficulty, various field effect transistor structures have been proposed. For example, a high dielectric film-metal gate structure has been proposed to replace the gate structure of the conventional field effect transistors that uses silicon oxide and polycrystalline silicon as materials of a gate insulating layer and a gate electrode, respectively.

As a size of a field effect transistor is reduced, a length of a gate and a length of a channel formed below the gate are also reduced. Therefore, various efforts to improve a manufacturing process and a structure of an integrated circuit element have been made to improve operational stability and reliability of transistors, which are factors for determining performance of integrated circuits.

BRIEF SUMMARY

An object of the present disclosure is to provide a method of manufacturing a semiconductor device capable of improving operational performance and reliability by forming a lower structure of a gate isolation structure in a self-aligned manner while providing a uniform gate structure for a plurality of active regions having various intervals.

The objects of the present disclosure are not limited to those mentioned above and additional objects, which are not mentioned herein, will be clearly understood by those skilled in the art from the following description.

A method of manufacturing a semiconductor device according to embodiments may include: forming first to third preliminary active patterns extended in a first direction on a substrate and sequentially disposed to be adjacent to one another in a second direction different from the first direction, the first and second preliminary active patterns being spaced apart from each other in the second direction by a first interval, and the second and third preliminary active patterns being spaced apart from each other in the second direction by a second interval different from the first interval; forming a first field insulating layer between the first preliminary active pattern and the second preliminary active pattern, and forming a second field insulating layer between the second preliminary active pattern and the third preliminary active pattern; forming a dummy conductive material layer extended along profiles of the first to third preliminary active patterns and the first and second field insulating layers; forming a mask pattern on the dummy conductive material layer, a first deposition thickness for the dummy conductive material layer on a sidewall of the first preliminary active pattern and the mask pattern being smaller than a second deposition thickness for the dummy conductive material layer on the first field insulating layer and the mask pattern; forming first and second trenches by etching a portion of a center of each of the first and second field insulating layers using the mask pattern; forming first and second dam structures to fill the first and second trenches, respectively; forming a dummy electrode on the first and second dam structures and the dummy conductive material layer; and forming first to third gate electrodes respectively on first and second gate isolation structures formed based on the first and second dam structures and first to third active patterns formed based on the first to third preliminary active patterns, separated by the first and second gate isolation structures, wherein the first gate isolation structure separates the first gate electrode from the second gate electrode, and the second gate isolation structure separates the second gate electrode from the third gate electrode.

A method of manufacturing a semiconductor device according to embodiments may include: forming first to third preliminary active patterns extended in a first direction on a substrate and sequentially disposed to be adjacent to one another in a second direction different from the first direction, the first and second preliminary active patterns being spaced apart from each other in the second direction by a first interval, and the second and third preliminary active patterns being spaced apart from each other in the second direction by a second interval different from the first interval; forming a first field insulating layer between the first preliminary active pattern and the second preliminary active pattern, and forming a second field insulating layer disposed between the second preliminary active pattern and the third preliminary active pattern; forming a dummy conductive material layer extended along profiles of the first to third preliminary active patterns and the first and second field insulating layers; forming first and second mask patterns on the dummy conductive material layer, the first mask pattern being disposed on upper surfaces of the first to third preliminary active patterns and the second mask pattern being disposed on the first and second field insulating layers; forming first and second trenches by etching a portion of a center of each of the first and second field insulating layers using the first and second mask patterns; forming first and second dam structures to fill the first and second trenches, respectively; forming a dummy electrode on the first and second dam structures and the dummy conductive material layer; and forming first to third gate electrodes respectively on first and second gate isolation structures formed based on the first and second dam structures and first to third active patterns formed based on the first to third preliminary active patterns, separated by the first and second gate isolation structures, wherein the first gate isolation structure separates the first gate electrode from the second gate electrode, and the second gate isolation structure separates the second gate electrode from the third gate electrode, and wherein the first and second mask patterns are not disposed on sidewalls of the first to third preliminary active patterns.

A method of manufacturing a semiconductor device according to embodiments may include: forming first to third preliminary active patterns extended in a first direction on a substrate and sequentially disposed to be adjacent to one another in a second direction different from the first direction, the first and second preliminary active patterns being spaced apart from each other in the second direction by a first interval, and the second and third preliminary active patterns being spaced apart from each other in the second direction by a second interval different from the first interval; forming a first field insulating layer between the first preliminary active pattern and the second preliminary active pattern, and forming a second field insulating layer disposed between the second preliminary active pattern and the third preliminary active pattern; forming a dummy conductive material layer extended along profiles of the first to third preliminary active patterns and the first and second field insulating layers, the dummy conductive material layer having a first thickness on the first and second field insulating layers, a second thickness on upper surfaces of the first to third preliminary active patterns, and a third thickness on sidewalls of the first to third preliminary active patterns; forming a mask pattern on the dummy conductive material layer, the mask pattern not being disposed on the sidewalls of the first to third preliminary active patterns; forming first and second trenches by etching a portion of a center of each of the first and second field insulating layers using the mask pattern; forming first and second dam structures to fill the first and second trenches, respectively; forming a dummy electrode on the first and second dam structures and the dummy conductive material layer; and forming first to third gate electrodes respectively on first and second gate isolation structures formed based on the first and second dam structures and first to third active patterns formed based on the first to third preliminary active patterns, separated by the first and second gate isolation structures, wherein the first gate isolation structure separates the first gate electrode from the second gate electrode, and the second gate isolation structure separates the second gate electrode from the third gate electrode, and wherein the first thickness is smaller than the second thickness, and is greater than the third thickness.

BRIEF DESCRIPTION OF THE DRAWINGS

The above and other aspects and features will become more apparent by describing in detail exemplary embodiments thereof with reference to the attached drawings, in which.

DETAILED DESCRIPTION

Figure 1:
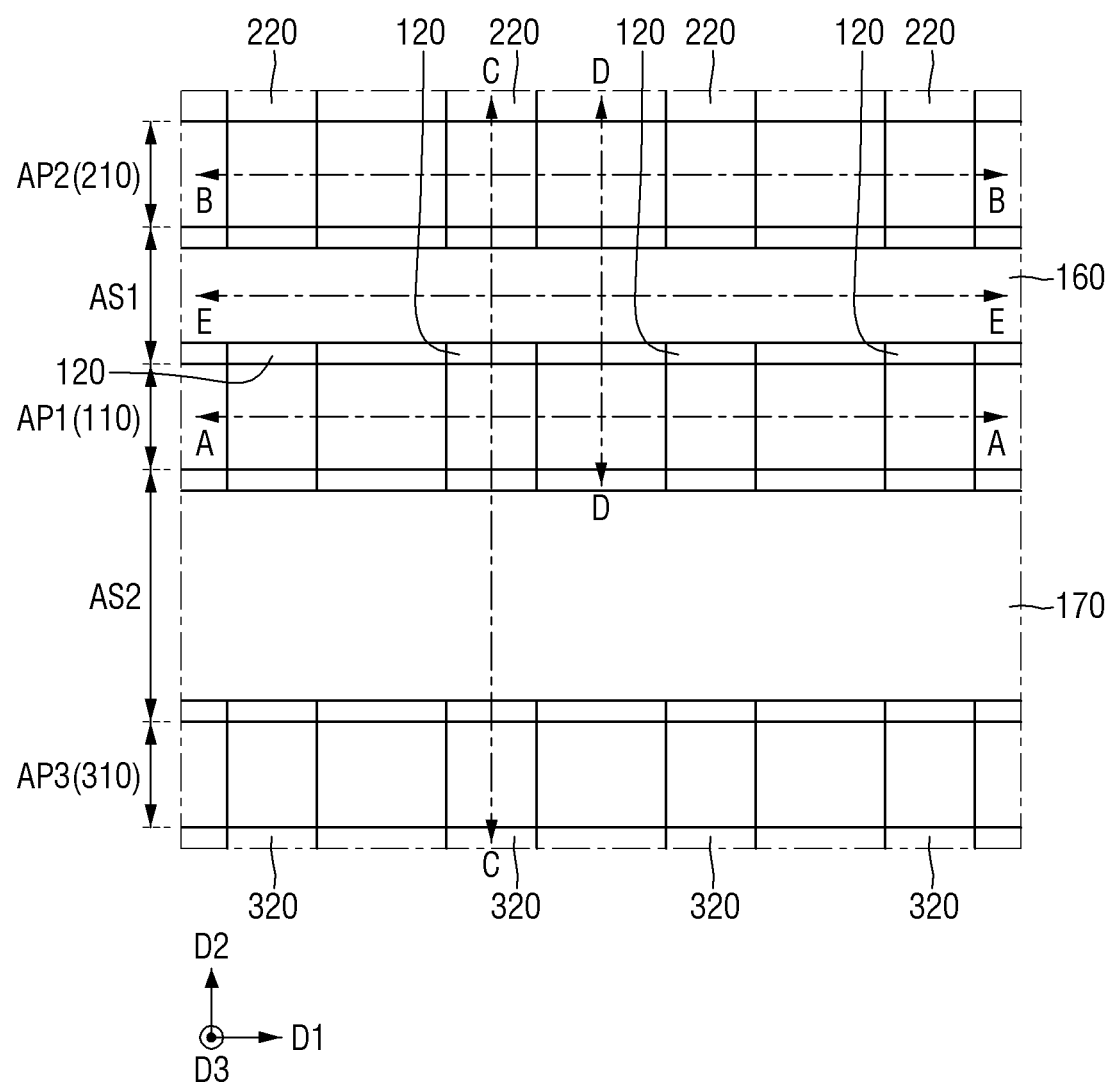
FIG. 1 is a layout view illustrating a semiconductor device according to embodiments.

Hereinafter, various embodiments will be described with reference to the accompanying drawings. All of the embodiments disclosed herein are example embodiments. In description of FIGS. 1 to 38, the same reference numerals are used for the same or substantially same elements, and a repeated description of the corresponding elements will be omitted.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

As shown, a semiconductor device according to embodiments includes, but is not limited to, a fin-type transistor (FinFET) including a channel region of a fin-type pattern shape, a planar transistor, a transistor including a nanowire or a nanosheet, and a multi-bridge channel field effect transistor (MBCFET™) by way of example. The semiconductor device according to embodiments may include a tunneling transistor (tunneling FET) or a three-dimensional (3D) transistor. The semiconductor device according to embodiments may include a planar transistor. In addition, the present disclosure may be applied to two-dimensional (2D) material-based transistors (FETs) and a heterogeneous structure thereof.

In addition, the semiconductor device according to embodiments may include a bipolar junction transistor, a lateral double diffusion transistor (LDMOS), and the like.

FIG. 1 is a layout view illustrating a semiconductor device according to embodiments. FIGS. 2 to 6 are cross-sectional views taken along lines A-A, B-B, C-C, D-D and E-E of FIG. 1, respectively.

Referring to FIGS. 1 to 6, the semiconductor device according to embodiments may include a first active pattern AP1, a second active pattern AP2, a third active pattern AP3, a plurality of first gate electrodes 120, a plurality of second gate electrodes 220, a plurality of third gate electrodes 320, a first gate isolation structure 160, and a second gate isolation structure 170.

A substrate 100 may be a bulk silicon or a silicon-on-insulator (SOI). Otherwise, the substrate 100 may be a silicon substrate, or may include other material such as silicon germanium, silicon germanium on insulator (SGOI), indium antimonide, lead telluride compound, indium arsenide, indium phosphide, gallium arsenide or gallium antimonide, but is not limited thereto.

The first active pattern AP1, the second active pattern AP2 and the third active pattern AP3 may be disposed to be spaced apart from one another in a second direction D2. For example, a first direction D1 is a direction crossing the second direction D2. The first active pattern AP1 may be disposed between the second active pattern AP2 and the third active pattern AP3. The first active pattern AP1 is adjacent to the second active pattern AP2 and the third active pattern AP3 in the second direction D2. The first active pattern AP1 and the second active pattern AP2 are spaced apart from each other in the second direction D2 by a first interval AS1, and the first active pattern AP1 and the third active pattern AP3 are spaced apart from each other in the second direction D2 by a second interval AS2.

On the drawing, the second active pattern AP2 and the third active pattern AP3 are disposed to be spaced apart from the first active pattern AP1 in the second direction D2 at their respective intervals AS1 and AS2 different from each other, but are not limited thereto, and may be changed in various ways.

The first gate isolation structure 160 may be extended long in the first direction D1 between the first active pattern AP1 and the second active pattern AP2. The second gate isolation structure 170 may be extended long in the first direction D1 between the first active pattern AP1 and the third active pattern AP3. The first gate isolation structure 160 and the second gate isolation structure 170 will be described later.

For example, the first active pattern AP1 to the third active pattern AP3 may be active regions included in their respective standard cells. As an example, the first active pattern AP1 may be a PMOS forming region, and the third active pattern AP3 may be an NMOS forming region. As another example, the first active pattern AP1 may be an NMOS forming region, and the third active pattern AP3 may be a PMOS forming region.

As an example, the second active pattern AP2 may be a region in which a transistor having the same conductivity type as that of the third active pattern AP3 is formed. For example, when the third active pattern AP3 is a region in which PMOS is formed, the second active pattern AP2 may be a region where PMOS is formed. For another example, when the third active pattern AP3 is a region in which NMOS is formed, the second active pattern AP2 may be a region in which NMOS is formed. The embodiments are not limited to these examples.

The first active pattern AP1 may include a first lower pattern 110 and a plurality of first sheet patterns NS1. The second active pattern AP2 may include a second lower pattern 210 and a plurality of second sheet patterns NS2. The third active pattern AP3 may include a third lower pattern 310 and a plurality of third sheet patterns NS3.

Each of the first lower pattern 110, the second lower pattern 210 and the third lower pattern 310 may be protruded from the substrate 100. Each of the first lower pattern 110, the second lower pattern 210 and the third lower pattern 310 may be extended long in the first direction D1.

The first lower pattern 110 may be spaced apart from the second lower pattern 210 and the third lower pattern 310 in the second direction D2. The first lower pattern 110, the second lower pattern 210 and the third lower pattern 310 may be separated from one another by a fin trench FT extended in the first direction D1. The first lower pattern 110 and the second lower pattern 210 may be spaced apart from each other by the first interval AS1, and the first lower pattern 110 and the third lower pattern 310 may be spaced apart from each other by the second interval AS2.

The plurality of first sheet patterns NS1 may be disposed on the first lower pattern 110. The plurality of first sheet patterns NS1 may be spaced apart from the first lower pattern 110 in a third direction D3. The respective first sheet patterns NS1 spaced apart from each other may be arranged in the first direction D1 along an upper surface of the first lower pattern 110.

The plurality of second sheet patterns NS2 may be disposed on the second lower pattern 210. Since the arrangement of the plurality of second sheet patterns NS2 and the second lower pattern 210 corresponds to that of the plurality of first sheet patterns NS1 and the first lower pattern 110, duplicates descriptions will be omitted. Similarly, the arrangement of the plurality of third sheet patterns NS3 and the third lower pattern 310 also corresponds to that of the plurality of first sheet patterns NS1 and the first lower pattern 110, and thus, duplicate descriptions will be omitted.

Each of the first sheet patterns NS1 may include a plurality of nanosheets sequentially disposed in the third direction D3. Each of the second sheet patterns NS2 may include a plurality of nanosheets sequentially disposed in the third direction D3. Each of the third sheet patterns NS3 may include a plurality of nanosheets sequentially disposed in the third direction D3. In this case, the third direction D3 may be a direction crossing the first direction D1 and the second direction D2. For example, the third direction D3 may be a thickness direction of the substrate 100.

Figure 2:
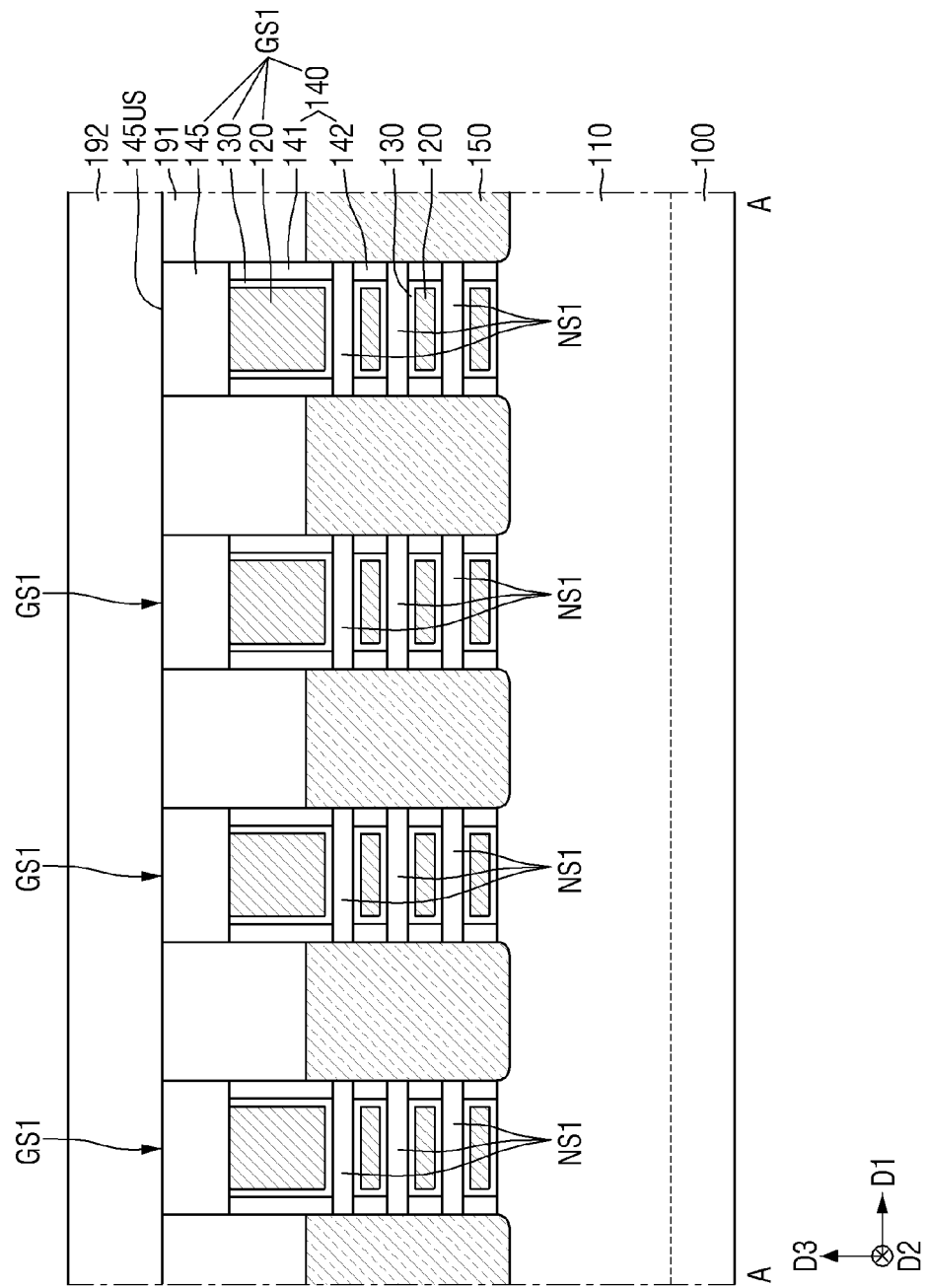
FIGS. 2 to 6 are cross-sectional views taken along lines A-A, B-B, C-C, D-D and E-E of FIG. 1, respectively, according to embodiments.
Figure 3:
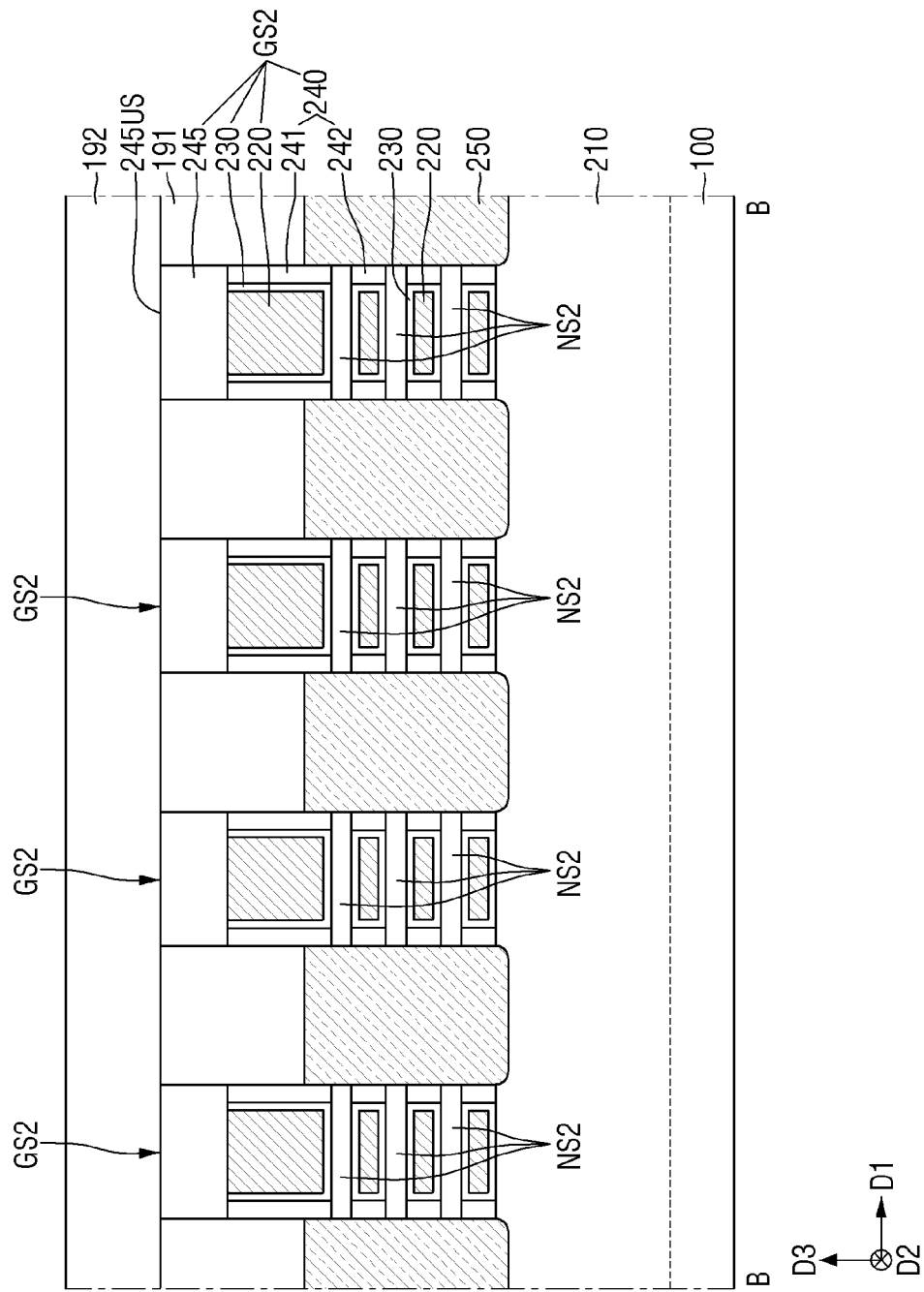
Figure 4:
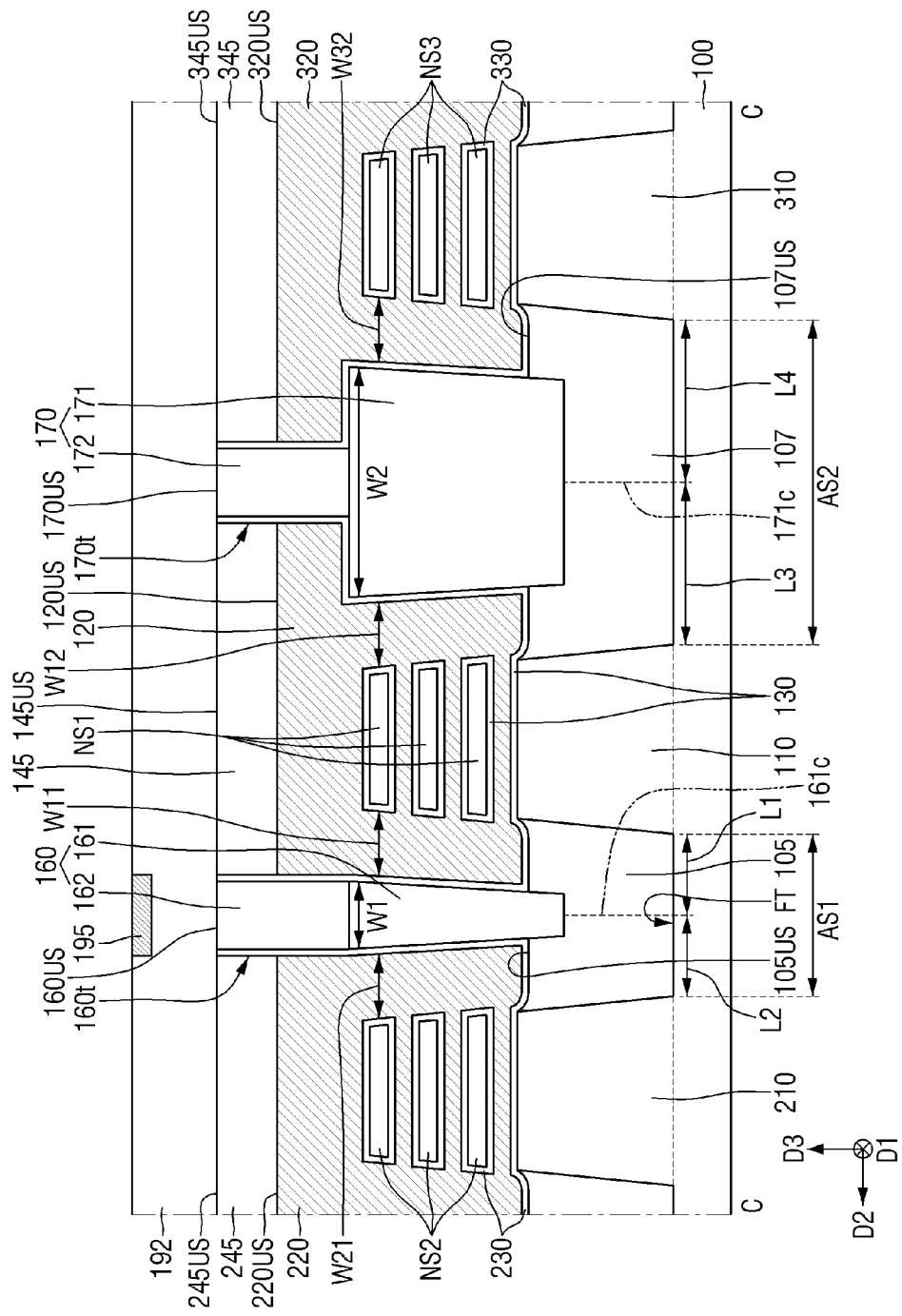
Figure 5:
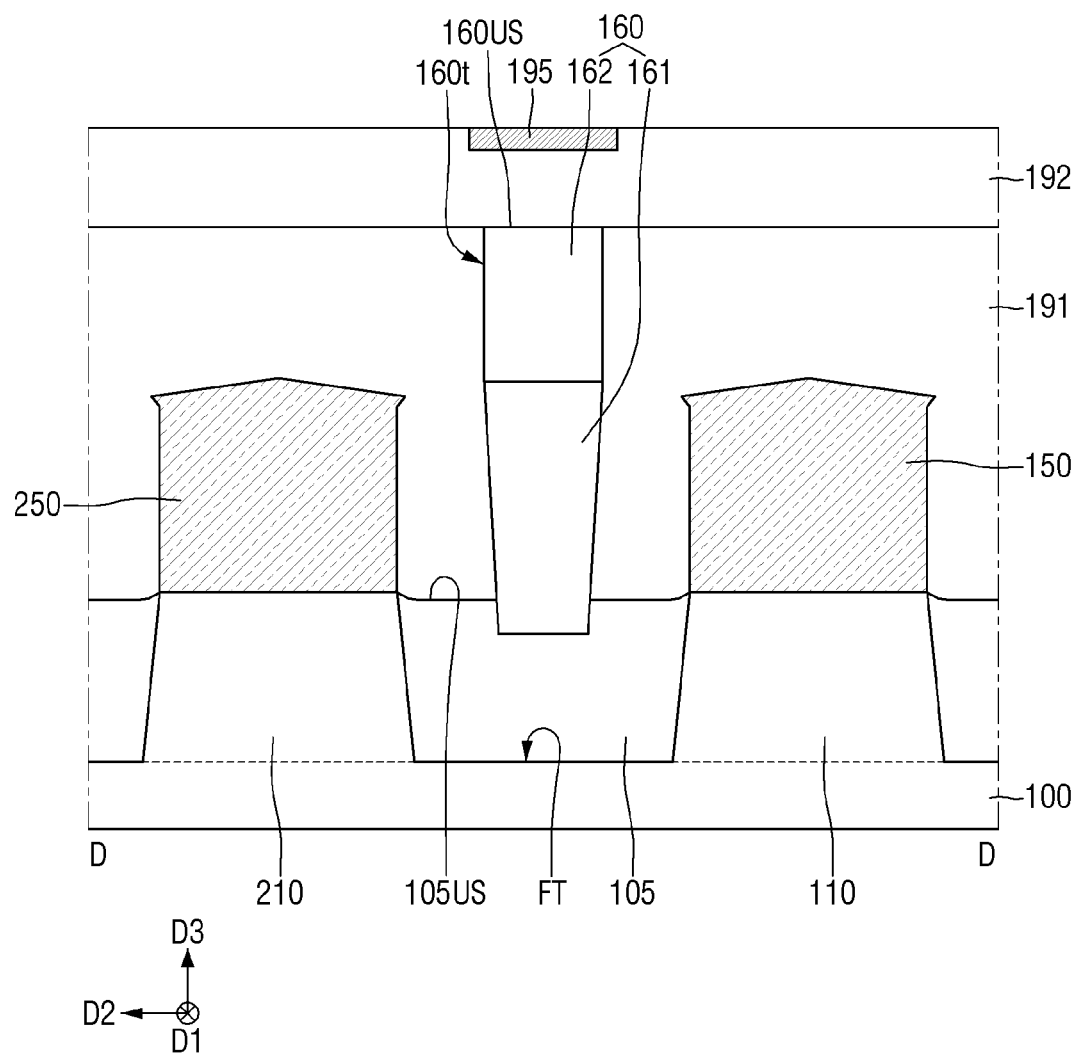
Figure 6:
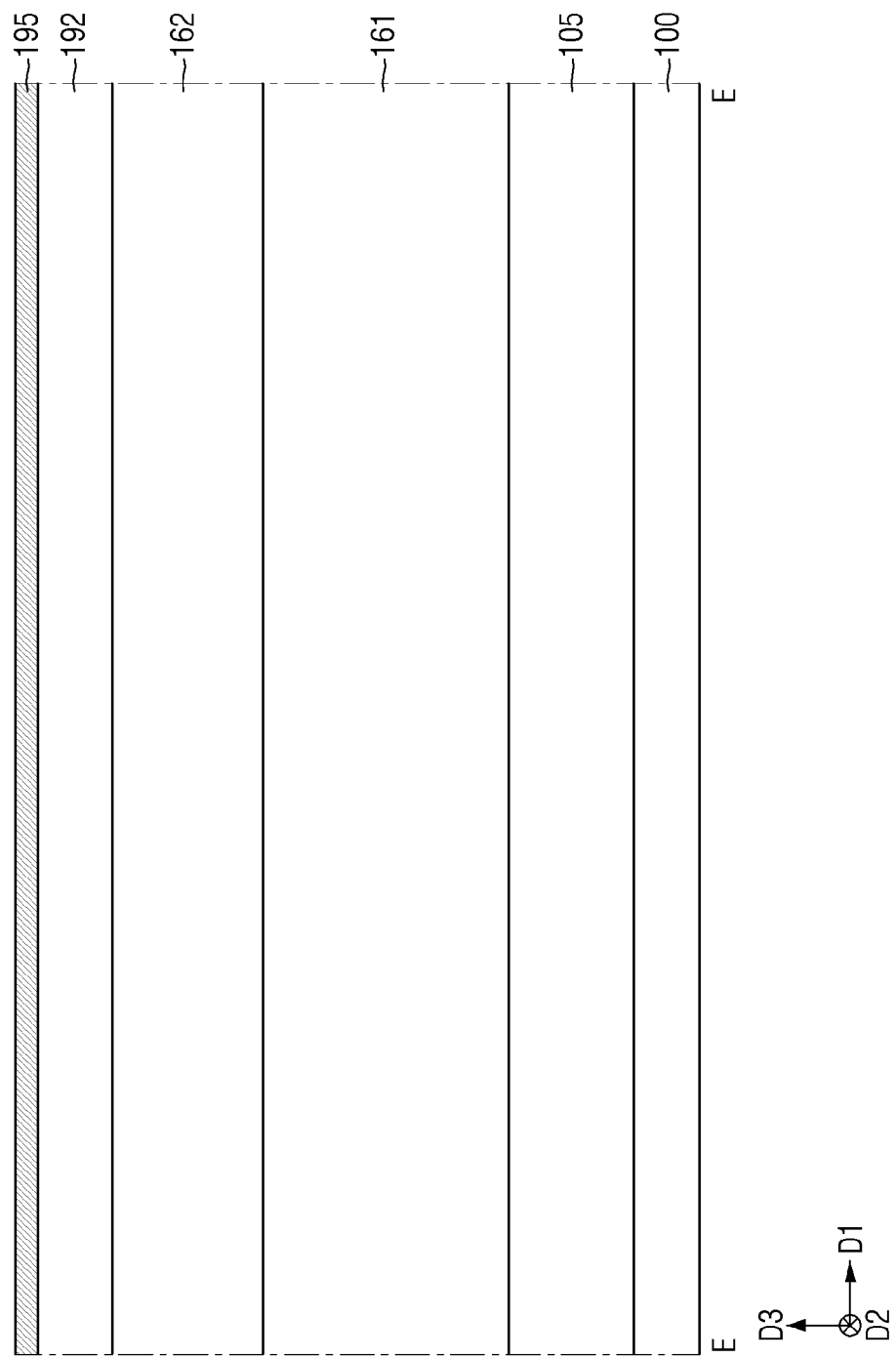

Although the number of the first sheet patterns NS1, the number of the second sheet patterns NS2 and the number of the third sheet patterns NS3 are each three as shown in FIGS. 2 to 4 by, they are only exemplary for convenience of description, and are not limited thereto.

Each of the first lower pattern 110, the second lower pattern 210 and the third lower pattern 310 may be formed by etching a portion of the substrate 100, and may include an epitaxial layer grown from the substrate 100. Each of the first lower pattern 110, the second lower pattern 210 and the third lower pattern 310 may include silicon or germanium, which is an elemental semiconductor material. Also, each of the first lower pattern 110, the second lower pattern 210 and the third lower pattern 310 may include a compound semiconductor, and may include, for example, a group IV-IV compound semiconductor or a group III-V compound semiconductor.

The group IV-IV compound semiconductor may be a binary compound or ternary compound, which includes at least two or more of carbon (C), silicon (Si), germanium (Ge) or tin (Sn), or a compound including at least two or more of carbon (C), silicon (Si), germanium (Ge) or tin (Sn), which are doped with a group IV element.

The group III-V compound semiconductor may be, for example, one of a binary compound, a ternary compound or a quaternary compound, which is formed by combination of at least one of aluminum (Al), gallium (Ga) or indium (In), which is a group III element, and at least one of phosphorus (P), arsenic (As) or antimony (Sb), which is a group V element.

The first sheet patterns NS1 may include one of silicon or germanium, which is an elemental semiconductor material, the group IV-IV compound semiconductor, or the group III-V compound semiconductor. The second sheet patterns NS2 may include one of silicon or germanium, which is an elemental semiconductor material, the group IV-IV compound semiconductor, or the group III-V compound semiconductor. The third sheet patterns NS3 may include one of silicon or germanium, which is an elemental semiconductor material, the group IV-IV compound semiconductor, or the group III-V compound semiconductor.

According to an embodiment, a width of each of the first sheet patterns NS1 in the second direction D2 may be increased or reduced in proportion to a width of the first lower pattern 110 in the second direction D2.

A first field insulating layer 105 may be disposed on a sidewall of the first lower pattern 110 and a sidewall of the second lower pattern 210. A second field insulating layer 107 may be disposed on another sidewall of the first lower pattern 110 and a sidewall of the third lower pattern 310. Unlike the shown example, a portion of the first lower pattern 110, a portion of the second lower pattern 210 and a portion of the third lower pattern 310 may be more protruded than upper surfaces 105US and 107US of the first field insulating layer 105 and the second field insulating layer 107 in the third direction D3.

Each of the first sheet patterns NS1, each of the second sheet patterns NS2 and each of the third sheet patterns NS3 are disposed to be higher than the upper surfaces 105US and 107US of the first field insulating layer 105 and the second field insulating layer 107. The first and second field insulating layers 105 and 107 may include, for example, an oxide layer, a nitride layer, an oxynitride layer, or a combination layer thereof.

The plurality of first gate structures GS1 may be disposed on the substrate 100. The plurality of first gate structures GS1 may be disposed between the first gate isolation structure 160 and the second gate isolation structure 170, which are extended long in the first direction D1. Each of the first gate structures GS1 may be extended in the second direction D2. The first gate structures GS1 adjacent to each other may be spaced apart from each other in the first direction D1.

The first gate structure GS1 may be disposed on the first active pattern AP1. The first gate structure GS1 may cross the first active pattern AP1 in the second direction D2. The second gate structure GS2 may be disposed on the second active pattern AP2. The second gate structure GS2 may cross the second active pattern AP2 in the second direction D2. Although not shown, a third gate structure including the third gate electrodes 320 may cross the third active pattern AP3 in the second direction D2, and may be disposed on the third active pattern AP3.

The plurality of second gate structures GS2 may be disposed on the substrate 100. Each of the second gate structures GS2 may be extended in the second direction D2. The second gate structures GS2 adjacent to each other may be spaced apart from each other in the first direction D1. The first gate structure GS1 and the second gate structure GS2, which correspond to each other, may face each other with the first gate isolation structure 160 interposed therebetween. Also, the first gate structure GS1 and the third gate structure may face each other with the second gate isolation structure 170 interposed therebetween. In other words, the first gate structure GS1, the second gate structure GS2, and the third gate structure, which correspond to one another, may be aligned in the second direction D2.

For example, the first gate structure GS1 may include a first gate electrode 120, a first gate insulating layer 130, a first gate spacer 140, and a first gate capping pattern 145. The second gate structure GS2 may include, for example, a second gate electrode 220, a second gate insulating layer 230, a second gate spacer 240, and a second gate capping pattern. The third gate structure may include, for example, a third gate electrode 320, a third gate insulating layer 330, a third gate spacer, and a third gate capping pattern 345.

The first gate electrode 120 may be disposed on the first lower pattern 110. The first gate electrode 120 may cross the first lower pattern 110. The first gate electrode 120 may surround the first sheet pattern NS1.

The second gate electrode 220 may be disposed on the second lower pattern 210. The second gate electrode 220 may cross the second lower pattern 210. The second gate electrode 220 may surround the second sheet pattern NS2. The third gate electrode 320 may be disposed on the third lower pattern 310. The third gate electrode 320 may cross the third lower pattern 310. The third gate electrode 320 may surround the third sheet pattern NS3.

Each of the first gate electrode 120 to the third gate electrode 320 is shown as one metal layer, but is not limited thereto, and may be implemented as a plurality of metal layers.

Each of the first gate electrode 120 to the third gate electrode 320 may include at least one of a metal, a metal alloy, a conductive metal nitride, a metal silicide, a doped semiconductor material, a conductive metal oxide or a conductive metal oxynitride. Each of the first gate electrode 120 to the third gate electrode 320 may include, but is not limited to, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), or their combination. The conductive metal oxide and the conductive metal oxynitride may include, but are not limited to, oxidized forms of the materials described above.

Although the number of each of the first to third gate electrodes 120 to 320 is four in FIGS. 1 to 6, it is only exemplary for convenience of description, and is not limited thereto. The number of each of the first gate electrode 120 to the third gate electrode 320 may be greater than or smaller than four.

An upper surface 120US of the first gate electrode 120, an upper surface 220US of the second gate electrode 220 and an upper surface 320US of the third gate electrode 320 have the same height based on the substrate 100. In particular, a region of the upper surfaces 120US, 220US and 320US which is adjacent to the first and second gate isolation structures 160 and 170 may have a flat planar shape.

At the same height based on the substrate 100, a width W11 of the first gate electrode 120 in the second direction D2, which is disposed between the first sheet pattern NS1 and the first gate isolation structure 160, is equal to a width W21 of the second gate electrode 220 in the second direction D2, which is disposed between the second sheet pattern NS2 and the first gate isolation structure 160. Likewise, at the same height based on the substrate 100, a width W12 of the first gate electrode 120 in the second direction D2, which is disposed between the first sheet pattern NS1 and the second gate isolation structure 170, is equal to a width W32 of the third gate electrode 320 in the second direction D2, which is disposed between the third sheet pattern NS3 and the second gate isolation structure 170.

In addition, with respect to the first active pattern AP1 spaced apart from the second active pattern AP2 by the first interval AS1 and spaced apart from the third active pattern AP3 by the second interval AS2, the width W11 of the first gate electrode 120 in the second direction D2 and the width W12 of the first gate electrode 120 in the second direction D2 are equal to each other. Therefore, operational performance and operational reliability of the semiconductor device may be improved.

The first gate insulating layer 130 may be extended along an upper surface 105US of the field insulating layer, an upper surface 107US of the second field insulating layer, an upper surface of the first lower pattern 110, a sidewall of the first gate isolation structure 160 and a sidewall of the second gate isolation structure 170. The first gate insulating layer 130 may surround the first sheet pattern NS1. The first gate insulating layer 130 may be disposed around the first sheet pattern NS1. The first gate electrode 120 is disposed on the first gate insulating layer 130.

The second gate insulating layer 230 may be extended along the upper surface 105US of the field insulating layer, an upper surface of the second lower pattern 210, and another sidewall of the first gate isolation structure 160. The second gate insulating layer 230 may surround the second sheet pattern NS2. The second gate insulating layer 230 may be disposed around the second sheet pattern NS2. The second gate electrode 220 is disposed on the second gate insulating layer 230.

The third gate insulating layer 330 may be extended along the upper surface 107US of the second field insulating layer, the upper surface of the second lower pattern 210, and another sidewall of the second gate isolation structure 170. The third gate insulating layer 330 may surround the third sheet pattern NS3. The third gate insulating layer 330 may be disposed around the third sheet pattern NS3. The third gate electrode 320 is disposed on the third gate insulating layer 330.

Each of the first gate insulating layer 130 to the third gate insulating layer 330 may include silicon oxide, silicon oxynitride, silicon nitride, or a high dielectric constant material having a dielectric constant greater than that of silicon oxide. The high dielectric constant material may include one or more of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

The semiconductor device according to the present embodiments may include a negative capacitance (NC) FET based on a negative capacitor. For example, each of the first gate insulating layer 130 to the third gate insulating layer 330 may include a ferroelectric material layer having ferroelectric characteristics, and a paraelectric material layer having paraelectric characteristics.

The ferroelectric material layer may have a negative capacitance, and the paraelectric material layer may have a positive capacitance. For example, when two or more capacitors are connected in series, and the capacitance of each capacitor has a positive value, the total capacitance may become smaller than the capacitance of each individual capacitor. On the other hand, when at least one of capacitances of two or more capacitors connected in series has a negative value, the total capacitance may have a positive value and may be greater than an absolute value of each individual capacitance.

When a ferroelectric material layer having a negative capacitance and a paraelectric material layer having a positive capacitance are connected in series, the total capacitance value of the ferroelectric material layer and the paraelectric material layer connected in series may increase. Based on the total capacitance value that increases, a transistor having a ferroelectric material layer may have a subthreshold swing (SS) smaller than 60 mV/decade at a room temperature.

The ferroelectric material layer may have ferroelectric characteristics. The ferroelectric material layer may include at least one of hafnium oxide, hafnium zirconium oxide, barium strontium titanium oxide, barium titanium oxide, or lead zirconium titanium oxide. For example, hafnium zirconium oxide may be a material doped with zirconium (Zr) in hafnium oxide. For another example, hafnium zirconium oxide may be a compound of hafnium (Hf) and zirconium (Zr) and oxygen (O).

The ferroelectric material layer may further include a doped dopant. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), or tin (Sn). A type of the dopant included in the ferroelectric material layer may be varied depending on the ferroelectric material of the ferroelectric material layer.

When the ferroelectric material layer includes hafnium oxide, the dopant included in the ferroelectric material layer may include at least one of gadolinium (Gd), silicon (Si), zirconium (Zr), aluminum (Al), or yttrium (Y).

When the dopant is aluminum (Al), the ferroelectric material layer may include aluminum of 3 at % to 8 at % (atomic %). In this case, a ratio of the dopant may be a ratio of aluminum to a sum of hafnium and aluminum.

When the dopant is silicon (Si), the ferroelectric material layer may include silicon of 2 at % to 10 at %. When the dopant is yttrium (Y), the ferroelectric material layer may include yttrium of 2 at % to 10 at %. When the dopant is gadolinium (Gd), the ferroelectric material layer may include gadolinium of 1 at % to 7 at %. When the dopant is zirconium (Zr), the ferroelectric material layer may include zirconium of 50 at % to 80 at %.

The paraelectric material layer may have paraelectric characteristics. The paraelectric material layer may include, for example, at least one of silicon oxide or metal oxide having a high dielectric constant. The metal oxide included in the paraelectric material layer may include, but is not limited to, at least one of hafnium oxide, zirconium oxide, or aluminum oxide.

The ferroelectric material layer and the paraelectric material layer may include the same material. Although the ferroelectric material layer has ferroelectric characteristics, the paraelectric material layer may not have ferroelectric characteristics. For example, when the ferroelectric material layer and the paraelectric material layer include hafnium oxide, a crystal structure of hafnium oxide included in the ferroelectric material layer is different from that of hafnium oxide included in the paraelectric material layer.

The ferroelectric material layer may have a thickness having ferroelectric characteristics. The thickness of the ferroelectric material layer may be, for example, 0.5 nm to 10 nm, but is not limited thereto. Since a threshold thickness indicating ferroelectric characteristics may vary depending on each ferroelectric material, the thickness of the ferroelectric material layer may vary depending on the ferroelectric material.

For example, each of the first gate insulating layer 130 to the third gate insulating layer 330 may include one ferroelectric material layer. For another example, each of the first gate insulating layer 130 to the third gate insulating layer 330 may include a plurality of ferroelectric material layers spaced apart from each other. Each of the first gate insulating layer 130 to the third gate insulating layer 330 may have a deposited layer structure in which a plurality of ferroelectric material layers and a plurality of paraelectric material layers are alternately deposited.

The first gate spacer 140 may be disposed on sidewalls of the first gate electrode 120. As an example, in FIG. 2, the first gate spacer 140 disposed on the first lower pattern 110 may include a first outer spacer 141 and a first inner spacer 142. The first inner spacer 142 may be disposed between the first sheet patterns NS1 adjacent to each other in the third direction D3. As another example, although not shown, the first gate spacer 140 disposed on the first lower pattern 110 may include only the first outer spacer 141 without including the first inner spacer 142.

The second gate spacer 240 may be disposed on sidewalls of the second gate electrode 120. Since the first active pattern AP1 and the second active pattern AP2 may be transistor forming regions of the same conductivity type, the second gate spacer 240 disposed on the second lower pattern 210 may have the same structure as that of the first gate spacer 140 disposed on the first lower pattern 110. For example, when the first gate spacer 140 disposed on the first lower pattern 110 includes the first outer spacer 141 and the first inner spacer 142, the second gate spacer 240 disposed on the second lower pattern 210 may include a second outer spacer 241 and a second inner spacer 242. For another example, when the first gate spacer 140 disposed on the first lower pattern 110 does not include the first inner spacer 142, the second gate spacer 240 disposed on the second lower pattern 210 may not include the second inner spacer 242, either.

Although not shown, for example, the third gate spacer disposed on the third lower pattern 310 may include a third outer spacer and a third inner spacer. For another example, the third gate spacer disposed on the third lower pattern 310 may include only the first outer spacer without including the first inner spacer.

Each of the outer spacers 141 and 241 and the inner spacers 142 and 242 may include at least one of, for example, silicon nitride (SiN), silicon oxynitride (SiON), silicon oxide (SiO$_2$), silicon oxycarbonitride (SiOCN), silicon boron nitride (SiBN), silicon oxyboron nitride (SiOBN), silicon oxycarbide (SiOC) or their combination.

The first gate capping pattern 145 may be disposed on the first gate electrode 120 and the first gate spacer 140. An upper surface 145_US of the first gate capping pattern may be placed on the same plane as an upper surface of a first interlayer insulating layer 191. Unlike the shown example, the first gate capping pattern 145 may be disposed between the first gate spacers 140.

A second gate capping pattern 245 may be disposed on the second gate electrode 220 and the second gate spacer 240. An upper surface 245_US of the second gate capping pattern may be placed on the same plane as the upper surface of the first interlayer insulating layer 191. Unlike the shown example, the second gate capping pattern 245 may be disposed between the second gate spacers 240.

Each of the first gate capping pattern 145 and the second gate capping pattern 245 may include at least one of, for example, silicon nitride (SiN), silicon oxynitride (SiON), silicon carbonitride (SiCN), silicon oxycarbonitride (SiOCN), or their combination. Each of the first gate capping pattern 145 and the second gate capping pattern 245 may include a material having etch selectivity with respect to the first interlayer insulating layer 191.

A plurality of first source/drain patterns 150 may be formed on the first lower pattern 110. The plurality of first source/drain patterns 150 may be disposed between the first gate electrodes 120 adjacent to each other in the first direction D1. Each of the first source/drain patterns 150 may be connected with the first sheet patterns NS1 adjacent to each other in the first direction D1.

A plurality of second source/drain patterns 250 may be formed on the second lower pattern 210. The plurality of second source/drain patterns 250 may be disposed between the second gate electrodes 120 adjacent to each other in the first direction D1. Each of the second source/drain patterns 250 may be connected with the second sheet patterns NS2 adjacent to each other in the first direction D1.

The first source/drain pattern 150 may be included in a source/drain of a transistor that uses the first sheet pattern NS1 as a channel region. The second source/drain pattern 250 may be included in a source/drain of a transistor that uses the second sheet pattern NS2 as a channel region.

Although not shown, source/drain contacts may be disposed on the first source/drain pattern 150 and the second source/drain pattern 250. Further, a metal silicide layer may be further disposed between the source/drain contact and the source/drain patterns 150 and 250.

Although the first source/drain pattern 150 and the second source/drain pattern 250 are shown as having a cross-section similar to that of an arrow, the first source/drain pattern 150 and the second source/drain pattern 250 are not limited thereto.

The first interlayer insulating layer 191 may be disposed on the first field insulating layer 105. The first interlayer insulating layer 191 may also be disposed on sidewalls of the first gate structure GS1 and sidewalls of the second gate structure GS2. The first interlayer insulating layer 191 may further be formed on the first source/drain patterns 150 and the second source/drain patterns 250. The first interlayer insulating layer 191 may include, for example, a silicon oxide or an oxide-based insulating material.

The first gate isolation structure 160 and the second gate isolation structure 170 may be disposed on the substrate 100. The first gate isolation structure 160 may be disposed on the first field insulating layer 105 between the first active pattern AP1 and the second active pattern AP2. The second gate isolation structure 170 may be disposed on the second field insulating layer 107 between the first active pattern AP1 and the third active pattern AP3. The first gate isolation structure 160 may be disposed along the first direction D1. The second gate isolation structure 170 may be disposed along the first direction D1.

The first gate isolation structure 160 and the second gate isolation structure 170 may be spaced apart from each other in the second direction D2. The first active pattern AP1 may be disposed between the first gate isolation structure 160 and the second gate isolation structure 170, which are adjacent to each other in the second direction D2. The first gate structure GS1 may be disposed between the first gate isolation structure 160 and the second gate isolation structure 170, which are adjacent to each other in the second direction D2.

In the semiconductor device according to embodiments, the first gate isolation structure 160 and the second gate isolation structure 170 may be disposed along a boundary of the standard cell. For example, the first gate isolation structure 160 may be a standard cell isolation structure.

The first gate isolation structure 160 may separate the gate electrodes adjacent to each other in the second direction D2. The first gate structure GS1 and the second gate structure GS2 may be separated from each other by the first gate isolation structure 160. That is, the first gate electrode 120 and the second gate electrode 220 may be separated from each other by the first gate isolation structure 160.

In other words, when each of the first gate electrode 120 and the second gate electrode 220 includes an end that includes a single-side wall, the first gate isolation structure 160 may be disposed between the end of the first gate electrode 120 and the end of the second gate electrode 220.

The first gate isolation structure 160 may be disposed on the first field insulating layer 105 between the first gate structure GS1 and the second gate structure GS2, which are aligned in the second direction D2. An upper surface 160US of the first gate isolation structure may be placed on the same plane as the upper surface 145US of the first gate capping pattern and the upper surface 245US of the second gate capping pattern.

The first gate isolation structure 160 may be disposed in the first interlayer insulating layer 191 on the first field insulating layer 105. The upper surface 160US of the first gate isolation structure may be placed on the same plane as the upper surface of the first interlayer insulating layer 191.

The second gate isolation structure 170 may separate the gate electrodes adjacent to each other in the second direction D2. The first gate structure GS1 and the third gate structure may be separated from each other by the second gate isolation structure 170. That is, the first gate electrode 120 and the third gate electrode 320 may be separated from each other by the first gate isolation structure 160.

In other words, when each of the first gate electrode 120 and the third gate electrode 320 includes an end that includes a single-side wall, the second gate isolation structure 170 may be disposed between the end of the first gate electrode 120 and the end of the third gate electrode 320.

The second gate isolation structure 170 may be disposed on the second field insulating layer 107 between the first gate structure GS1 and the third gate structure, which are aligned in the second direction D2. An upper surface 170US of the second gate isolation structure may be placed on the same plane as the upper surface 145US of the first gate capping pattern 145 and an upper surface 345US of the third gate capping pattern 345.

The second gate isolation structure 170 may be disposed in the first interlayer insulating layer 191 on the second field insulating layer 107.

The first gate isolation structure 160 includes a first dam structure 161 and a first gate isolation filling layer 162. The second gate isolation structure 170 includes a second dam structure 171 and a second gate isolation filling layer 172.

The first dam structure 161 is a lower structure of the first gate isolation structure 160, and its sidewalls may be partially in contact with the first field insulating layer 105. A distance L1 between a vertical center line 161c of the first dam structure 161 and the first lower pattern 110 and a distance L2 between the vertical center line 161c of the first dam structure 161 and the second lower pattern 210 may be equal to each other, and thus the vertical center line 161c may pass through a center of the fin trench FT. A structure of the first dam structure 161 may be formed by a process of FIGS. 26 and 27, which will be described later.

An upper surface of the first dam structure 161 may be in contact with the first gate isolation filling layer 162.

The first dam structure 161 may have a wedge shape in which a width W1 in the second direction D2 becomes narrow toward the substrate 100. The first dam structure 161 may include, for example, a silicon oxide or oxide-based insulating material, and a silicon nitride or nitride-based insulating material.

A first gate isolation trench 160t may be disposed in the first interlayer insulating layer 191, and may be defined by the first gate electrode 120, the second gate electrode 220, the first gate capping pattern 145, the second gate capping pattern 245, and the upper surface of the first dam structure 161.

The first gate isolation filling layer 162 may fill the first gate isolation trench 160t.

The first gate isolation filling layer 162 may be disposed in the first interlayer insulating layer 191, and may be disposed on the upper surface of the first dam structure 161.

The first gate isolation filling layer 162 may be in contact with the first dam structure 161, the first gate insulating layer 130, the second gate insulating layer 230, the first gate capping pattern 145, and the second gate capping pattern 245.

In the semiconductor device according to the present embodiments, a width of the first gate isolation structure 160 in the first direction D1 is greater than a width of one first gate structure GS1 in the first direction D1. The first gate isolation filling layer 162 may include, for example, a silicon oxide or an oxide-based insulating material.

The second dam structure 171 is a lower structure of the second gate isolation structure 170, and its sidewalls may be partially in contact with the second field insulating layer 107. A distance L3 between a vertical center line 171c of the second dam structure 171 and the first lower pattern 110 and a distance L4 between the vertical center line 171c of the second dam structure 171 and the third lower pattern 310 may be equal to each other, and thus the center line 171c may pass through the center of the fin trench FT. A structure of the second dam structure 171 may be formed by the process of FIGS. 26 and 27, which will be described later.

An upper surface of the second dam structure 171 may be in contact with the second gate isolation filling layer 172.

The second dam structure 171 may also a wedge shape in which a width W2 in the second direction D2 becomes narrow toward the substrate 100. The second dam structure 171 may include, for example, a silicon oxide or oxide-based insulating material, and a silicon nitride or nitride-based insulating material.

A second gate isolation trench 170t may be disposed in the first interlayer insulating layer 191, and may be defined by the first gate electrode 120, the third gate electrode 320, the first gate capping pattern 145, the third gate capping pattern 345 and the upper surface of the second dam structure 171.

The second gate isolation filling layer 172 may fill the second gate isolation trench 170t.

The second gate isolation filling layer 172 may be disposed in the first interlayer insulating layer 191, and may be disposed on the upper surface of the second dam structure 171. The second gate isolation filling layer 172 may be in contact with the second dam structure 171, the first gate insulating layer 130, the third gate insulating layer 230, the first gate capping pattern 145 and the third gate capping pattern.

In the semiconductor device according to embodiments, a width of the second gate isolation structure 170 in the first direction D1 is greater than that of one first gate structure GS1 in the first direction D1. The first gate isolation filling layer 172 may include, for example, a silicon oxide or an oxide-based insulating material.

At the same height based on the substrate 100, a width W2 of the second dam structure 171 in the second direction D2 is greater than a width W1 of the first dam structure 161 in the second direction D2. The widths W1 and W2 of the dam structures 161 and 171 may be compared by the intervals AS1 and AS2 in the second direction D2 among the active patterns AP1 to AP3. As the first interval AS1 between the first active pattern AP1 and the second active pattern AP2 is increased, the width W1 of the first dam structure 161 is increased. It will be apparent that this case is applied to the second interval AS2 between the first active pattern AP1 and the third active pattern AP3 and the width W2 of the second dam structure 171.

A second interlayer insulating layer 192 may be disposed on the first interlayer insulating layer 191. The second interlayer insulating layer 192 may include at least one of, for example, silicon oxide, silicon nitride, silicon oxynitride, Flowable Oxide (FOX), Tonen SilaZene (TOSZ), Undoped Silica Glass (USG), Borosilica Glass (BSG), PhosphoSilica Glass (PSG), BoroPhosphoSilica Glass (BPSG), Plasma Enhanced Tetra Ethyl Ortho Silicate (PETEOS), Fluoride Silicate Glass (FSG), Carbon Doped silicon Oxide (CDO), Xerogel, Aerogel, Amorphous Fluorinated Carbon, Organo Silicate Glass (OSG), Parylene, bis-benzocyclobutenes (BCB), SiLK, polyimide, porous polymeric material, or their combination, but is not limited thereto.

A wiring line 195 may be disposed in the second interlayer insulating layer 192. The wiring line 195 may be extended in the first direction D1 along the first gate isolation structure 160.

For example, the wiring line 195 may be a power line for supplying power to an integrated circuit that includes the first active pattern AP1, the second active pattern AP2, the first gate electrode 120 and the second gate electrode 220. The wiring line 195 may include, for example, at least one of a metal, a metal alloy, a conductive metal nitride, or a two-dimensional (2D) material.

Although not shown, wires for transferring signals to an integrated circuit, which includes the first to third active patterns AP1 to AP3 and the first to third gate electrodes 120 to 320, may be further disposed between the first gate isolation structure 160 and the second gate isolation structure 170 in the second direction D2.

Unlike the shown example, the wiring line 195 may be in contact with the upper surface of the first gate isolation structure 160.

Figure 7:
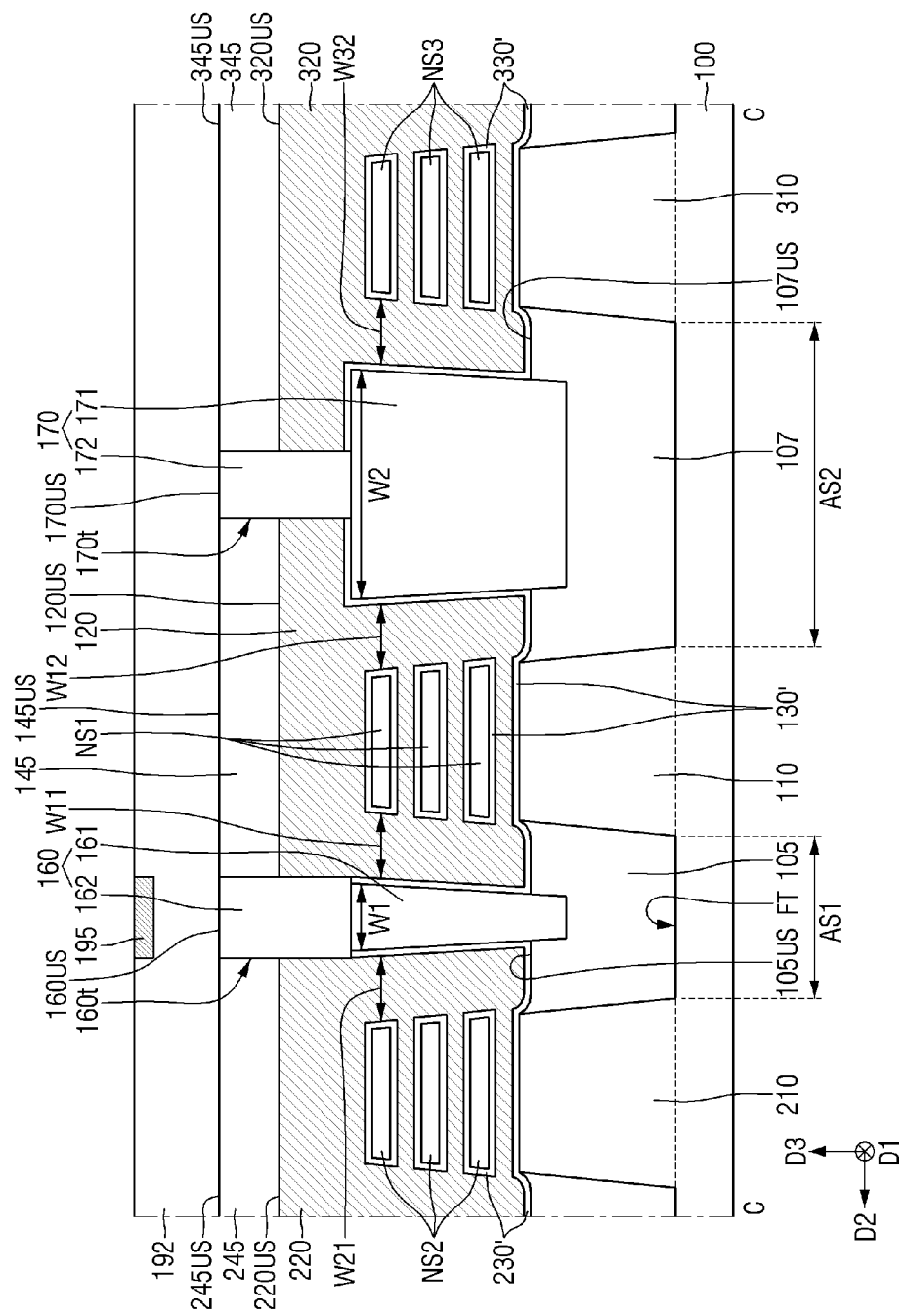
FIG. 7 is a view illustrating a semiconductor device according to embodiments.

FIG. 7 is a view illustrating a semiconductor device according to embodiments. For convenience of description, the following description will be based on a difference from the description of FIGS. 1 to 6. For reference, FIG. 7 is a cross-sectional view taken along line C-C of FIG. 1.

Referring to FIG. 7, unlike the first to third gate insulating layers 130 to 330 of FIG. 4, a first gate insulating layer 130' may be disposed only on lower portions of respective sidewalls of the first gate isolation structure 160 and the second gate isolation structure 170 above the upper surface 105US and 107US of the first field insulating layer 105 and the second field insulating layer 107, and is not disposed on upper portions of the sidewalls. The first gate insulating layer 130 may be disposed on sidewalls of the first dam structure 161 and the second dam structure 171, and may not be disposed on sidewalls of the first and second gate isolation filling layers 162 and 172.

A second gate insulating layer 230' may be disposed only on a lower portion of another sidewall of the first gate isolation structure 160 above the upper surface 105US of the first field insulating layer 105, and is not disposed on an upper portion of this sidewall. The second gate insulating layer 230' may be disposed on another sidewall of the first dam structure 161, and may not be disposed on another sidewall of the first gate isolation filling layer 162.

A third gate insulating layer 330' may be disposed only on a lower portion of another sidewall of the second gate isolation structure 170 above the upper surface 107US of the second field insulating layer 107, and is not disposed on an upper portion of this sidewall. The second gate insulating layer 230' may be disposed on another sidewall of the second dam structure 171, and may not be disposed on another sidewall of the second gate isolation filling layer 172.

An uppermost surface of the first gate insulating layer 130' may be disposed between an uppermost surface of the first sheet pattern NS1 and the upper surface of the first gate electrode 120. That is, the uppermost surface of the first gate insulating layer 130' may be higher than the uppermost surface of the first sheet pattern NS1, and lower than the upper surface of the first gate electrode 120.

It will be apparent that the foregoing arrangement of the first gate insulating layer 130', the first sheet pattern NS1 and the first gate electrode 120 may also be applied to the second gate insulating layer 230', the second sheet pattern NS2, and the second gate electrode 220, and the third gate insulating layer 330', the third sheet pattern NS3 and the third gate electrode 320.

The first gate isolation structure 160 and the second gate isolation structure 170 may be formed by a replacement metal gate (RMG) process in which the first and second gate isolation trenches 160t and 170t are formed after the gate electrode including the first to third gate electrodes 120 to 320 are formed, and the first and second gate isolation trenches 160t and 170t are filled by the first and second gate isolation filling layers 162 and 172.

Figure 8:
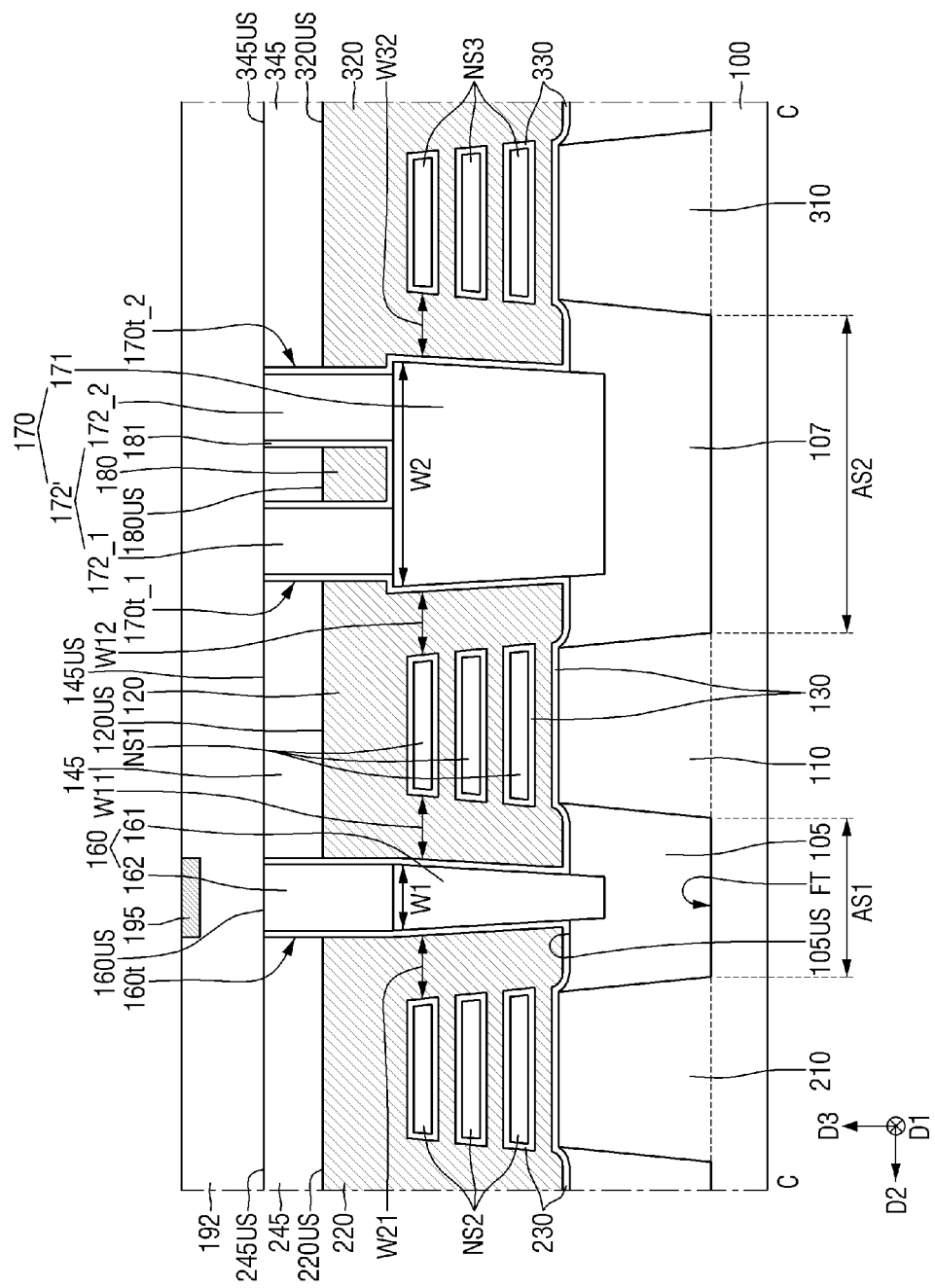
FIG. 8 is a view illustrating a semiconductor device according to embodiments.

FIG. 8 is a view illustrating a semiconductor device according to embodiments. For convenience of description, the following description will be based on a difference from the description of FIGS. 1 to 6. For reference, FIG. 8 is a cross-sectional view taken along line C-C of FIG. 1.

Referring to FIG. 8, unlike the second gate isolation filling layer 172 of FIG. 4, a second gate isolation filling layer 172' disposed on the second dam structure 171 includes a (2_1)th gate isolation filling layer 172_1 and a (2_2)th gate isolation filling layer 172_2. The (2_1)th gate isolation filling layer 172_1 and the (2_2) the gate isolation filling layer 172_2 are aligned in the second direction D2.

The (2_1)th gate isolation filling layer 172_1 and the (2_2)th gate isolation filling layer 172_2 fill a (2_1)th gate isolation trench 170t_1 and a (2_2)th gate isolation trench 170t_2, which are formed on the second dam structure 171, respectively.

Each of the (2_1)th gate isolation filling layer 172_1 and the (2_2)th gate isolation filling layer 172_2 may correspond to the second gate isolation filling layer 172 of FIG. 4.

A remaining gate insulating layer 181, which is formed along one sidewall of the (2_1)th gate isolation filling layer 172_1, one sidewall of the (2_2)th gate isolation filling layer 172_2 and an upper surface of the second dam structure 171, may be additionally disposed, and a remaining gate electrode 180 may be disposed on the remaining gate insulating layer 181.

An upper surface 180US of the remaining gate electrode 180 may be disposed at the same level as the upper surface 120US of the first gate electrode 120, the upper surface 220US of the second gate electrode 220, and the upper surface 320US of the third gate electrode 320 based on the substrate 100. In particular, the upper surface of the remaining gate electrode 180 adjacent to the first and second gate isolation structures 160 and 170 may have a flat planar shape.

Figure 9:
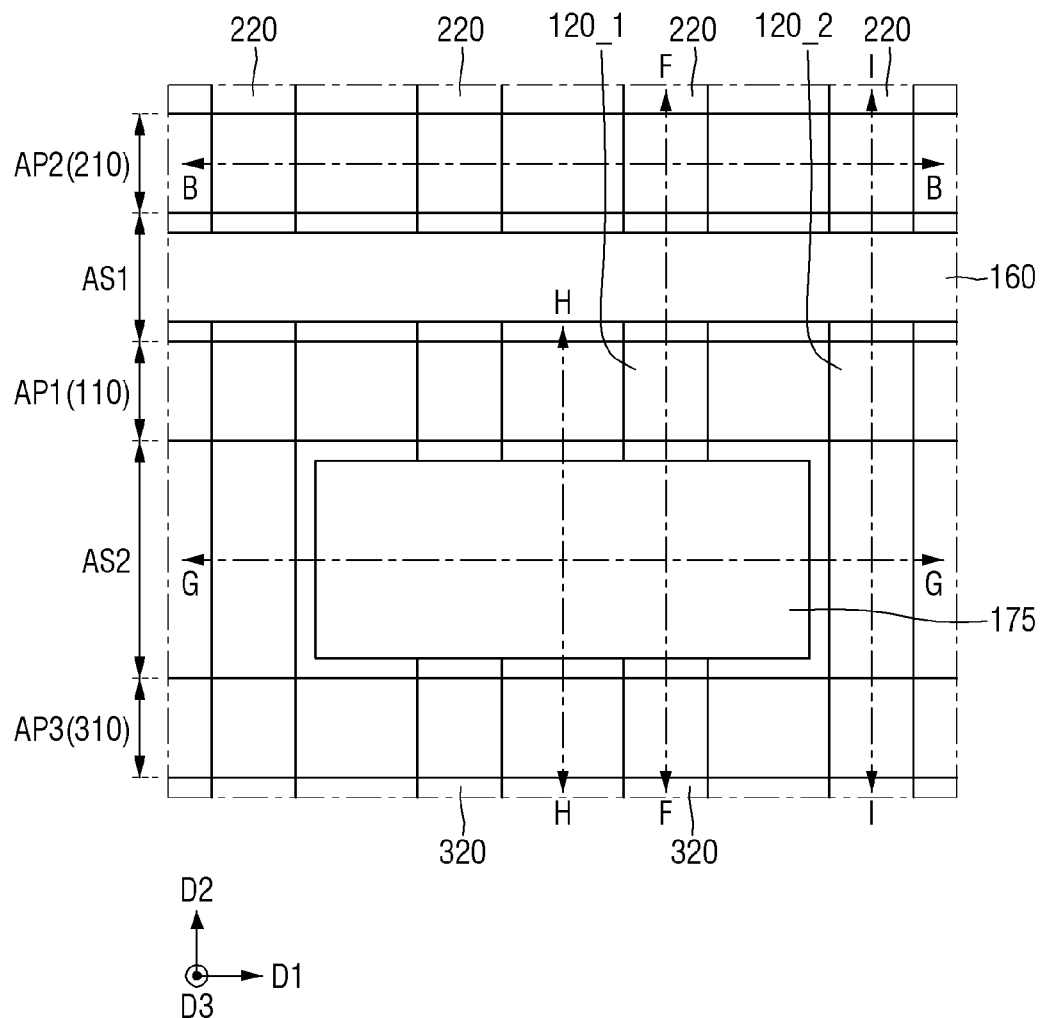
FIG. 9 is a layout view illustrating a semiconductor device according to other embodiments.
Figure 10:
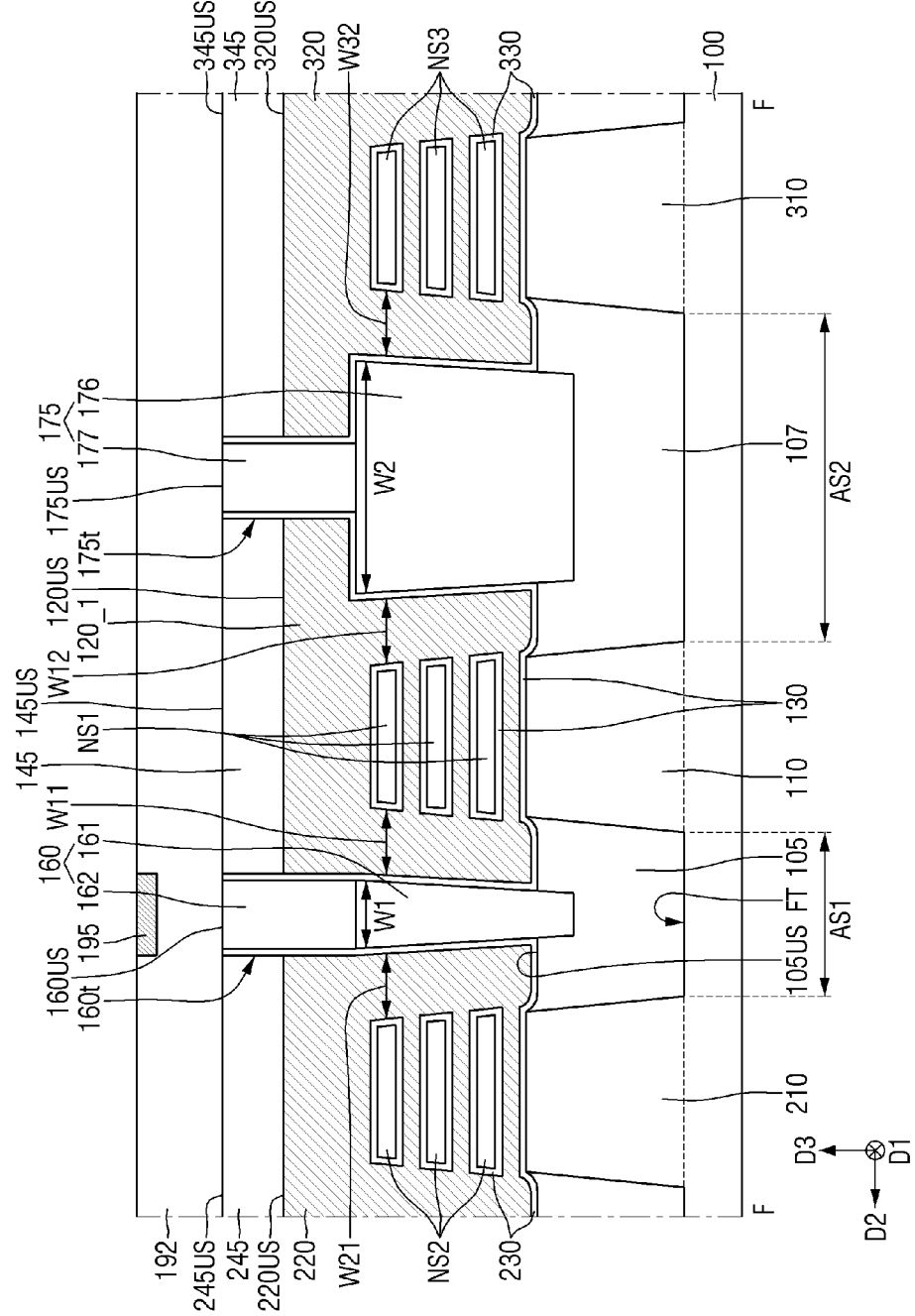
FIGS. 10 to 13 are cross-sectional views taken along lines F-F, G-G, H-H and I-I of FIG. 9, respectively, according to embodiments.
Figure 11:
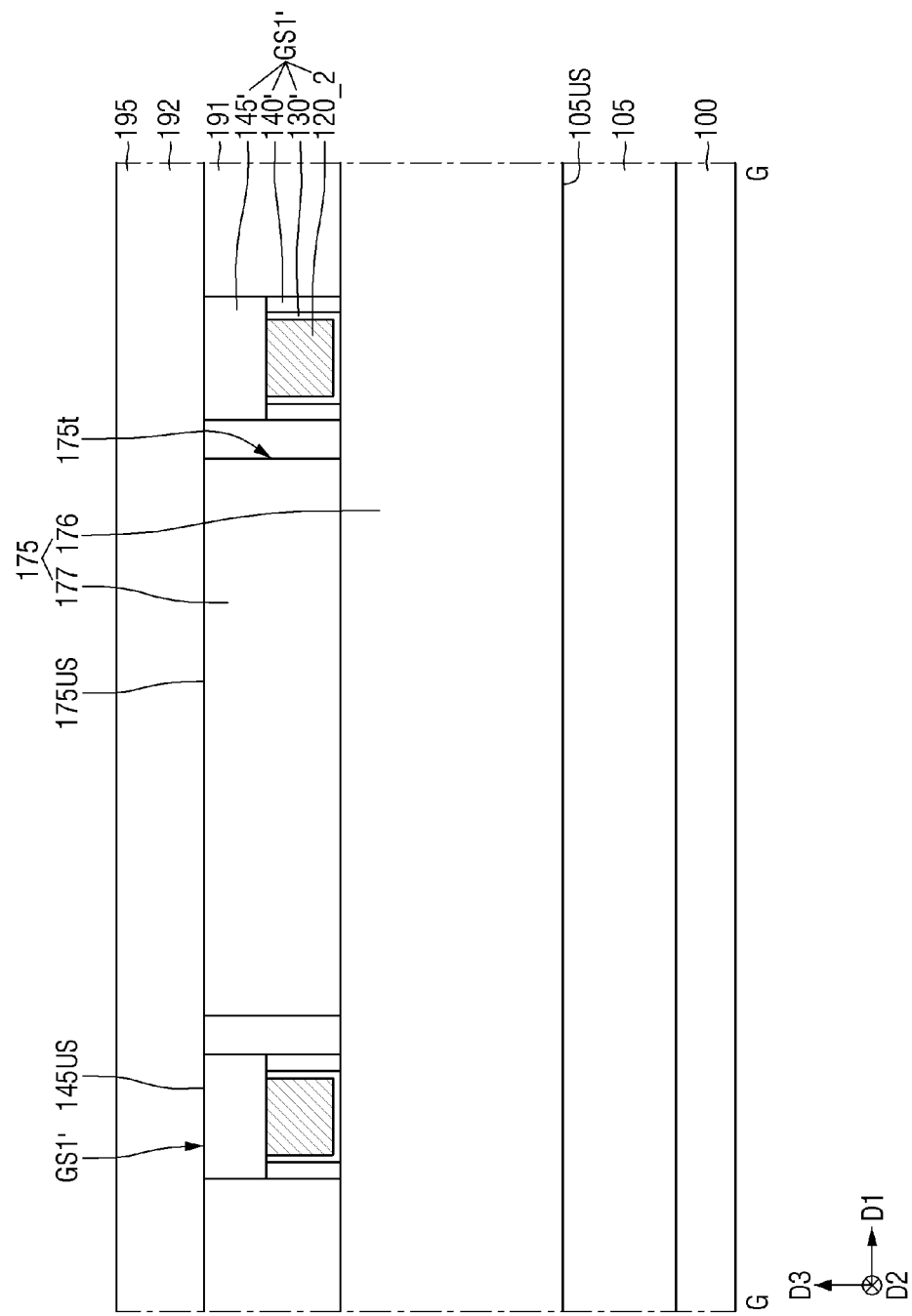
Figure 12:
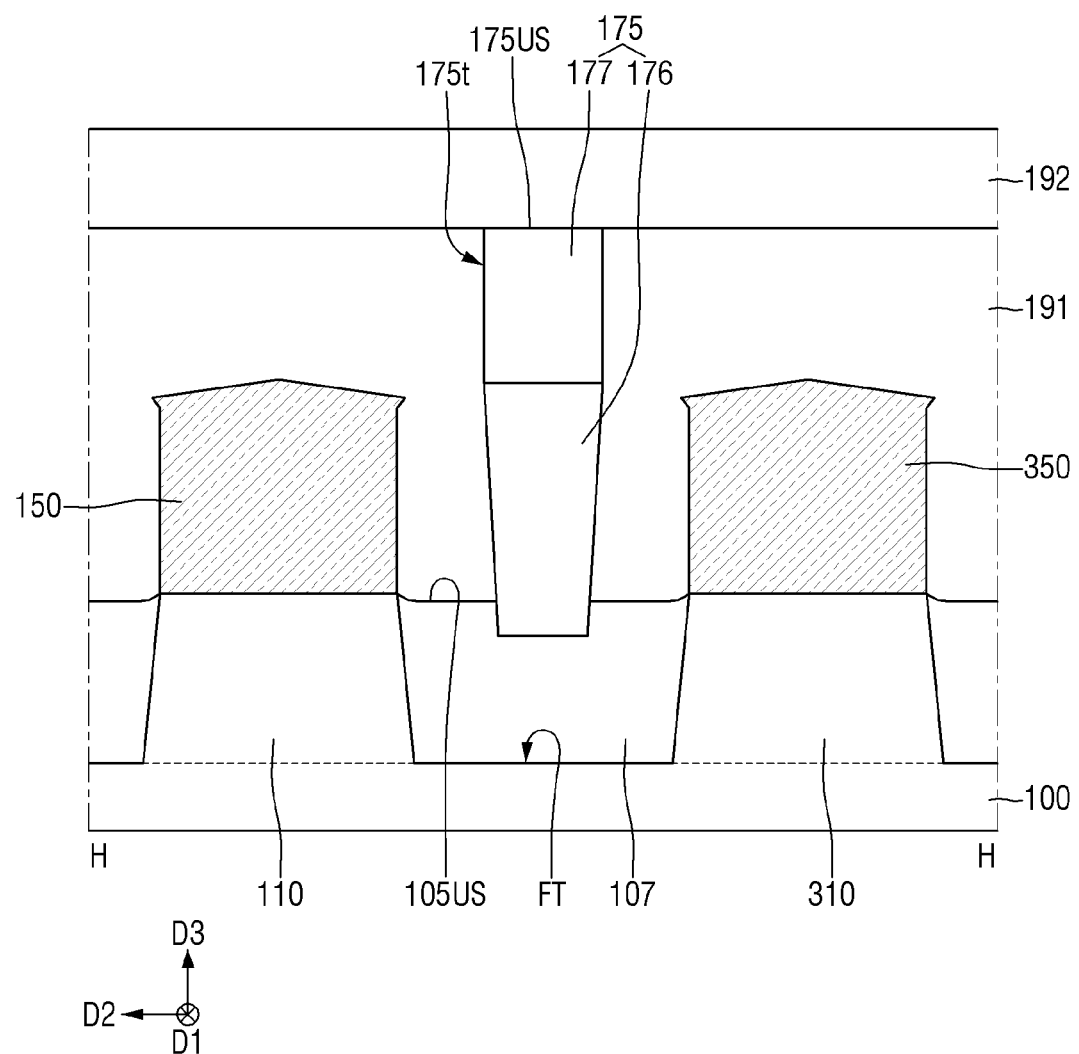
Figure 13:
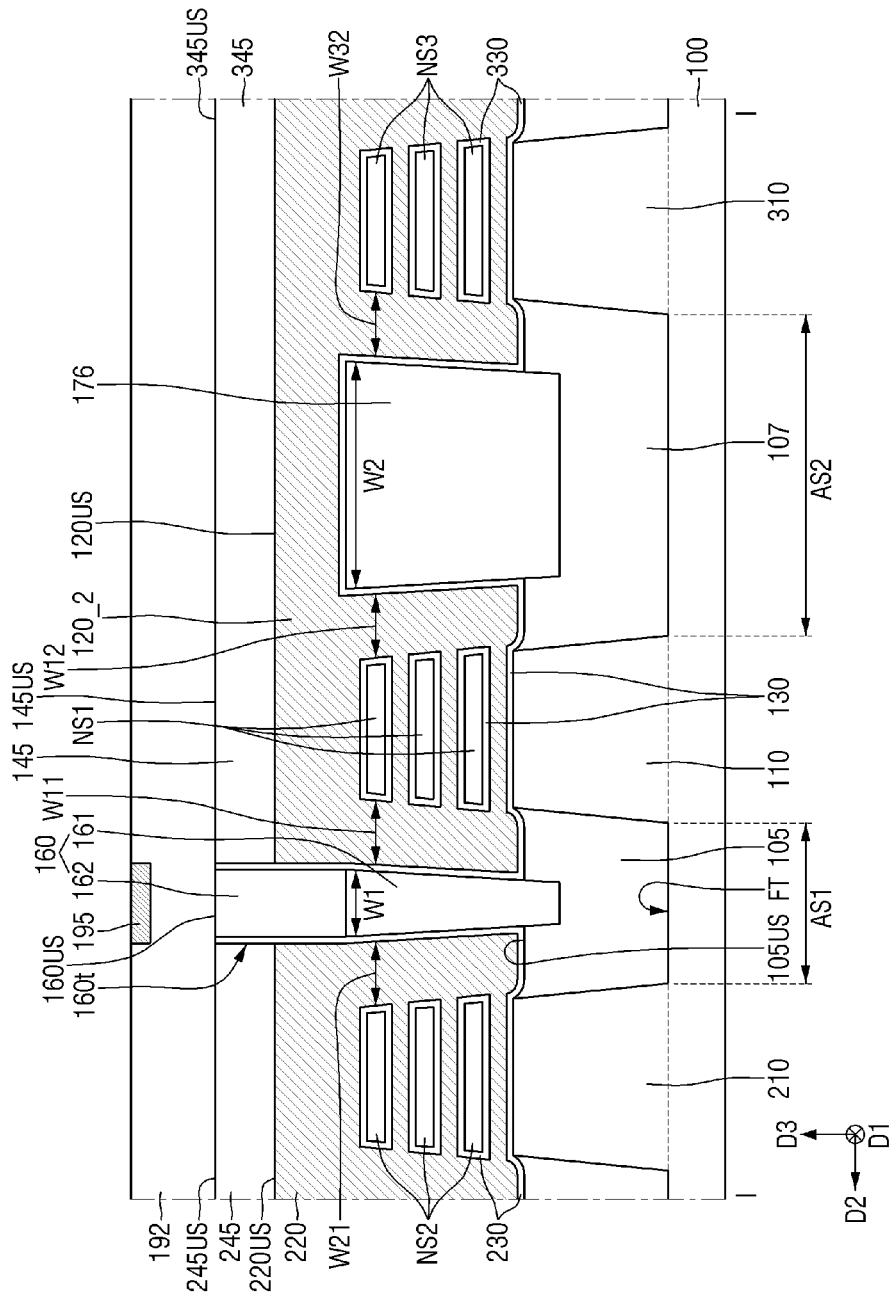

FIG. 9 is a layout view illustrating a semiconductor device according to other embodiments. FIGS. 10 to 13 are cross-sectional views taken along lines F-F, G-G, H-H and I-I of FIG. 9, respectively. For convenience of description, the following description will be based on a difference from the description of FIGS. 1 to 6.

Referring to FIGS. 9 to 13, the second gate isolation structure 175 may correspond to the second gate isolation structure 170 of FIGS. 1 to 6, and its repeated description will be omitted for convenience of description.

Unlike the second gate isolation structure 170 of FIGS. 1 to 6, the second gate isolation filling layer 177, which is an upper structure of the second gate isolation structure 175, is extended in the first direction D1 at a length shorter than that of each of the first and third active patterns AP1 and AP3 extended in the first direction D1. The second dam structure 176, which is a lower structure of the second gate isolation structure 175, is disposed to be extended in the first direction D1 along with the first and third active patterns AP1 and AP3.

The second gate isolation filling layer 177 may be disposed in the first interlayer insulating layer 191, and may be disposed in a second gate isolation trench 175t defined by the second dam structure 176, the second gate capping pattern 245 and the third gate capping pattern 345. The second gate isolation filling layer 177 may fill the second gate isolation trench 175t. The second gate isolation filling layer 177 and the second dam structure 176 separate a plurality of (1_1)th gate electrodes 120_1 from the plurality of third gate electrodes 320.

The plurality of (1_1)th gate electrodes 120_1 may face the plurality of third gate electrodes 320 with the second gate isolation structure 175 interposed therebetween. In other words, the plurality of (1_1)th gate electrodes 120_1 and the plurality of third gate electrodes 320, which correspond to each other, may be aligned in the second direction D2.

A portion GS1' of the first gate structure including a plurality of (1_2)th gate electrodes 120_2 may be disposed on the first active pattern AP1 and the third active pattern AP3. The portion GS1' of the first gate structure may cross the first active pattern AP1 and the first active pattern AP3.

The portion GS1' of the first gate structure may be disposed on the second dam structure 176, and may be disposed across the second dam structure 176.

Figure 14:
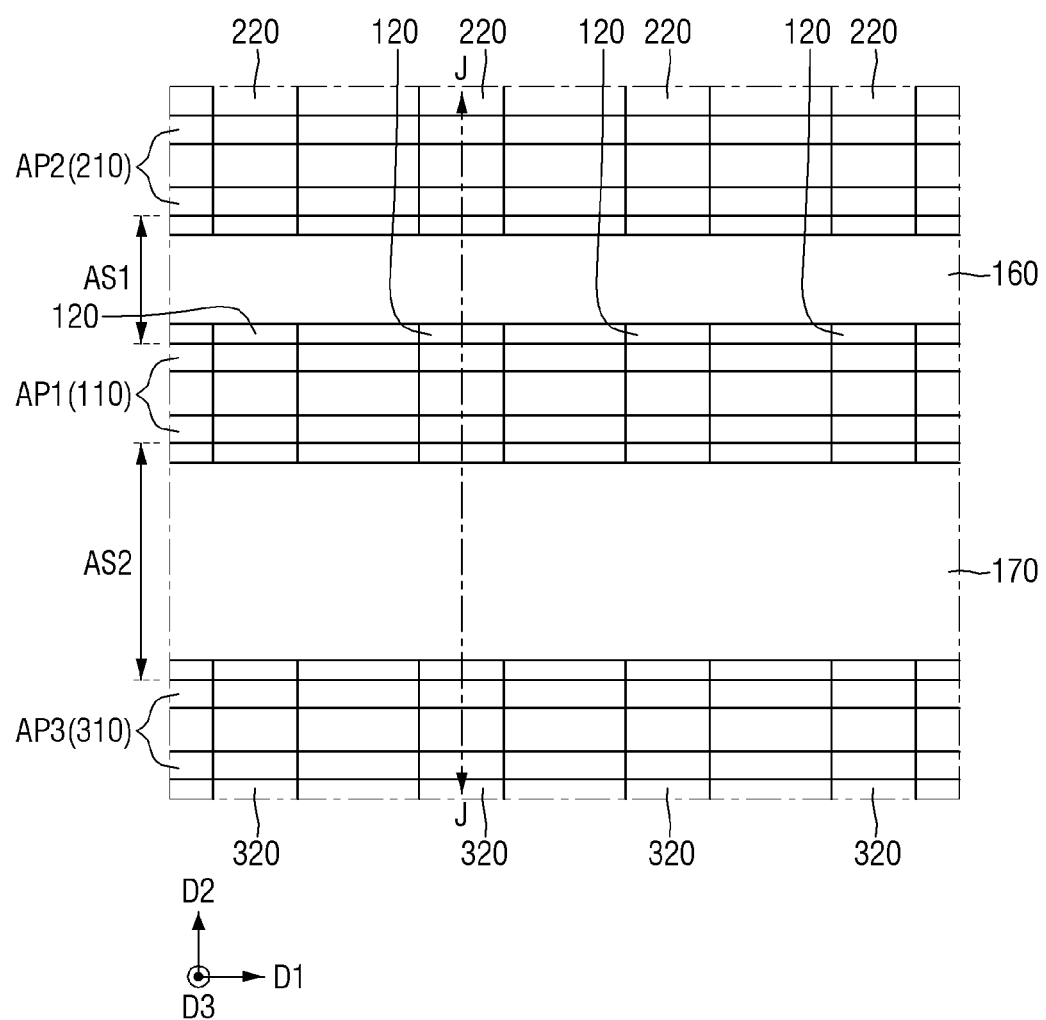
FIG. 14 is a layout view illustrating a semiconductor device according to embodiments.
Figure 15:
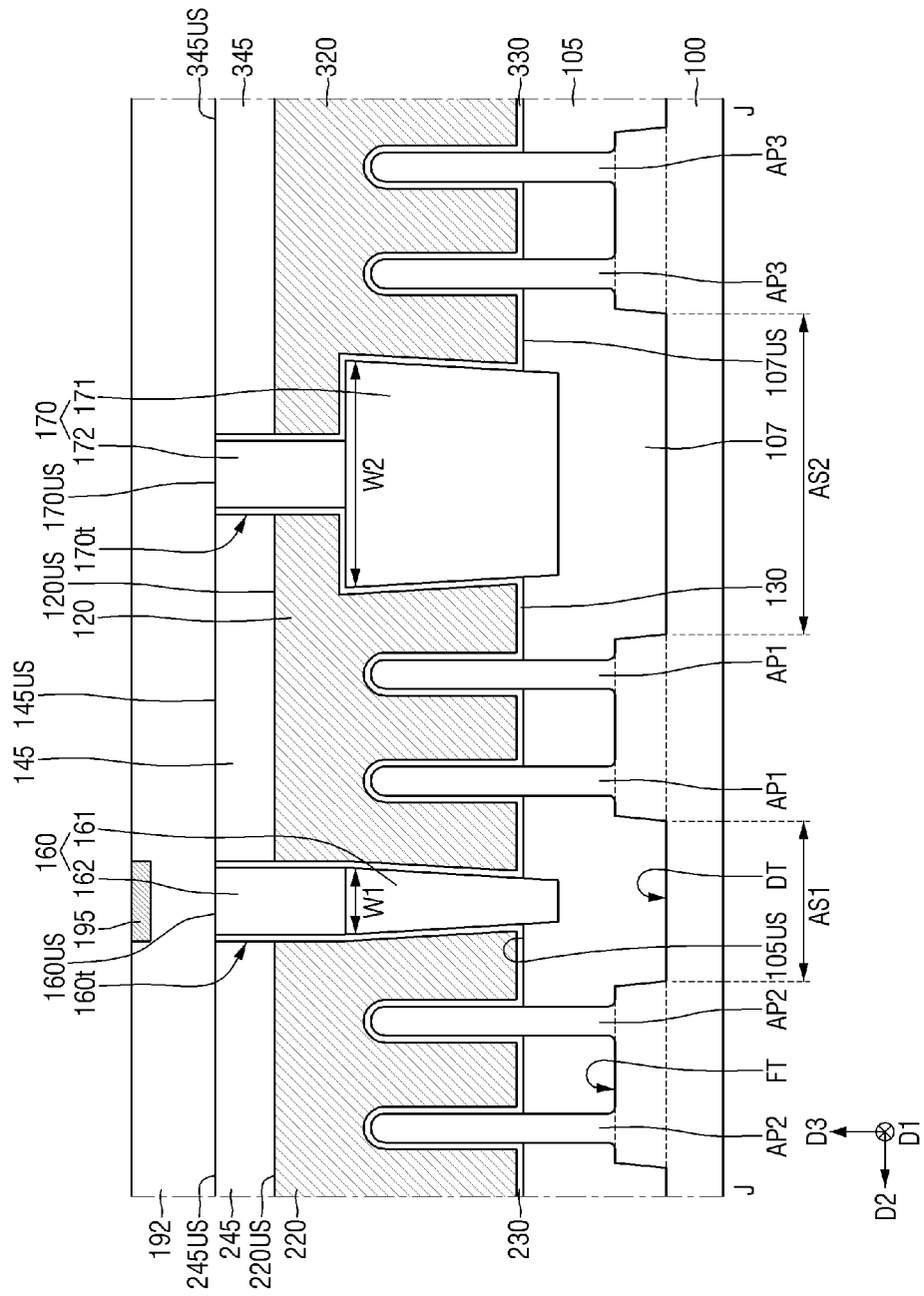
FIG. 15 is a cross-sectional view taken along line J-J of FIG. 14, according to an embodiment.

FIG. 14 is a layout view illustrating a semiconductor device according to embodiments. FIG. 15 is a cross-sectional view taken along line J-J of FIG. 14. For convenience of description, the following description will be based on a difference from the description of FIGS. 1 to 6.

Referring to FIGS. 14 and 15, in the semiconductor device according to embodiments, the first to third active patterns AP1, AP2 and AP3 may be fin-shaped patterns, respectively.

Each of the first to third active patterns AP1, AP2 and AP3 may be defined by a fin trench FT.

The first gate electrode 120 may be disposed on sidewalls of the first active patterns AP1 protruded above the upper surfaces 105US and 107US of the first and second field insulating layers. The second gate electrode 220 may be disposed on sidewalls of the second active patterns AP2 protruded above the upper surface 105US of the first field insulating layer. The third gate electrode 320 may be disposed on sidewalls of the third active pattern AP3 protruded above the upper surface 107US of the second field insulating layer.

The first gate insulating layer 130 may be formed along a profile of the first active patterns AP1 protruded above the upper surfaces 105US and 107US of the first and second field insulating layers. The second gate insulating layer 230 may be formed along a profile of the second active patterns AP2 protruded above the upper surface 105US of the first field insulating layer. The third gate insulating layer 330 may be formed along a profile of the third active patterns AP3 protruded above the upper surface 107US of the second field insulating layer.

In FIG. 15, each of the first to third active patterns AP1, AP2 and AP3 may be disposed in an active region defined by a deep trench DT. The first gate isolation structure 160 may be disposed on the first field insulating layer 105 that fills the deep trench DT. The first gate isolation structure 170 may be disposed on the second field insulating layer 107 that fills the deep trench DT.

FIGS. 16 to 29 are views illustrating intermediate steps to describe a method of manufacturing a semiconductor device, according to embodiments. The first and second gate isolation structures 160 and 170 described with reference to FIGS. 1 to 6 may be manufactured by the steps of FIGS. 16 to 29.

Figure 16:
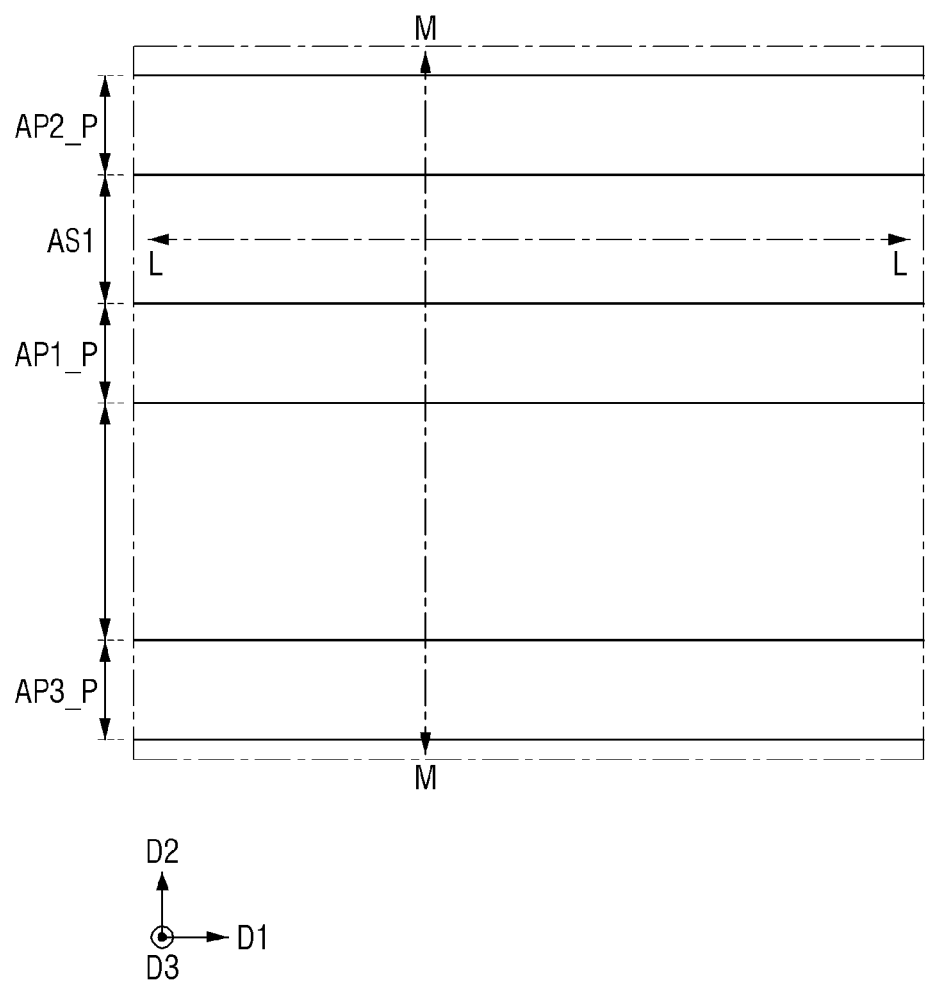
FIGS. 16 to 29 are views illustrating intermediate steps to describe a method of manufacturing a semiconductor device, according to embodiments.

FIGS. 17 to 27 and FIGS. 29 and 30 are cross-sectional views taken along M-M of FIG. 16, respectively. FIG. 28 is a cross-sectional view taken along line L-L of FIG. 16. In the following description of the manufacturing method, portions duplicated with those described with reference to FIGS. 1 to 6 will be described simply or omitted.

Figure 17:
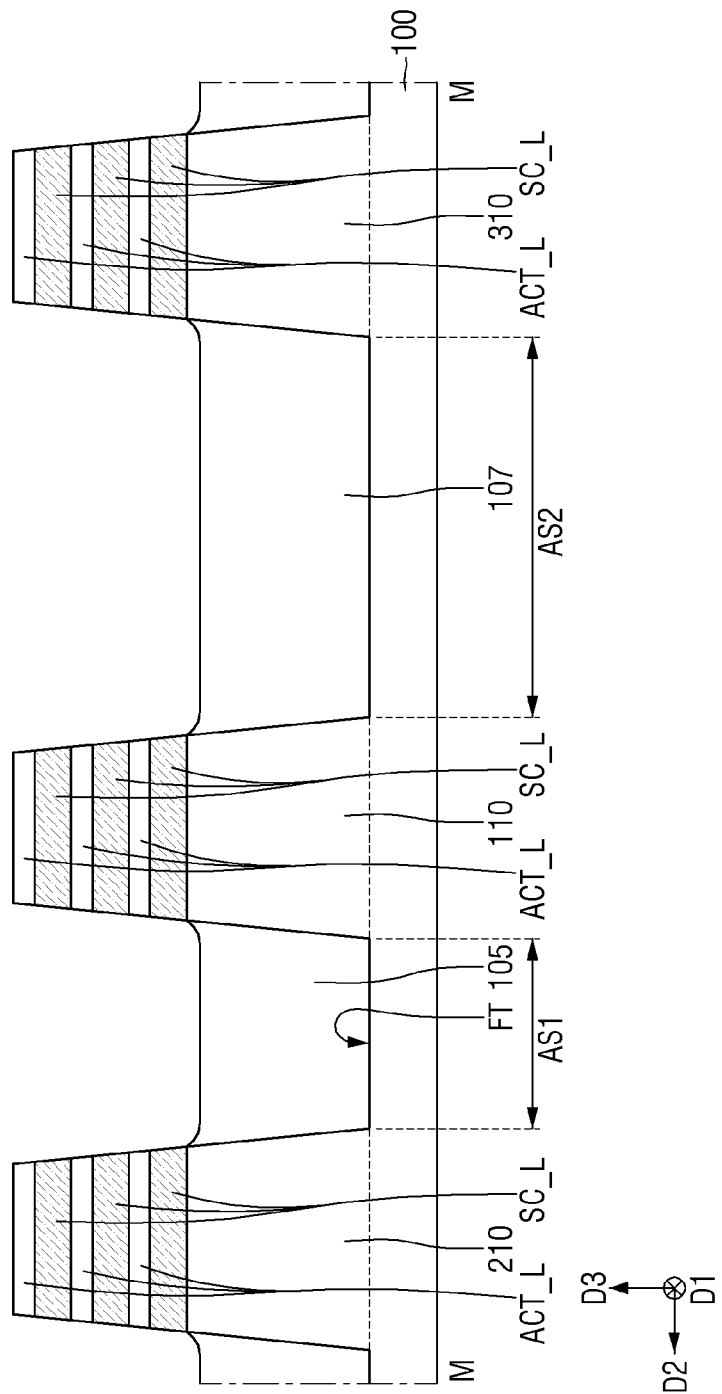

Referring to FIGS. 16 and 17, first to third preliminary active pattern structures AP1_p to AP3_p extended long in the first direction D1, and first and second field insulating layers 105 and 107 disposed among the first to third preliminary active pattern structures AP1_p to AP3_p may be formed.

The first and second preliminary active pattern structures AP1_p and AP2_p may be spaced apart from each other in the second direction D2 by the first interval AS1. The first field insulating layer 105 may be disposed between the first and second preliminary active pattern structures AP1_p and AP2_p.

The first and third preliminary active pattern structures AP1_p and AP3_p may be spaced apart from each other in the second direction D2 by the second interval AS2, and the first preliminary active pattern structure AP1_p is disposed between the second and third preliminary active pattern structures AP2_p and AP3_p. The second field insulating layer 107 may be disposed between the first and third preliminary active pattern structures AP1_p and AP3_p.

The first preliminary active pattern structure AP1_p may include a first lower pattern 110, and sacrificial patterns SC_L and active patterns ACT_L, which are alternately deposited on the first lower pattern 110.

The second preliminary active pattern structure AP2_p may include a second lower pattern 210, and sacrificial patterns SC_L and active patterns ACT_L, which are alternately deposited on the second lower pattern 210.

The third preliminary active pattern structure AP3p may include a third lower pattern 230, and sacrificial patterns SC_L and active patterns ACT_L, which are alternately deposited on the third lower pattern 310.

For example, the sacrificial pattern SC_L may include a silicon-germanium layer. The active pattern ACT_L may include a silicon layer.

Figure 18:
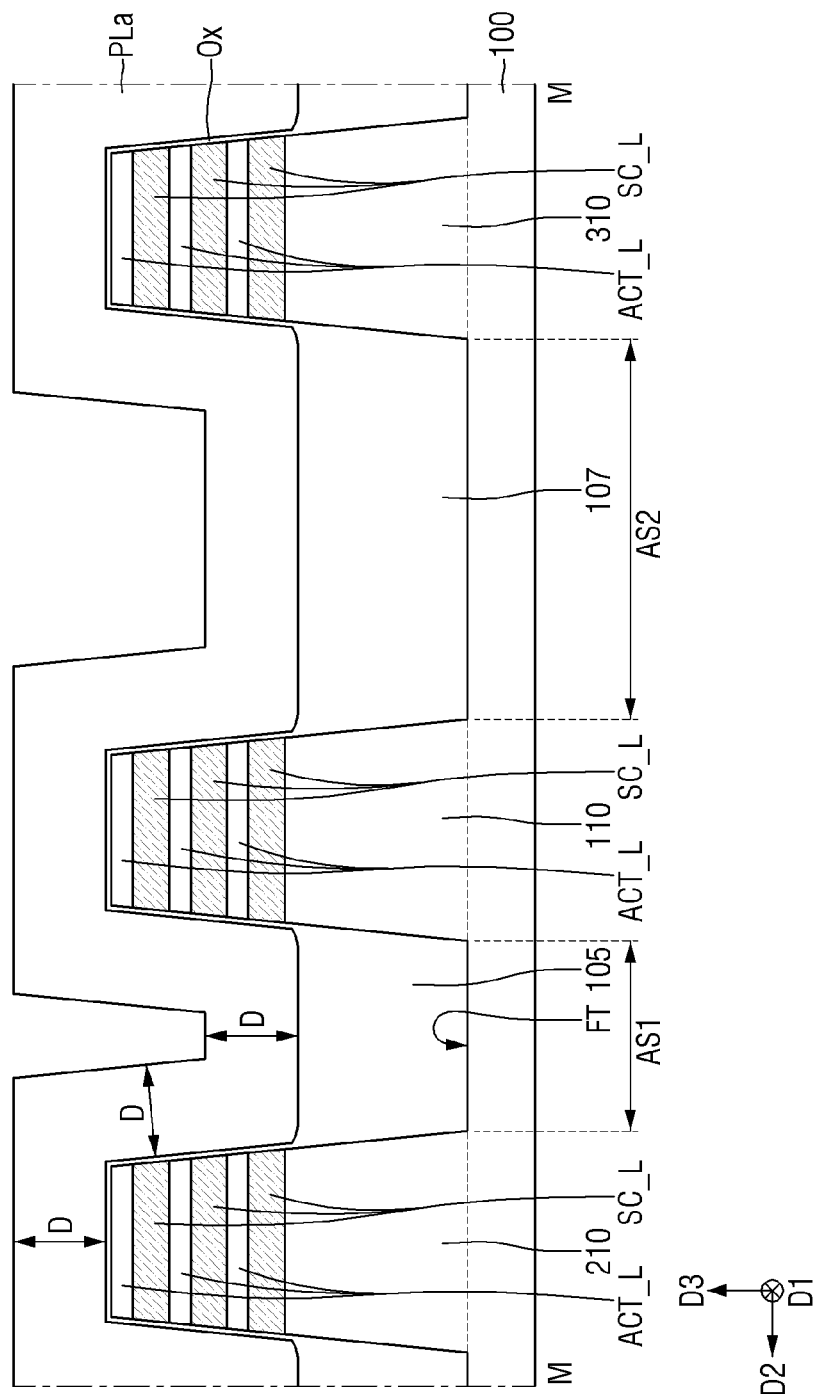

Referring to FIG. 18, a pre-insulating layer Ox and a dummy conductive material layer PLa, which are extended along the profiles of the first and third preliminary active pattern structures AP1_p and AP3_p and the first and second field insulating layers 105 and 107, are sequentially formed.

The pre-insulating layer Ox may include, for example, an oxide layer, a nitride layer, an oxynitride layer, or their combination layer, and may include the same material as that of the first and second field insulating layers 105 and 107.

The dummy conductive material layer PLa includes, but is not limited to, polysilicon. The dummy conductive material layer PLa may be formed with a uniform thickness D by an atomic layer deposition (ALD) method, but is not limited thereto.

Figure 19:
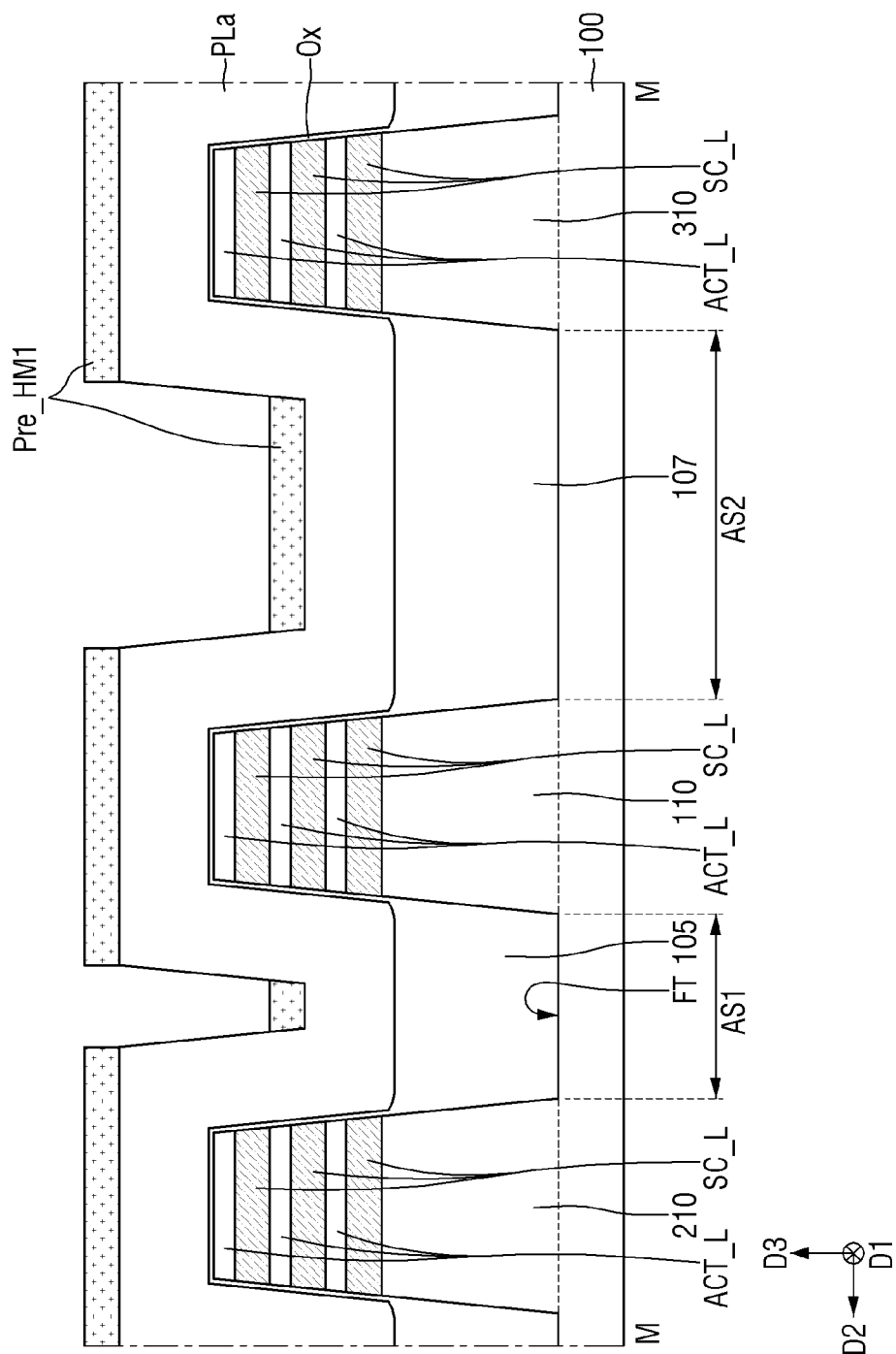

Referring to FIG. 19, a first pre-mask pattern Pre_HM1 is formed on the dummy conductive material layer PLa, but is not disposed on sidewalls of the first to third preliminary active pattern structures AP1_p to AP3_p.

That is, the first pre-mask pattern Pre_HM1 is formed on the upper surface of the dummy conductive material layer PLa and on the first and second field insulating layers 105 and 107.

The first pre-mask pattern Pre_HM1 may include a silicon nitride or a silicon oxide. The first pre-mask pattern Pre_HM1 is formed through a high-density plasma chemical vapor deposition (HDP-CVD) method.

The high-density plasma chemical vapor deposition (HDP-CVD) method may be performed using $SiH_4$, $O_2$, $N_2O$, $NH_3$ and $N_2$ gases or mixtures of the gases, and may be performed within the range of 200° C. to 700° C.

The high-density plasma chemical vapor deposition (HDP-CVD) method may include repeatedly performing deposition and etching processes, whereby the first pre-mask pattern Pre_HM1 may be formed so as not to be disposed on the sidewalls of the first to third preliminary active pattern structures AP1_p to AP3_p.

Figure 20:
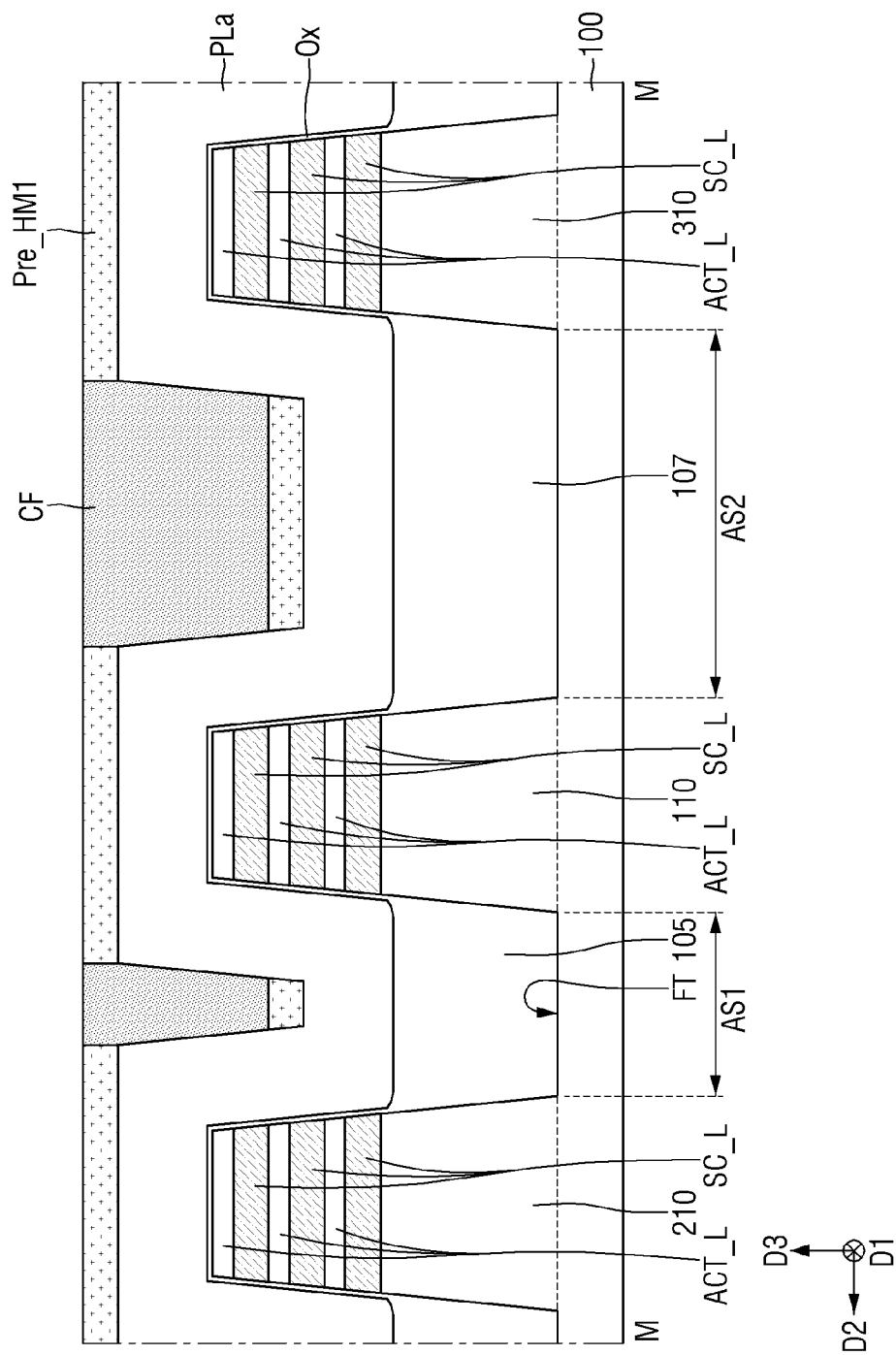

Referring to FIG. 20, a coating film layer CF disposed on the dummy conductive material layer PLa disposed on the sidewalls of the first to third preliminary active pattern structures AP1_p to AP3_p may be formed, and a planarization process may be performed for the first pre-mask pattern Pre_HM1 as a reference for etch stop.

Therefore, the coating film layer CF may be disposed between the first to third preliminary active pattern structures AP1_p to AP3_p. The coating film layer CF may include a silicon nitride, a silicon oxide, or Tonen SilaZene (TOSZ), but the coating film layer CF and the first pre-mask pattern Pre_HM1 may include their respective materials different from each other.

Figure 21:
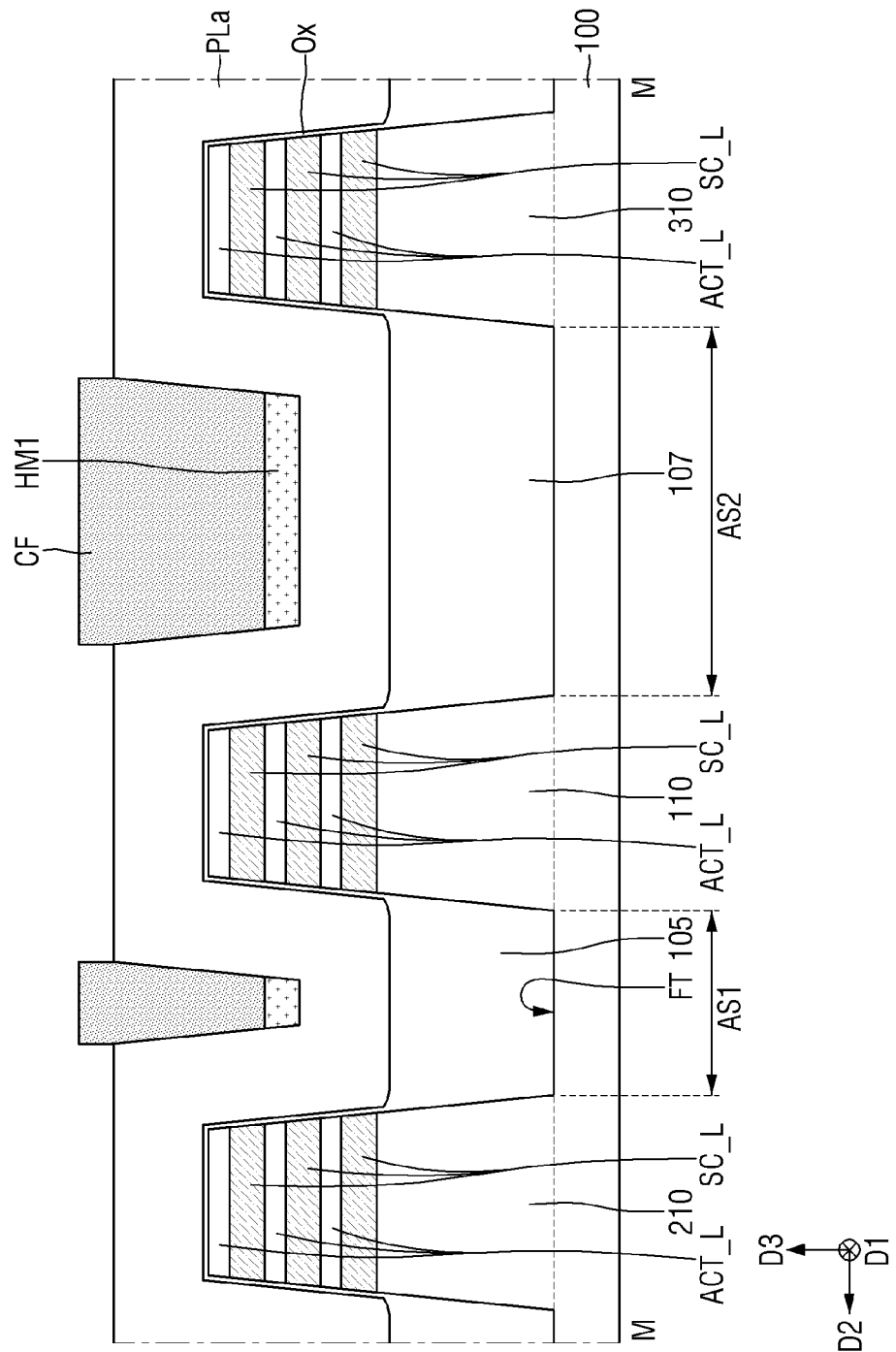

Referring to FIG. 21, the first pre-mask pattern Pre_HM1 disposed on the upper surface of the dummy conductive material layer PLa is removed to form a first mask pattern HM1 disposed on the first and second field insulating layers 105 and 107.

The operation of removing the first pre-mask pattern Pre_HM1 may be performed through a wet etching process that uses a material difference between the first pre-mask pattern Pre_HM1 and the coating film layer CF.

Figure 22:
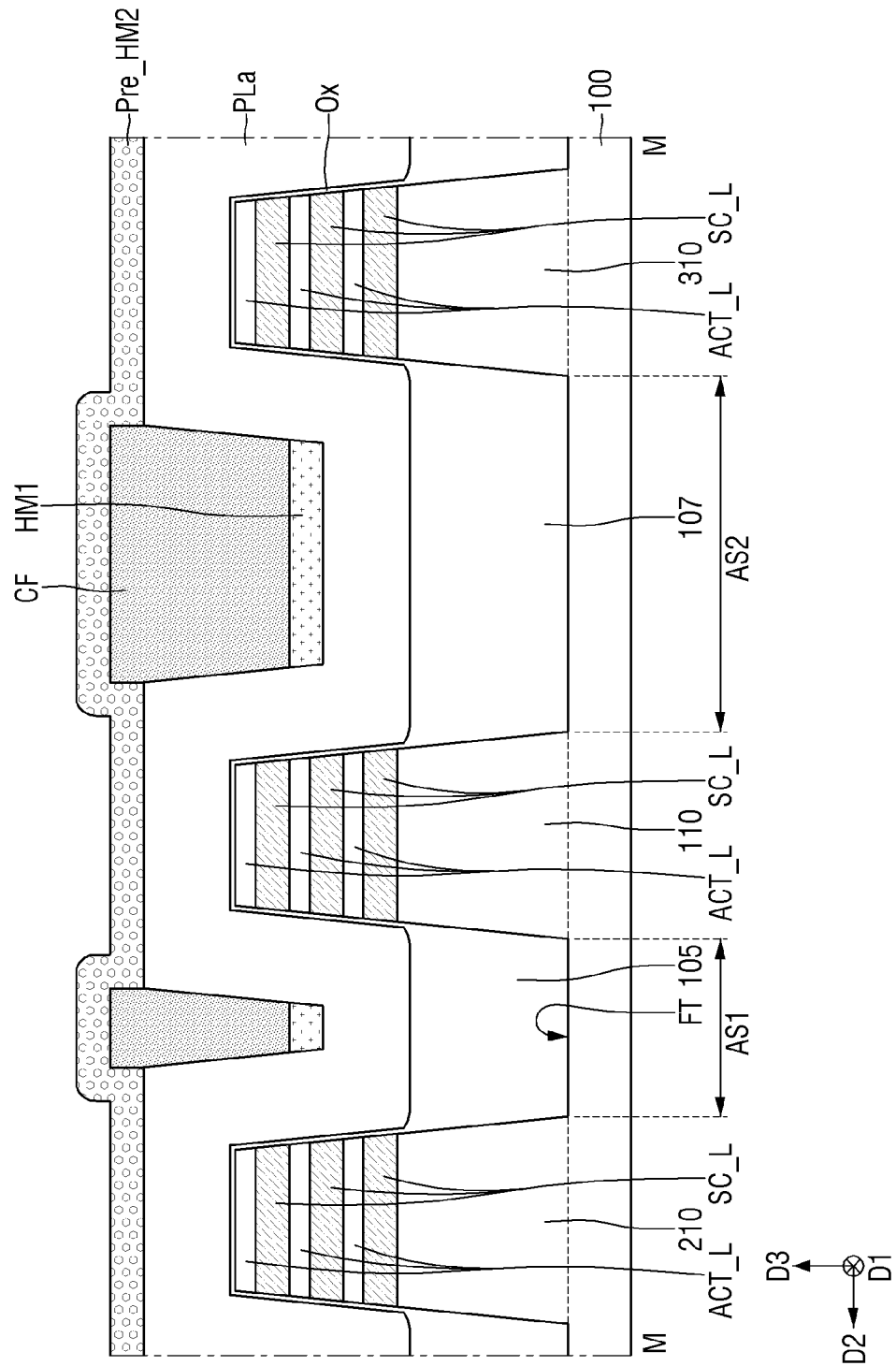

Referring to FIG. 22, a second pre-mask pattern Pre_HM2 may be formed on the dummy conductive material layer PLa and the coating film layer CF. The second pre-mask pattern Pre_HM2 may include at least one of silicon oxycarbonitride (SiOCN), silicon boron nitride (SiBN), silicon oxyboron nitride (SiOBN), silicon oxycarbide (SiOC), or their combination, and may be formed by an atomic layer deposition (ALD) method, but is not limited thereto.

Figure 23:
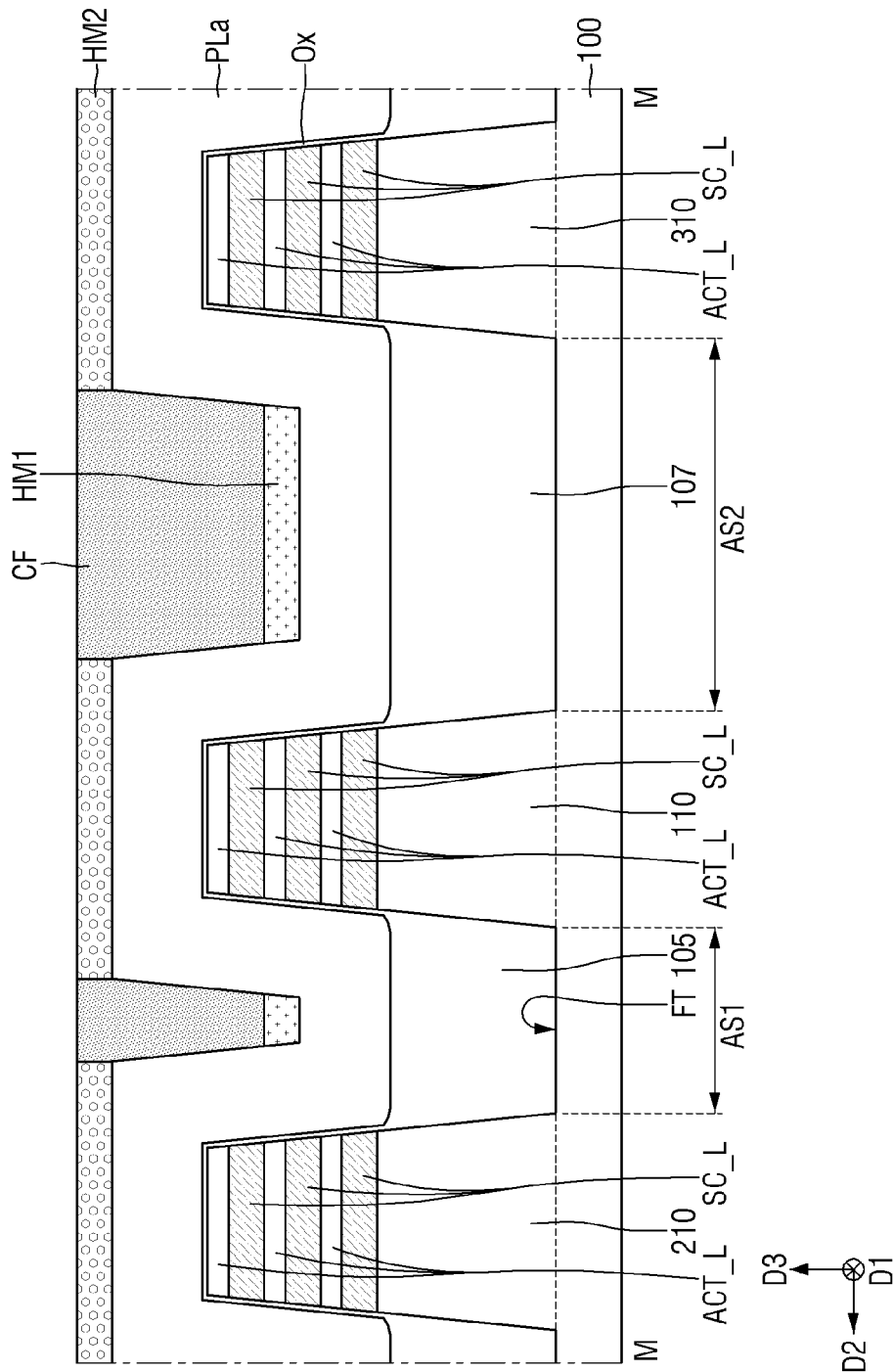

Referring to FIG. 23, a planarization process may be performed for the second pre-mask pattern Pre_HM2 to form a second mask pattern HM2 disposed on an upper surface of the dummy conductive material layer PLa, and the planarization process may be performed for the coating film layer CF as a reference for etch stop.

Considering the intermediate step of FIGS. 20 to 23 as a whole, the intermediate step of FIGS. 20 to 23 is the step of substituting the first pre-mask pattern Pre_HM1 with the second mask pattern HM2.

Figure 24:
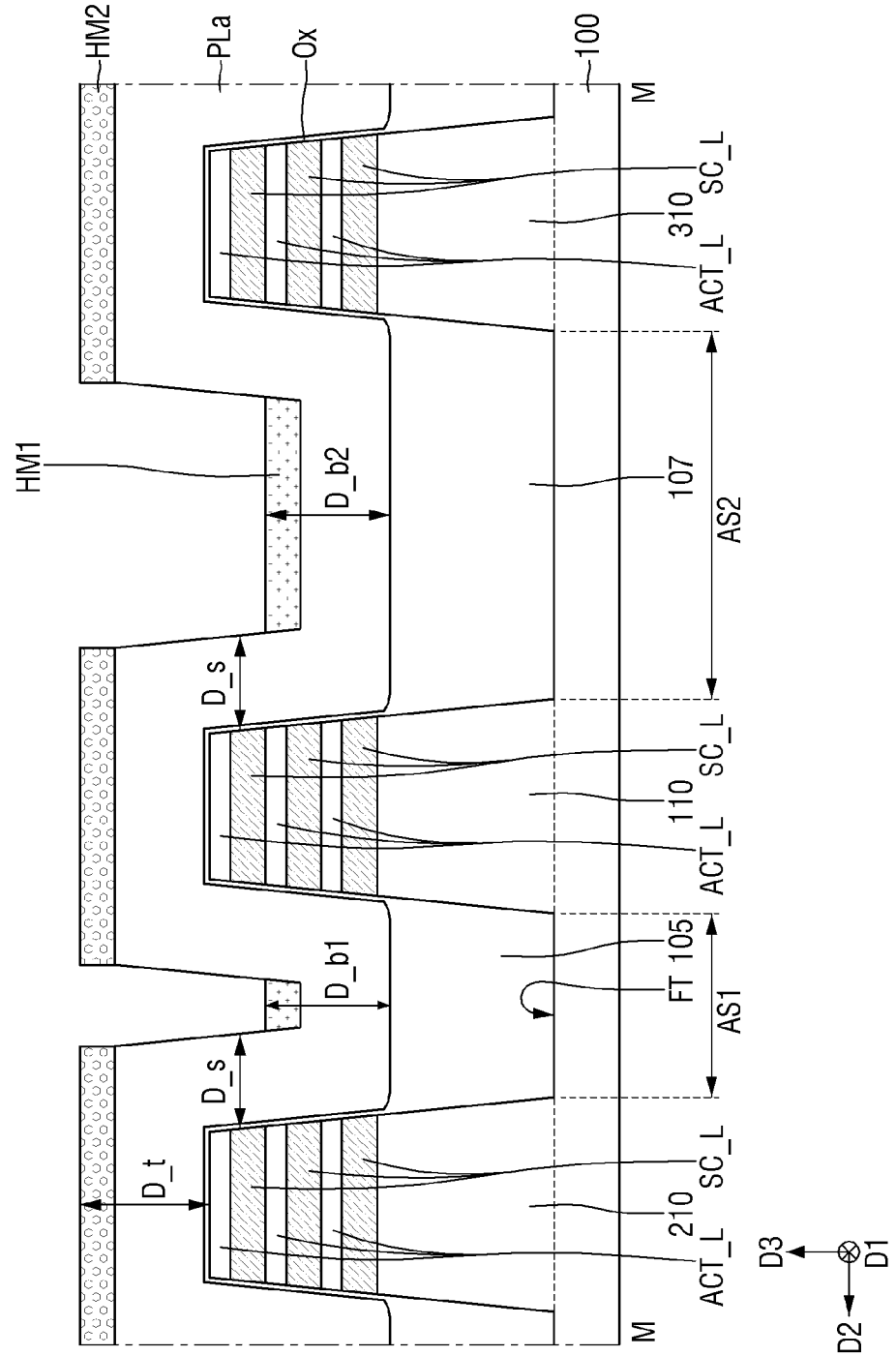

Referring to FIG. 24, the coating film layer CF may be removed to expose the first mask pattern HM1 disposed on the first and second field insulating layers 105 and 107.

The operation of removing the coating film layer CF may be performed through a wet etching process that uses a material difference between the first and second mask patterns HM1 and HM2 and the coating film layer CF.

Through the arrangement of the first and second mask patterns HM1 and HM2 and the dummy conductive material layer PLa, a first deposition thickness D_s for the dummy conductive material layer PLa deposited on the sidewalls of the first to third preliminary active pattern structures AP1_p to AP3_p and the first and second mask patterns HM1 and HM2 is smaller than second deposition thicknesses D_b1 and D_b2 for the dummy conductive layer PLa disposed on the first and second field insulating layers 105 and 107 and the first and second mask patterns HM1 and HM2. In addition, the thicknesses of the dummy conductive material layers PLa, which are disposed on the sidewalls of the first to third preliminary active pattern structures AP1_p to AP3_p may be equal to one another.

Figure 25:
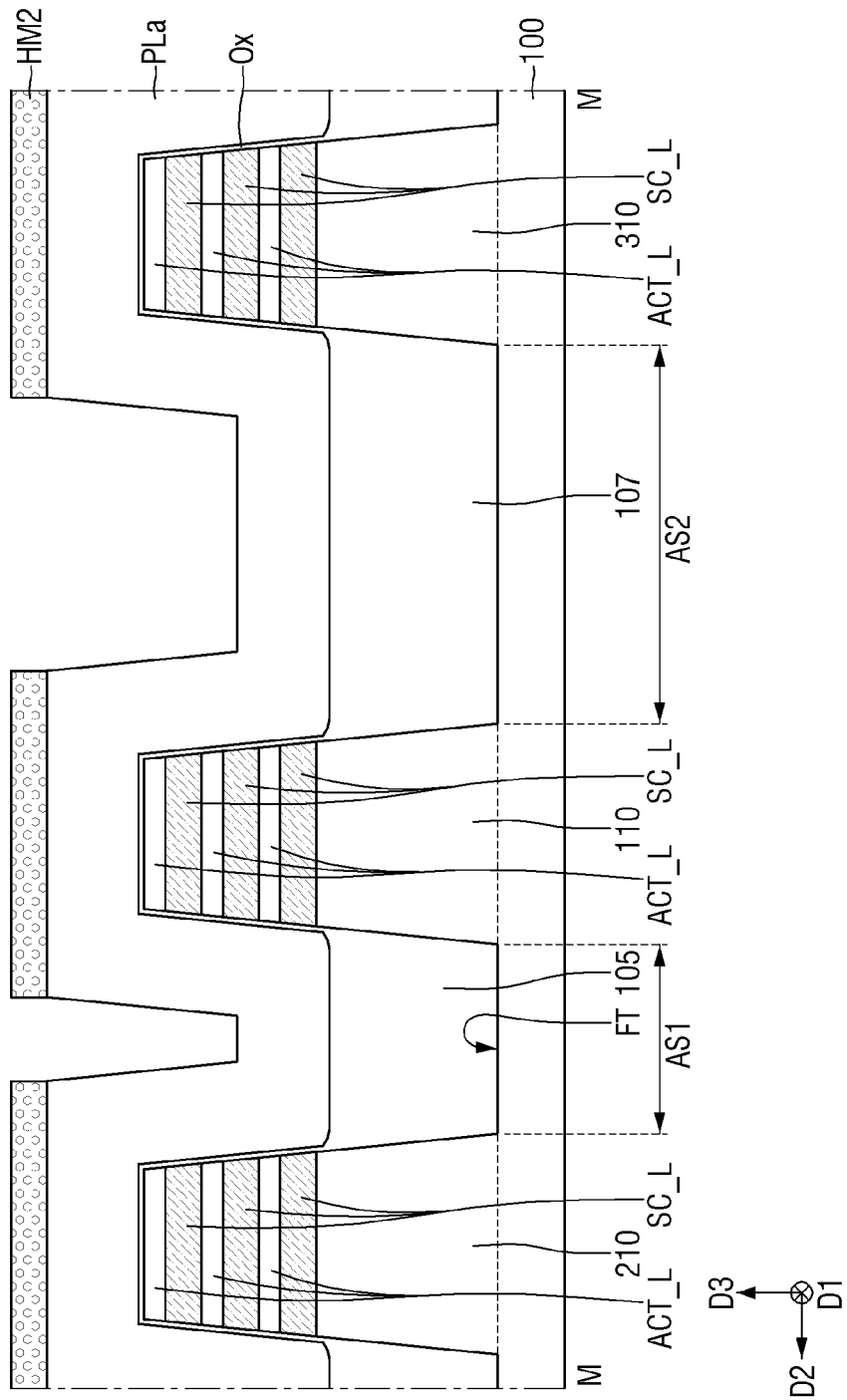

Referring to FIG. 25, an operation of removing the first mask pattern HM1 may be performed. The operation of removing the first mask pattern HM1 may be performed through a dry or wet etching process that uses a material difference between the first and second mask patterns HM1 and HM2.

Figure 26:
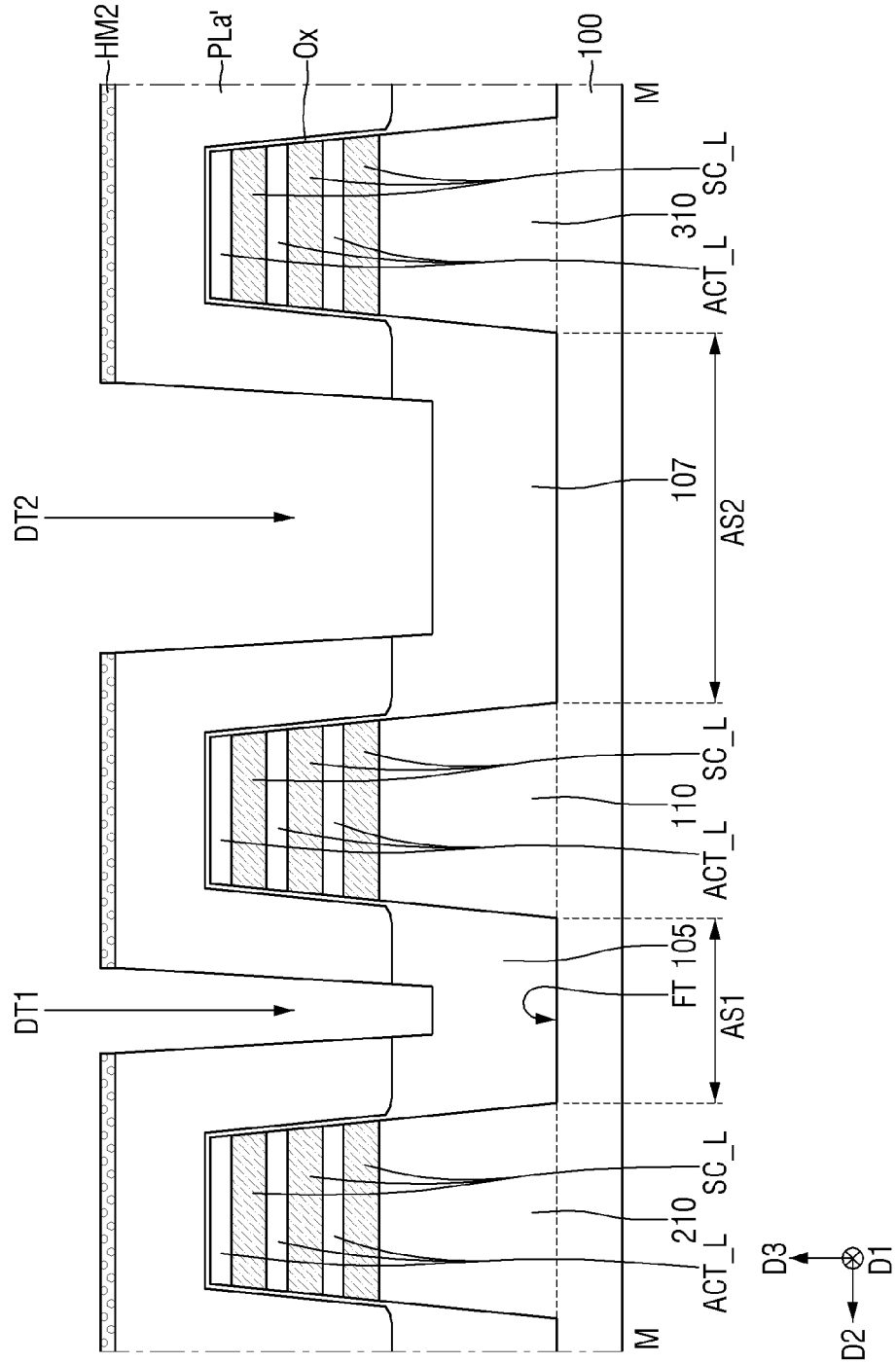
Figure 27:
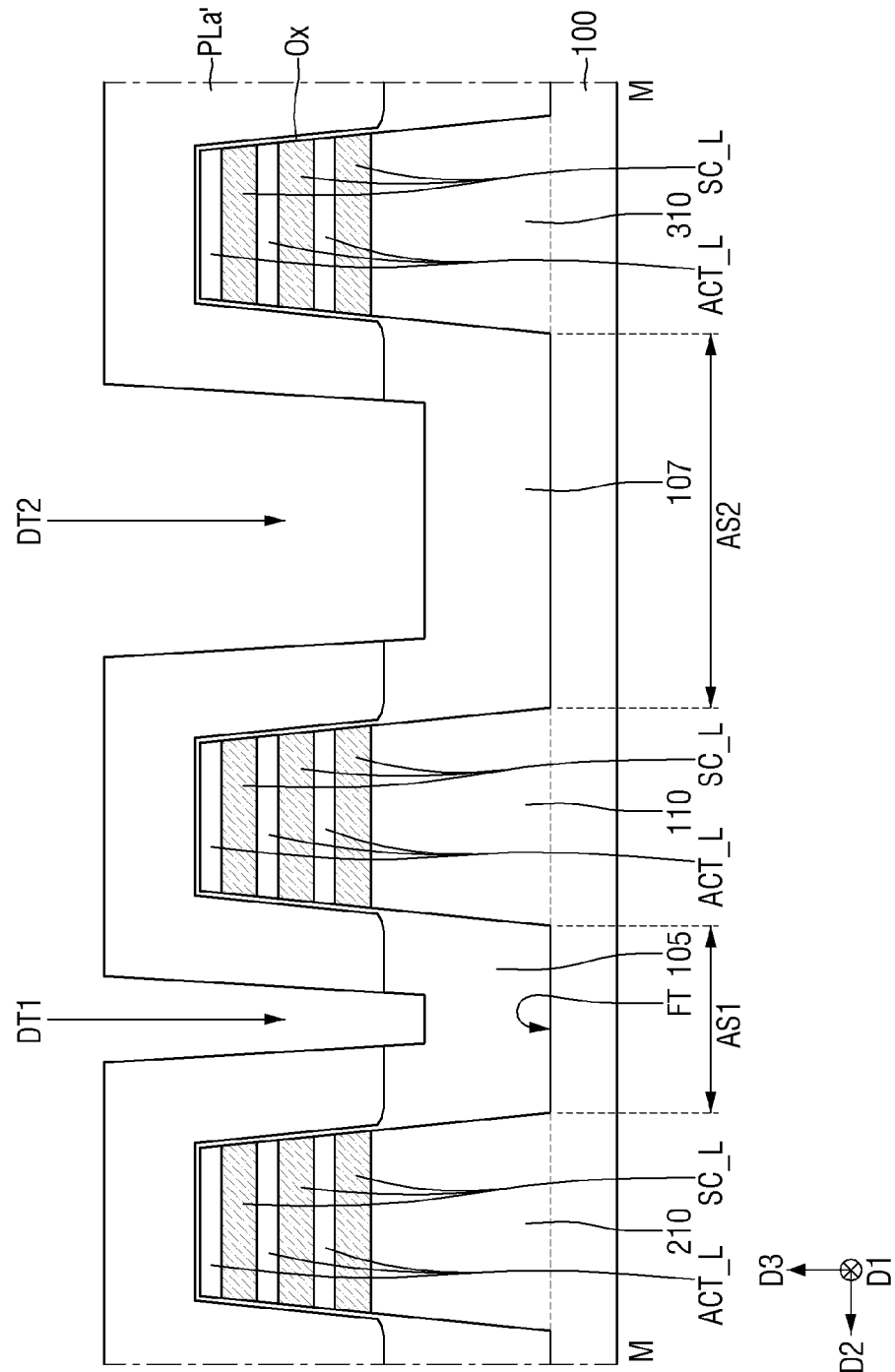
Figure 28:
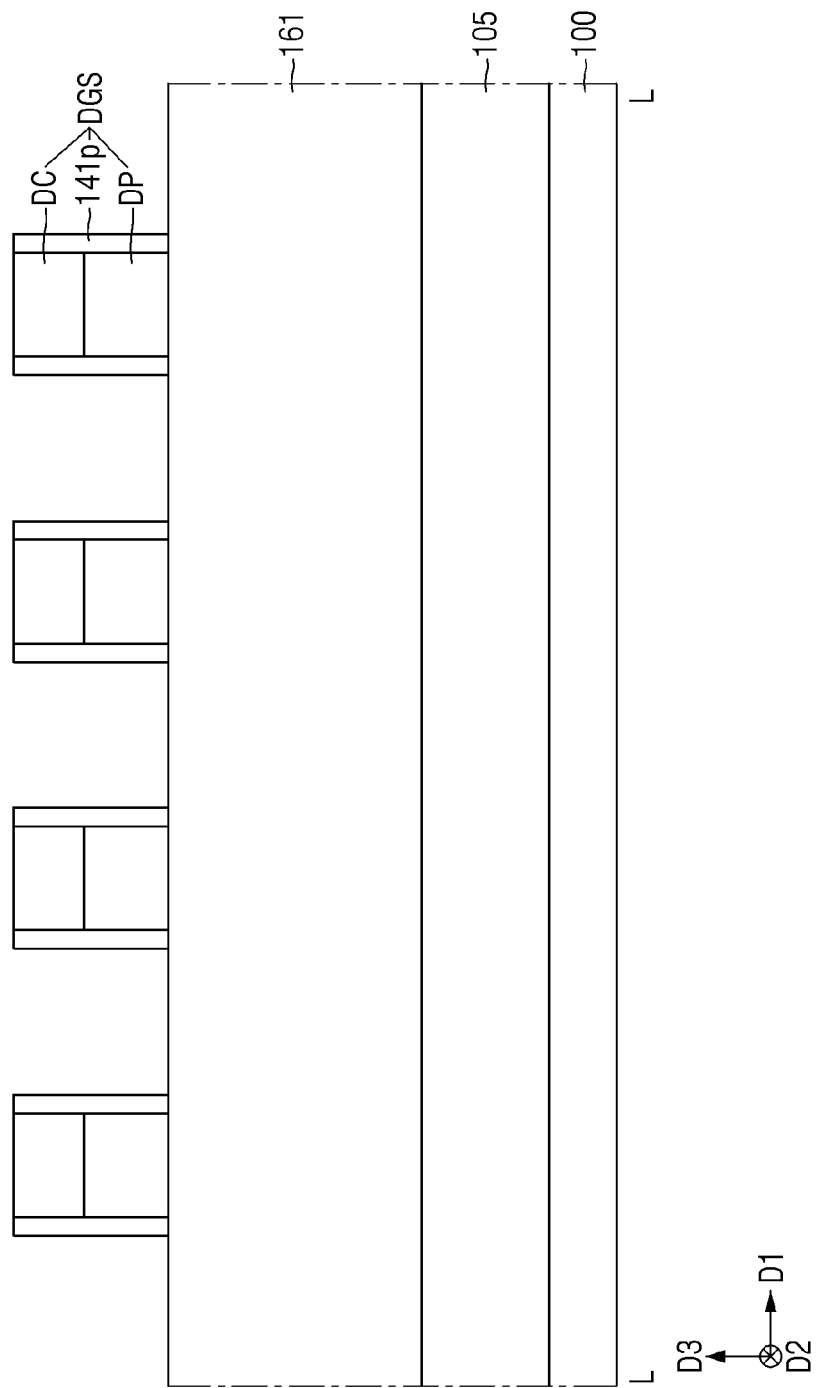

Referring to FIGS. 26 and 27, the dummy conductive material layer PLa and a portion of a center of each of the first and second field insulating layers 105 and 107 may be etched using the second mask pattern HM2 to form first and second dam trenches DT1 and DT2.

The partial removal of the dummy conductive material layer PLa and the first and second field insulating layers 105 and 107 may be performed through a dry etching process toward the third direction D3. The dry etching process removes the portion of the center of each of the first and second field insulating layers 105 and 107 by using the fact that etch selectivity of the second mask pattern HM2 is different from that of the dummy conductive material layer PLa and that of the first and second field insulating layers 105 and 107, wherein the second mask pattern HM2, the dummy conductive material layer PLa, and the first and second field insulating layers 105 and 107 may include their respective materials different from one another.

Widths of the first and second dam trenches DT1 and DT2 in the second direction D2 may be narrowed in a downward direction toward the substrate 100.

Figure 29:
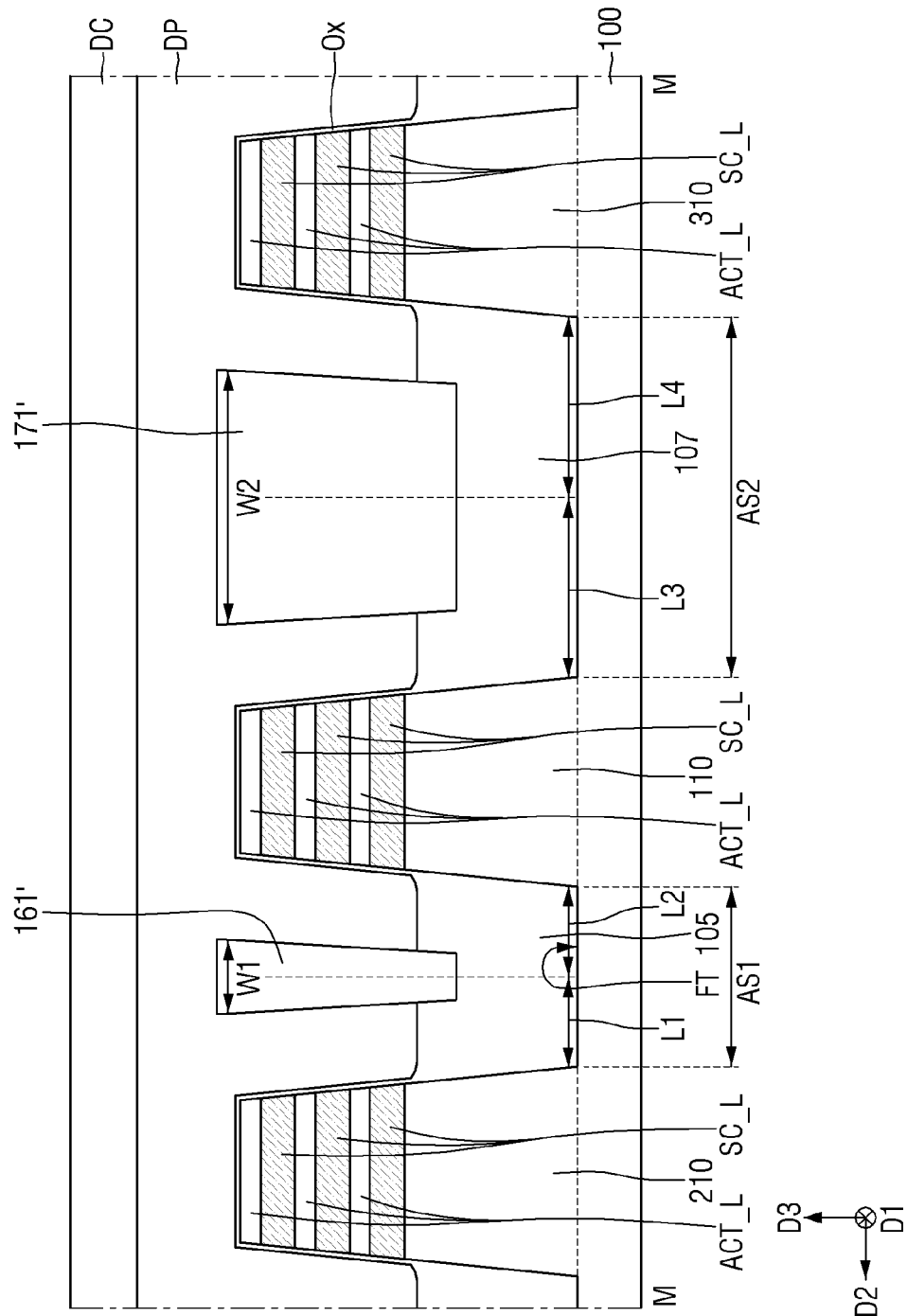

Referring to FIGS. 28 and 29, first and second pre-dam structures 161' and 171' may be formed in the first and second dam trenches DT1 and DT2, respectively, and a dummy gate structure DGS may be formed on the first and second pre-dam structures 161' and 171' and a dummy conductive material layer PLa'.

The first and second pre-dam structures 161' and 171' may include the same material as that of each of the first dam structure 161 and the second dam structure 171 in FIGS. 1 to 6. The first dam structure 161 and the second dam structure 171 may be formed based on the first pre-dam structure 161' and the second pre-dam structure 171'.

The dummy gate structure DGS may include a dummy electrode DP, a dummy capping pattern DC, and a pre-spacer 141p.

The dummy electrode DP may be formed on the dummy conductive material layer PLa' and the first and second pre-dam structures 161' and 171', and the dummy electrode DP may include the same material as that of the dummy conductive material layer PLa'.

The dummy capping pattern DC may serve as a mask pattern, and may include, for example, silicon nitride, but is not limited thereto.

The pre-spacer 141p may be disposed on sidewalls of the dummy electrode DP and the dummy capping pattern DC, and may include at least one of, for example, silicon nitride (SiN), silicon oxynitride (SiON), silicon oxide (SiO$_2$), silicon oxycarbonitride (SiOCN), silicon boron nitride (SiBN), silicon oxyboron nitride (SiOBN), silicon oxycarbide (SiOC), or their combination.

In addition, a vertical central line of each of the first pre-dam structure 161' and the second pre-dam structure 171' may correspond to the center of each fin trench FT. That is, a distance L1 between the first pre-dam structure 161' and the first lower pattern 110 and a distance L2 between the first pre-dam structure 161' and the second lower pattern 210 may be equal to each other. Also, a distance L3 between the second pre-dam structure 171' and the first lower pattern 110 and a distance L4 between the second pre-dam structure 171' and the third lower pattern 310 may be equal to each other.

The first and second dam trenches DT1 and DT2 may be disposed between the first preliminary active pattern structure AP1_p and the second preliminary active pattern structure AP2_p and between the center of the first preliminary active pattern structure AP1_p and the third preliminary active pattern structure AP3_p in a self-aligned manner through the arrangement and etching of the first and second mask patterns HM1 and HM2 and the dummy conductive material layer PLa.

Figure 30:
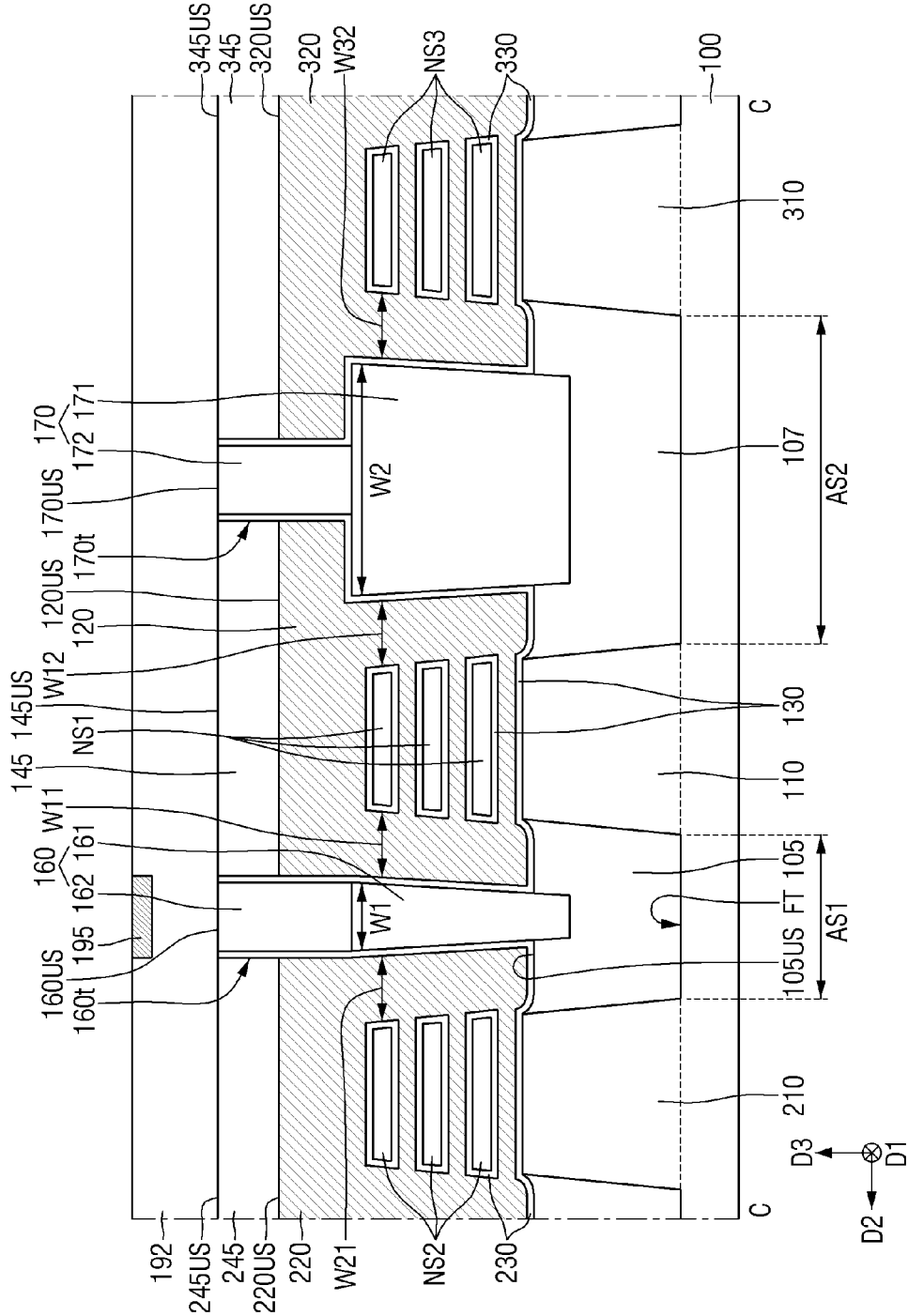
FIGS. 30 to 38 are views illustrating intermediate steps to describe a method of manufacturing a semiconductor device, according to embodiments.

Referring to FIG. 30, the sacrificial patterns SC_L may be removed, and first sheet patterns NS1 spaced apart from one another above the first lower pattern 110 in the third direction D3 may be formed, second sheet patterns NS2 spaced apart from one another above the second lower pattern 210 in the third direction D3 may be formed, and third sheet patterns NS3 spaced apart from one another above the third lower pattern 310 in the third direction D3 may be formed, whereby the first to third active patterns AP1 to AP3 of FIGS. 1 to 6 may be formed.

The first pre-dam structure 161' and the second pre-dam structure 171' may form the first and second gate isolation structures 160 and 170 of FIGS. 1 to 6.

The first to third gate structures may be formed, which include the first to third gate electrodes 120 to 320 of FIGS. 1 to 6 formed based on the first and second gate isolation structures 160 and 170 and the first to third active patterns AP1 to AP3.

In the present disclosure, the lower structure of the gate isolation structure may be formed in a self-aligned manner through the arrangement of the mask patterns HM1 and HM2 and the dummy conductive material layer PLa with respect to the active pattern adjacent to the active patterns having different intervals, whereby isolation operation efficiency of the gate electrodes may be improved. Also, the width of the gate electrode disposed between the active pattern and the gate isolation structure may be uniformly maintained, whereby operational reliability of the semiconductor device is improved.

FIGS. 31 to 38 are views illustrating intermediate steps to describe a method of manufacturing a semiconductor device, according to embodiments. The first and second gate isolation structures 160 and 170 described with reference to FIGS. 1 to 6 may be manufactured by the steps of FIGS. 31 to 38.

For convenience of description, the following description will be based on a difference from FIGS. 17 to 26. For reference, FIGS. 31 to 38 are cross-sectional views taken along M-M of FIG. 16. In the following description of the manufacturing method, portions duplicated with those described with reference to FIGS. 1 to 6 will be described simply or omitted.

Figure 31:
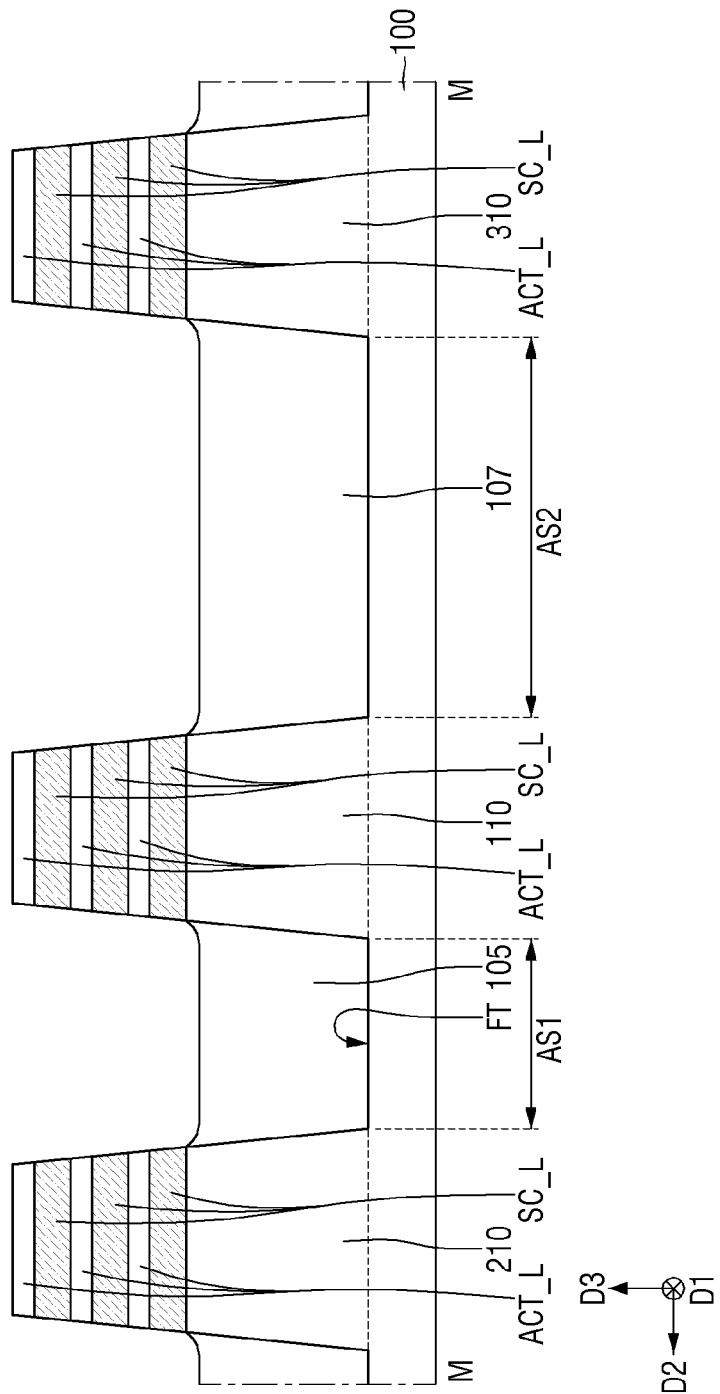
Figure 32:
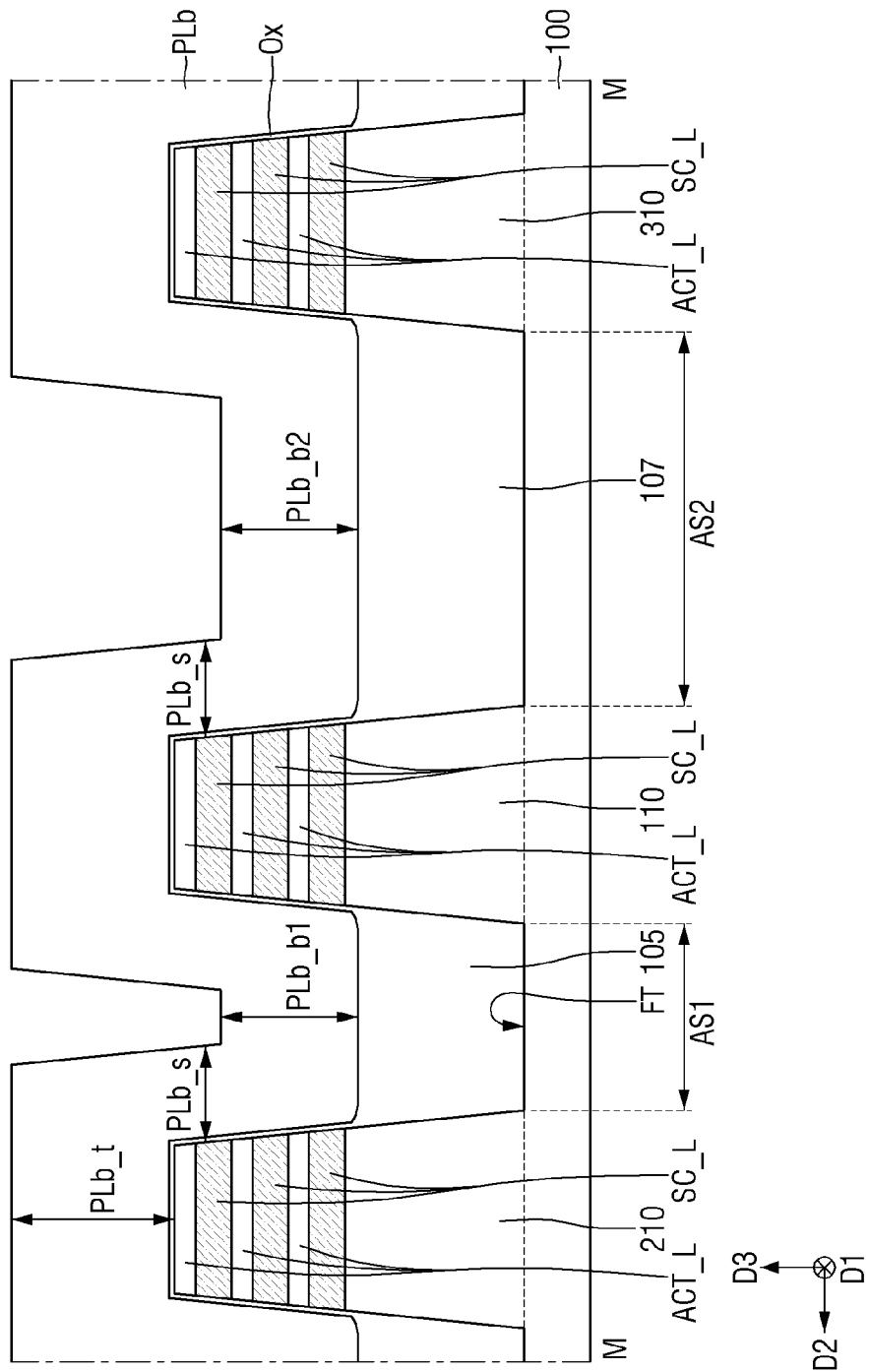

Referring to FIGS. 16, 31 and 32, first to third preliminary active pattern structures AP1_p to AP3_p extended long in the first direction D1 and first and second field insulating layers 105 and 107 disposed among the first to third preliminary active pattern structures AP1_p to AP3p may be formed.

A pre-insulating layer Ox and a dummy conductive material layer PLb, which are extended along the profiles of the first and third preliminary active pattern structures AP1_p and AP3_p and the first and second field insulating layers 105 and 107 may be sequentially formed.

The dummy conductive material layer PLb may include, but is not limited to, polysilicon. The dummy conductive material layer PLb may be formed by a chemical vapor deposition (CVD) method.

The chemical vapor deposition (CVD) method for the dummy conductive material layer PLb may be performed at a high temperature and a high pressure to reduce a mean free path of a film forming gas for the dummy conductive material layer PLb, thereby reducing mobility and degrading step coverage for the dummy conductive material layer PLb.

In accordance with the chemical vapor deposition (CVD) method, thicknesses PLb_b1 and PLb_b2 of the dummy conductive material layers PLb disposed on the first and second field insulating layers 105 and 107 may be greater than a thickness PLb_s of the dummy conductive material layer PLb disposed on the sidewalls of the first to third preliminary active pattern structures AP1_p to AP3_p. In addition, the thicknesses PLb_b1 and PLb_b2 of the dummy conductive material layers PLb disposed on the first and second field insulating layers 105 and 107 may be smaller than a thickness PLb_t of the dummy conductive material layer PLb disposed on the upper surface of the first to third preliminary active pattern structures AP1_p to AP3_p.

The thicknesses PLb_s of the dummy conductive material layers PLb disposed on the sidewalls of the first to third preliminary active pattern structures AP1_p to AP3_p may be equal to one another within the range of 5 nm to 20 nm.

The thickness PLb_t of the dummy conductive material layer PLb disposed on the upper surface of the first to third preliminary active pattern structures AP1_p to AP3_p may be greater than the thicknesses PLb_s of the dummy conductive material layers PLb disposed on the sidewalls of the first to third preliminary active pattern structures AP1_p to AP3_p, and may be within the range of 20 nm to 40 nm.

Figure 33:
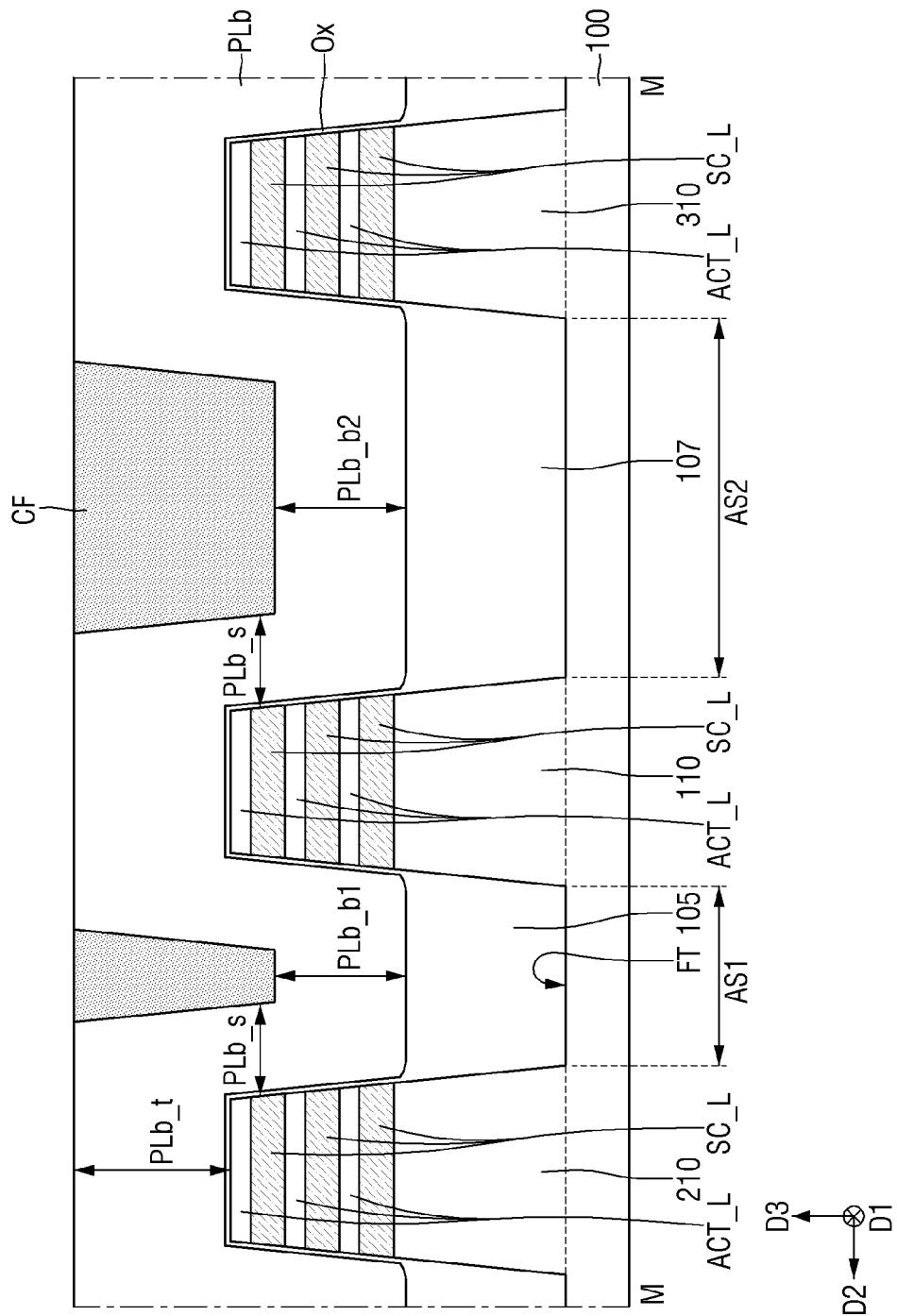

Referring to FIG. 33, a coating film layer CF disposed on the dummy conductive material layer PLb disposed on the sidewalls of the first to preliminary active pattern structures AP1_p to AP3_p may be formed, and a planarization process may be performed for the dummy conductive material layer PLb as a reference for etch stop.

Therefore, the coating film layer CF may be disposed between the first to third preliminary active pattern structures AP1_p to AP3_p. The coating film layer CF may include silicon nitride, silicon oxide, or Tonen SilaZene (TOSZ), and the coating film layer CF and the dummy conductive material layer PLb may include their respective materials different from each other.

Figure 34:
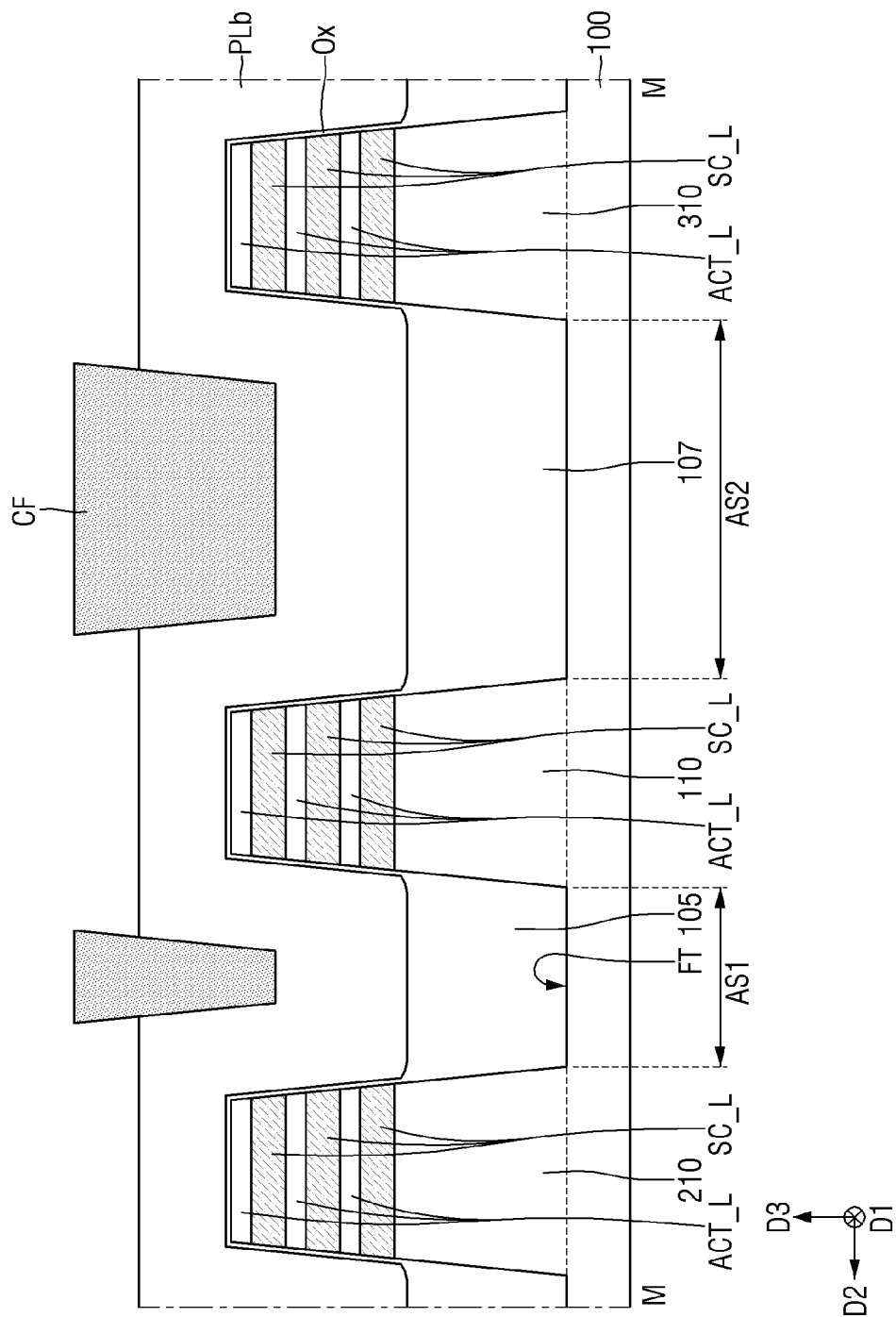

Referring to FIG. 34, at least a portion of the dummy conductive material layer PLb partially exposed by the coating film layer CF may be removed. A portion of the coating film layer CF may be protruded in the third direction D3 in accordance with the operation of removing the dummy conductive material layer PLb.

The operation of removing the dummy conductive material layer PLb may be performed through a wet etching process that uses a material difference between the coating film layer CF and the dummy conductive material layer PLb.

Figure 35:
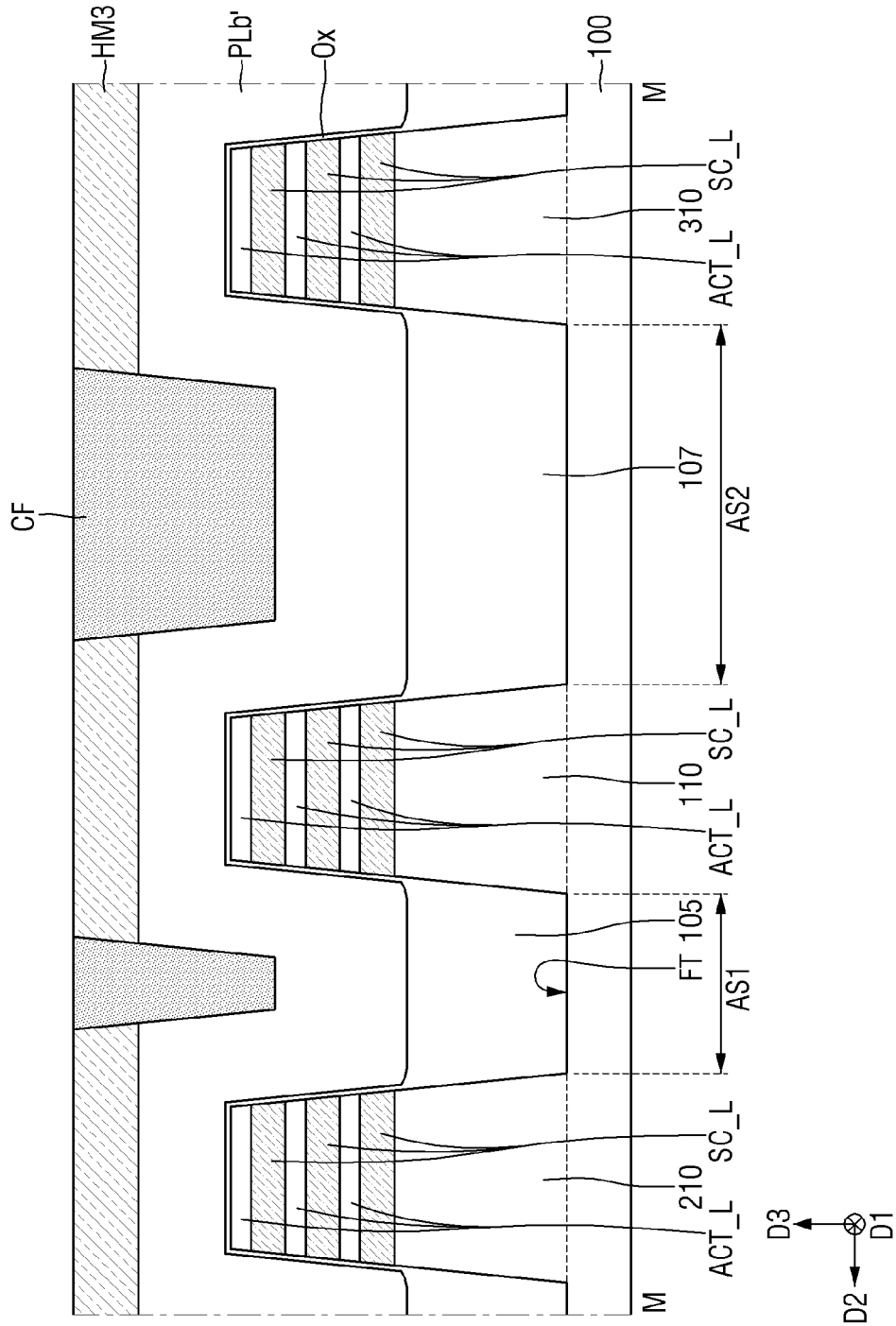

Referring to FIG. 35, a third mask pattern HM3 may be formed on the partially etched dummy conductive material layer PLb'. The formation of the third mask pattern HM3 may include a planarization process performed for the coating film layer CF as a reference for etch stop.

The third mask pattern HM3 may include at least one of silicon nitride (SiN), silicon oxynitride (SiON), silicon carbonitride (SiCN), silicon oxycarbonitride (SiOCN), a low dielectric constant material or their combination, and may have etch selectivity different from that of the dummy conductive material layer PLb'.

Figure 36:
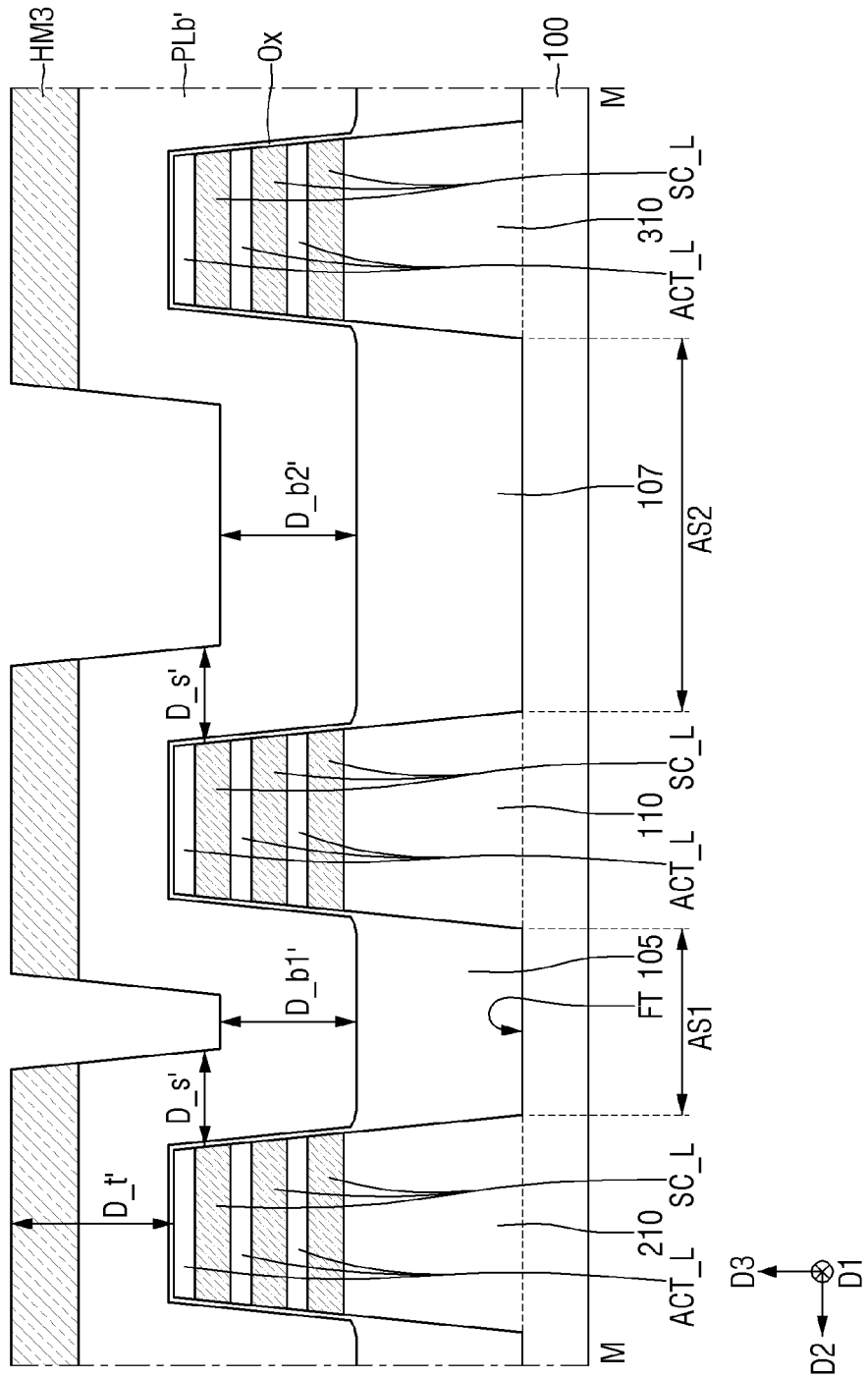

Referring to FIG. 36, the coating film layer CF may be removed to expose portions of the dummy conductive material layer PLb' disposed on the first and second field insulating layers 105 and 107.

The operation of removing the coating film layer CF may be performed through a wet etching process that uses a material difference between the third mask pattern HM3 and the coating film layer CF.

Through the arrangement of the third mask pattern HM3 and the dummy conductive material layer PLb', a first deposition thickness D_s' for the dummy conductive material layer PLb', which is disposed on the sidewalls of the first to third preliminary active pattern structures AP1_p to AP3_p, and the third mask pattern HM3 may be smaller than second deposition thicknesses D_b1' and D_b2' for the dummy conductive material layer PLb', which is disposed on the first and second field insulating layers 105 and 107, and the third mask pattern HM3. In addition, the thicknesses of the dummy conductive material layers PLb' disposed on the sidewalls of the first to third preliminary active pattern structures AP1_p to AP3_p may be equal to one another.

Figure 37:
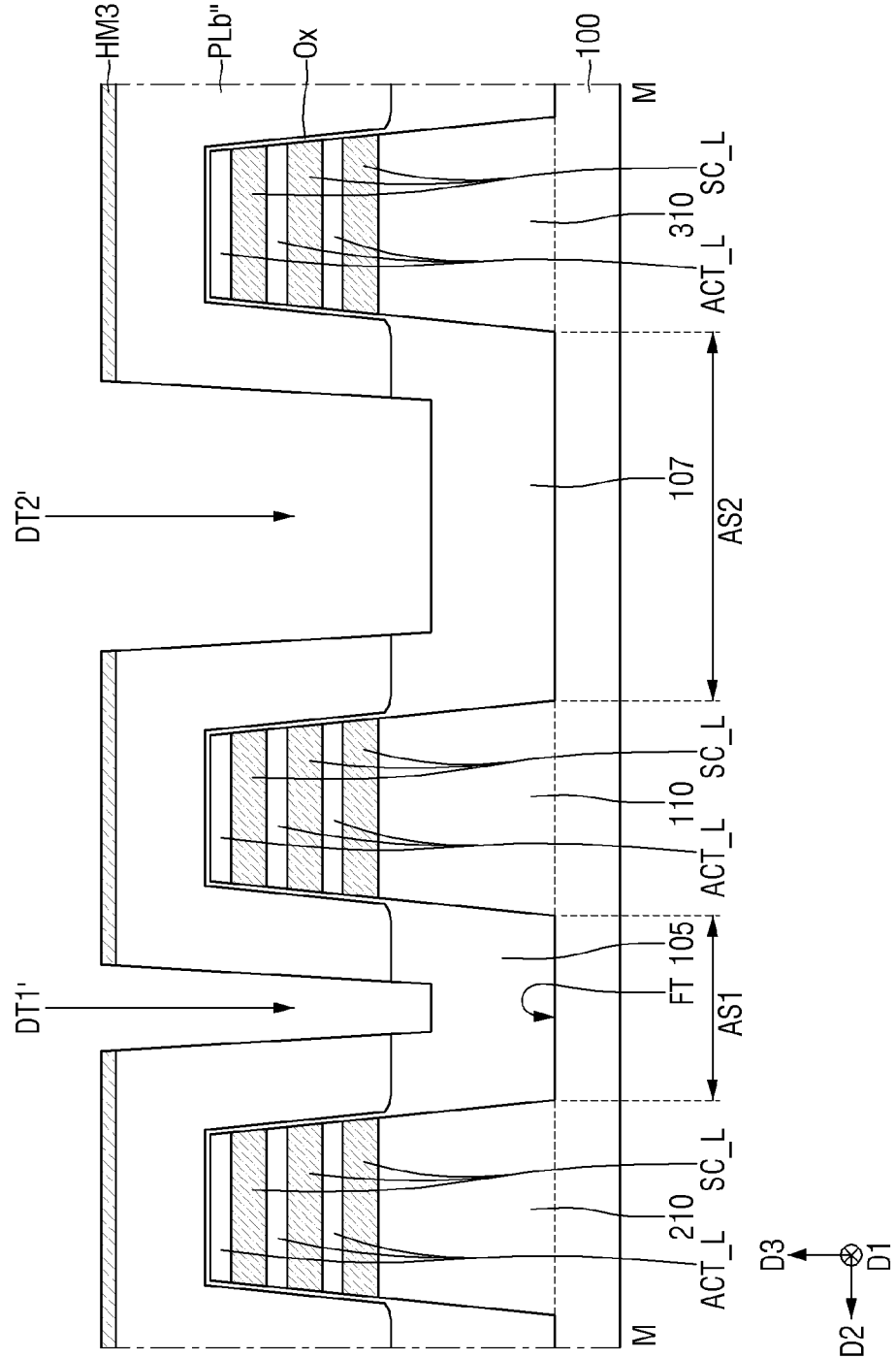
Figure 38:
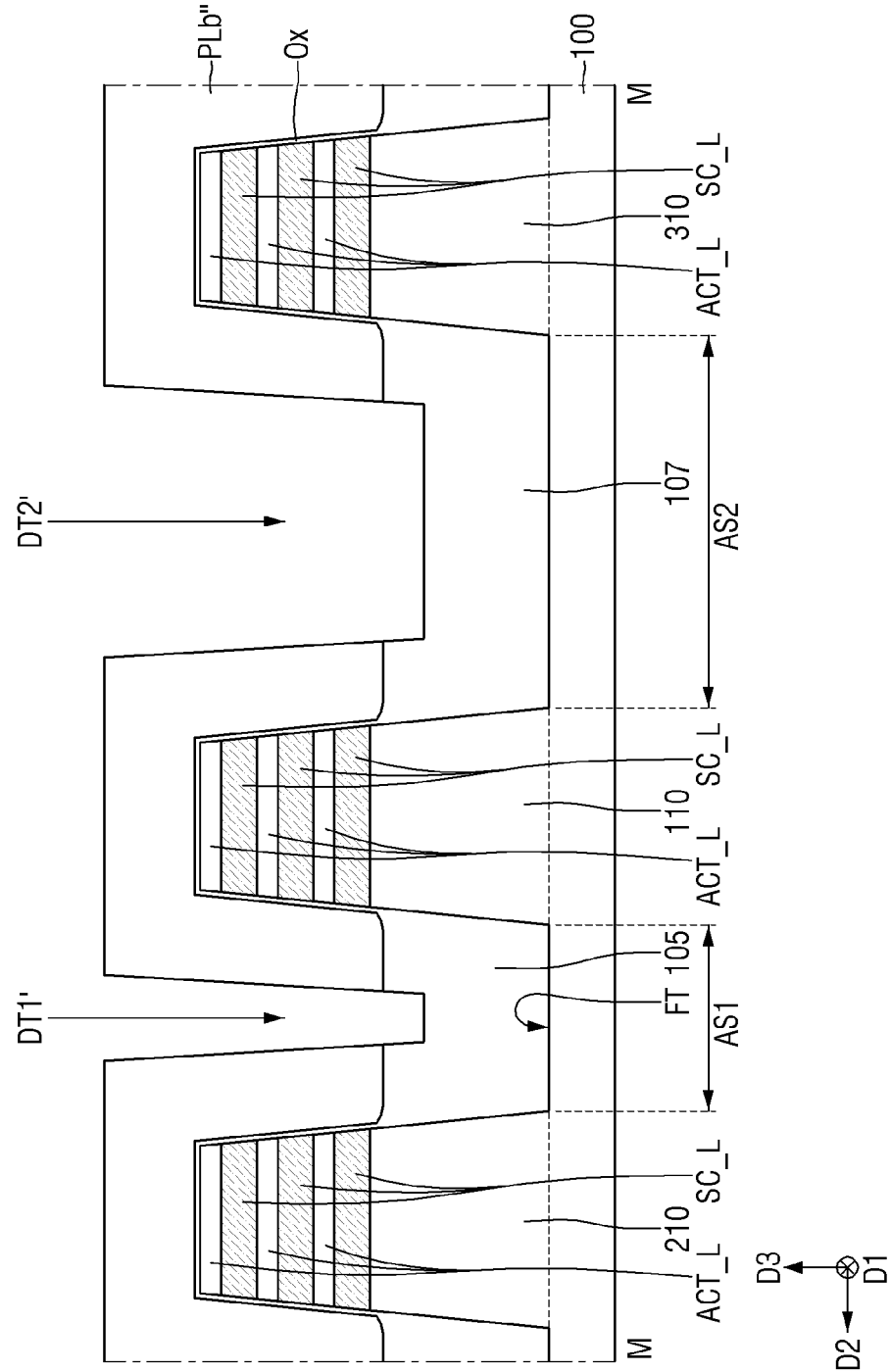

Referring to FIGS. 37 and 38, the dummy conductive material layer PLb' and a portion of a center of each of the first and second field insulating layers 105 and 107 may be etched using the third mask pattern HM3 to form first and second dam trenches DT1' and DT2'.

The removal of the dummy conductive material layer PLb' and the first and second field insulating layers 105 and 107 may be performed through a dry etching process toward the third direction D3. The dry etching process may remove a portion of the center of each of the first and second field insulating layers 105 and 107 by using the fact that etch selectivity of the first mask pattern HM1 is different from that of the dummy conductive material layer PLb' and that of the first and second field insulating layers 105 and 107, wherein the first mask pattern HM1, the dummy conductive material layer PLb' and the first and second field insulating layers 105 and 107 may include their respective materials different from one another.

Afterwards, the process of FIGS. 28 to 30 may be performed to form first to third gate structures that include the first to third active patterns AP1 to AP3 of FIGS. 1 to 6, the first and second gate isolation structures 160 and 170 of FIGS. 1 to 6, and the first to third gate electrodes 120 to 320 of FIGS. 1 to 6.

The above methods of manufacturing a semiconductor device described in reference to FIGS. 16 to 38 may be used for manufacturing the semiconductor device shown in FIGS. 1 to 6 but also the semiconductor device shown in FIGS. 14 and 15.

In the present disclosure, the lower structure of the gate isolation structure may be formed in a self-aligned manner through the arrangement of the mask pattern HM3 and the dummy conductive material layer PLb with respect to the active pattern adjacent to the active patterns having different intervals, whereby isolation operation efficiency of the gate electrodes may be improved. Also, the width of the gate electrode disposed between the active pattern and the gate isolation structure may be uniformly maintained, whereby operational reliability of the semiconductor device is improved.

In concluding the detailed description, those skilled in the art will appreciate that many variations and modifications may be made to the above embodiments without substantially departing from the principles of the disclosure. Therefore, the above embodiments are used in a generic and descriptive sense only and not for purposes of limitation.

What is claimed is:

1. A method of manufacturing a semiconductor device, the method comprising:

forming first to third preliminary active patterns extended in a first direction on a substrate and sequentially disposed to be adjacent to one another in a second direction different from the first direction, the first and second preliminary active patterns being spaced apart from each other in the second direction by a first interval, and the second and third preliminary active patterns being spaced apart from each other in the second direction by a second interval different from the first interval;

forming a first field insulating layer between the first preliminary active pattern and the second preliminary active pattern, and forming a second field insulating layer between the second preliminary active pattern and the third preliminary active pattern;

forming a dummy conductive material layer extended along profiles of the first to third preliminary active patterns and the first and second field insulating layers;

forming a mask pattern on the dummy conductive material layer, a first deposition thickness for the forming the dummy conductive material layer on a sidewall of the first preliminary active pattern being smaller than a second deposition thickness for the forming the dummy conductive material layer on the first field insulating layer and the forming the mask pattern on the dummy conducive material layer;

forming first and second trenches by etching a portion of a center of each of the first and second field insulating layers using the mask pattern;

forming first and second dam structures to fill the first and second trenches, respectively;

forming a dummy electrode on the first and second dam structures and the dummy conductive material layer; and forming first to third gate electrodes respectively on first to third active patterns formed based on the first to third preliminary active patterns, and forming first and second gate isolation structures based on the first and second dam structures, respectively, wherein the first gate isolation structure separates the first gate electrode from the second gate electrode, and the second gate isolation structure separates the second gate electrode from the third gate electrode.

2. The method of claim 1, wherein the mask pattern is not disposed on sidewalls of the first to third preliminary active patterns, and wherein the first deposition thickness is equal to a third deposition thickness of the dummy conductive material layer on the sidewall of the second preliminary active pattern.

3. The method of claim 1, wherein a thickness of the first dam structure in the second direction and a thickness of the second dam structure in the second direction are different from each other.

4. The method of claim 1, wherein the mask pattern comprises a first mask pattern disposed on upper surfaces of the first to third preliminary active patterns and a second mask pattern disposed on the first and second field insulating layers, and
wherein the first mask pattern and the second mask pattern include respective materials different from each other.

5. The method of claim 4, wherein the forming the mask pattern comprises:
forming a pre-mask pattern on the dummy conductive material layer;
forming a coating film layer between the first to third preliminary active patterns; and
substituting the pre-mask pattern on the upper surfaces of the first to third preliminary active patterns with the first mask pattern.

6. The method of claim 1, wherein the mask pattern is not disposed on the sidewalls of the first to third preliminary active patterns and on the first and second field insulating layers,
wherein the dummy conductive material layer has a first thickness on the first and second field insulating layers, a second thickness on upper surfaces of the first to third preliminary active patterns, and a third thickness on the sidewalls of the first to third preliminary active patterns, and
wherein the first thickness is smaller than the second thickness, and is greater than the third thickness.

7. The method of claim 6, wherein the forming the mask pattern includes:
forming a coating film layer between the first to third preliminary active patterns;
removing at least a portion of the dummy conductive material layer disposed on the upper surfaces of the first to third preliminary active patterns; and
forming a material having etch selectivity different from that of the dummy conductive material layer on the upper surfaces of the first to third preliminary active patterns.

8. The method of claim 1, wherein the first gate isolation structure comprises the first dam structure and a first gate isolation filling layer at least partially disposed on an upper surface of the first dam structure, and
wherein a gate insulating layer is disposed between the first gate isolation filling layer and the first gate electrode.

9. The method of claim 1, wherein the first gate isolation structure comprises the first dam structure and a first gate isolation filling layer at least partially disposed on an upper surface of the first dam structure, and
wherein a gate insulating layer is not disposed between the first gate isolation filling layer and the first gate electrode.

10. A method of manufacturing a semiconductor device, the method comprising:
forming first to third preliminary active patterns extended in a first direction on a substrate and sequentially disposed to be adjacent to one another in a second direction different from the first direction, the first and second preliminary active patterns being spaced apart from each other in the second direction by a first interval, and the second and third preliminary active patterns being spaced apart from each other in the second direction by a second interval different from the first interval;
forming a first field insulating layer between the first preliminary active pattern and the second preliminary active pattern, and forming a second field insulating layer disposed between the second preliminary active pattern and the third preliminary active pattern;
forming a dummy conductive material layer extended along profiles of the first to third preliminary active patterns and the first and second field insulating layers;
forming first and second mask patterns on the dummy conductive material layer, the first mask pattern being disposed on upper surfaces of the first to third preliminary active patterns and the second mask pattern being disposed on the first and second field insulating layers;
removing the second mask pattern based on the first mask pattern;
forming first and second trenches by etching a portion of a center of each of the first and second field insulating layers using the first mask pattern;
forming first and second dam structures to fill the first and second trenches, respectively;
forming a dummy electrode on the first and second dam structures and the dummy conductive material layer; and
forming first to third gate electrodes respectively on first to third active patterns formed based on the first to third preliminary active patterns, and forming first and second gate isolation structures based on the first and second dam structures, respectively,
wherein the first gate isolation structure separates the first gate electrode from the second gate electrode, and the second gate isolation structure separates the second gate electrode from the third gate electrode, and
wherein the first and second mask patterns are not disposed on sidewalls of the first to third preliminary active patterns.

11. The method of claim 10, wherein the first mask pattern and the second mask pattern comprise respective materials different from each other.

12. The method of claim 11, wherein the forming the first and second mask patterns includes:
forming a pre-mask pattern on the dummy conductive material layer;
forming a coating film layer between the first to third preliminary active patterns; and
substituting the pre-mask pattern on the upper surfaces of the first to third preliminary active patterns with the first mask pattern by using the coating film layer.

13. The method of claim 12, wherein the forming the first and second trenches includes performing a wet etching for the second mask pattern.

14. The method of claim 10, wherein a first deposition thickness for the dummy conductive material layer on the sidewall of the first preliminary active pattern and the first and second mask patterns is smaller than a second deposition thickness for the dummy conductive material layer on the first field insulating layer and the first and second mask patterns.

15. The method of claim 14, wherein the dummy conductive material layer is formed with a predetermined thickness along profiles of the first to third preliminary active patterns and the first and second field insulating layers, and
Wherein the first deposition thickness is equal to a third deposition thickness for the dummy conductive material layer on the sidewall of the second preliminary active pattern and the first and second mask patterns.

16. The method of claim 10, a thickness of the first dam structure in the second direction and a thickness of the second dam structure in the second direction are different from each other.

17. A method of manufacturing a semiconductor device, the method comprising:

forming first to third preliminary active patterns extended in a first direction on a substrate and sequentially disposed to be adjacent to one another in a second direction different from the first direction, the first and second preliminary active patterns being spaced apart from each other in the second direction by a first interval, and the second and third preliminary active patterns being spaced apart from each other in the second direction by a second interval different from the first interval;

forming a first field insulating layer between the first preliminary active pattern and the second preliminary active pattern, and forming a second field insulating layer between the second preliminary active pattern and the third preliminary active pattern;

forming a dummy conductive material layer extended along profiles of the first to third preliminary active patterns and the first and second field insulating layers, the dummy conductive material layer having a first thickness on the first and second field insulating layers, a second thickness on upper surfaces of the first to third preliminary active patterns, and a third thickness on sidewalls of the first to third preliminary active patterns;

forming a mask pattern on the dummy conductive material layer, the mask pattern not being disposed on the sidewalls of the first to third preliminary active patterns;

forming first and second trenches by etching a portion of a center of each of the first and second field insulating layers using the mask pattern;

forming first and second dam structures to fill the first and second trenches, respectively;

forming a dummy electrode on the first and second dam structures and the dummy conductive material layer; and forming first to third gate electrodes respectively on first to third active patterns formed based on the first to third preliminary active patterns, and forming first and second gate isolation structures based on the first and second dam structures, respectively, wherein the first gate isolation structure separates the first gate electrode from the second gate electrode, and the second gate isolation structure separates the second gate electrode from the third gate electrode, and wherein the first thickness is smaller than the second thickness, and is greater than the third thickness.

18. The method of claim 17, wherein the mask pattern is not disposed on the sidewalls of the first to third preliminary active patterns and on the first and second field insulating layers, and wherein the forming the mask pattern includes:

forming a coating film layer between the first to third preliminary active patterns;

removing at least a portion of the dummy conductive material layer disposed on the upper surfaces of the first to third preliminary active patterns;

forming a material having etch selectivity different from that of the dummy conductive material layer on the upper surfaces of the first to third preliminary active patterns.

19. The method of claim 17, wherein a first deposition thickness of the dummy conductive material layer on the sidewall of the first preliminary active pattern and the mask pattern is smaller than a second deposition thickness for the dummy conductive material layer on the first field insulating layer and the mask pattern.

20. The method of claim 17, wherein the second thickness is within a range of 20 nm to 40 nm, and the third thickness is within a range of 5 nm to 20 nm.

* * * * *